US012640334B2

(12) United States Patent
Zeidler et al.

(10) Patent No.: US 12,640,334 B2
(45) Date of Patent: May 26, 2026

(54) DISTORTION OPTIMIZED MULTI-BEAM SCANNING SYSTEM

(71) Applicant: Carl Zeiss MultiSEM GmbH, Oberkochen (DE)

(72) Inventors: Dirk Zeidler, Oberkochen (DE); Thomas Schmid, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 370 days.

(21) Appl. No.: 18/525,401

(22) Filed: Nov. 30, 2023

(65) Prior Publication Data

US 2024/0096587 A1 Mar. 21, 2024

Related U.S. Application Data

(63) Continuation of application No. PCT/EP2021/066255, filed on Jun. 16, 2021.

(51) Int. Cl.
*H01J 37/153* (2006.01)

(52) U.S. Cl.
CPC .................................. *H01J 37/153* (2013.01)

(58) Field of Classification Search
USPC ......................................................... 250/310
See application file for complete search history.

(56) References Cited

U.S. PATENT DOCUMENTS 4,130,761 A 12/1978 Matsuda
4,153,843 A 5/1979 Pease 4,200,794 A 4/1980 Newberry
4,338,548 A 7/1982 Bono
4,742,234 A 5/1988 Feldman
5,215,623 A 6/1993 Takahashi
5,546,319 A 8/1996 Satoh et al.
5,585,795 A 12/1996 Yuasa et al.
5,864,142 A 1/1999 Muraki
5,892,224 A 4/1999 Nakasuji
5,905,267 A 5/1999 Muraki (Continued)

FOREIGN PATENT DOCUMENTS

GB 2519511 A 4/2015
GB 2521819 A 7/2015

(Continued)

OTHER PUBLICATIONS

Anonymous: "Convertisseur numerique-analogique—Wikipedia", Mar. 11, 2021, pp. 1-4, XP055898209, with machine generated translation: "Digital-to-analog converter" retrieved on Nov. 12, 2023 https://fr.wikipedia.org/wiki/Convertisseur_num%C3%A9rique-analogique.

(Continued)

*Primary Examiner* — Kiet T Nguyen
(74) *Attorney, Agent, or Firm* — Fish & Richardson P.C.

(57) ABSTRACT

A multi-beam charged particle inspection system and a method of operating a multi-beam charged particle inspection system for wafer inspection with high throughput and with high resolution and high reliability comprise a mechanism for reduction and compensation of a scanning induced aberration, such as a scanning distortion of a collective multi-beam raster scanner for beamlets propagating at an angle with respect to the optical axis of the multi-beam charged particle inspection system.

20 Claims, 25 Drawing Sheets

(56) References Cited

U.S. PATENT DOCUMENTS

| | | | |
|---|---|---|---|
| 5,981,954 | A | 11/1999 | Muraki |
| 6,107,636 | A | 8/2000 | Muraki |
| 6,124,599 | A | 9/2000 | Muraki |
| 6,137,113 | A | 10/2000 | Muraki |
| 6,323,499 | B1 | 11/2001 | Muraki |
| 6,333,508 | B1 | 12/2001 | Katsap |
| 6,617,595 | B1 | 9/2003 | Okunuki |
| 6,633,366 | B2 | 10/2003 | De Jager |
| 6,696,371 | B2 | 2/2004 | Butschke |
| 6,787,780 | B2 | 9/2004 | Hamaguchi |
| 6,804,288 | B2 | 10/2004 | Haraguchi |
| 6,818,911 | B2 | 11/2004 | Tamamori |
| 6,835,508 | B2 | 12/2004 | Butschke |
| 6,872,950 | B2 | 3/2005 | Shimada |
| 6,897,458 | B2 | 5/2005 | Wieland et al. |
| 6,903,345 | B2 | 6/2005 | Ono |
| 6,903,353 | B2 | 6/2005 | Muraki |
| 6,917,045 | B2 | 7/2005 | Hashimoto |
| 6,919,574 | B2 | 7/2005 | Hashimoto |
| 6,943,349 | B2 | 9/2005 | Adamec |
| 6,953,938 | B2 | 10/2005 | Iwasaki |
| 6,992,290 | B2 | 1/2006 | Watanabe |
| 7,005,658 | B2 | 2/2006 | Muraki |
| 7,015,467 | B2 | 3/2006 | Maldonado |
| 7,060,984 | B2 | 6/2006 | Nagae |
| 7,084,411 | B2 | 8/2006 | Lammer-Pachlinger |
| 7,091,504 | B2 | 8/2006 | Wieland |
| 7,109,494 | B2 | 9/2006 | Ono |
| 7,126,141 | B2 | 10/2006 | Ono |
| 7,129,502 | B2 | 10/2006 | Kruit |
| 7,244,949 | B2 | 7/2007 | Knippelmeyer et al. |
| 7,285,779 | B2 | 10/2007 | Litman |
| 7,332,730 | B2 | 2/2008 | Heinitz et al. |
| 7,375,326 | B2 | 5/2008 | Sender |
| 7,420,164 | B2 | 9/2008 | Nakasuji |
| 7,468,507 | B2 | 12/2008 | Rogers |
| 7,504,622 | B2 | 3/2009 | Elyasaf |
| 7,535,001 | B2 | 5/2009 | Sender |
| 7,601,972 | B2 | 10/2009 | Nakasuji |
| 7,619,203 | B2 | 11/2009 | Elyasaf |
| 7,696,497 | B2 | 4/2010 | Rogers |
| 8,035,082 | B2 | 10/2011 | Yamazaki |
| 8,134,135 | B2 | 3/2012 | Kruit |
| 8,350,214 | B2 | 1/2013 | Otaki |
| 8,362,425 | B2 | 1/2013 | Han |
| 8,384,051 | B2 | 2/2013 | Ozawa |
| 8,598,525 | B2 | 12/2013 | Zeidler |
| 8,618,496 | B2 | 12/2013 | Wieland |
| 8,704,192 | B2 | 4/2014 | Sano |
| 8,748,842 | B2 | 6/2014 | Ohashi |
| 8,779,399 | B2 | 7/2014 | Yamanaka |
| 8,829,465 | B2 | 9/2014 | Tsunoda |
| 8,963,099 | B2 | 2/2015 | Yamada |
| 9,153,413 | B2 | 10/2015 | Almogy |
| 9,263,233 | B2 | 2/2016 | Zeidler |
| 9,336,981 | B2 | 5/2016 | Knippelmeyer |
| 9,336,982 | B2 | 5/2016 | Zeidler |
| 9,349,571 | B2 | 5/2016 | Kemen |
| 9,368,314 | B2 | 6/2016 | Nakasuji |
| 9,530,613 | B2 | 12/2016 | Rogers |
| 9,536,702 | B2 | 1/2017 | Lang et al. |
| 9,607,805 | B2 | 3/2017 | Liu |
| 9,620,329 | B1 | 4/2017 | Cook et al. |
| 9,653,254 | B2 | 5/2017 | Zeidler |
| 9,702,983 | B2 | 7/2017 | Eder |
| 9,922,796 | B1 | 3/2018 | Frosien et al. |
| 9,922,799 | B2 | 3/2018 | Li |
| 9,991,089 | B2 | 6/2018 | Mueller |
| 10,062,541 | B2 | 8/2018 | Ren |
| 10,141,160 | B2 | 11/2018 | Ren |
| 10,354,831 | B2 | 7/2019 | Kemen |
| 10,388,487 | B2 | 8/2019 | Zeidler |
| 10,535,494 | B2 | 1/2020 | Zeidler |
| 10,541,112 | B2 | 1/2020 | Schubert |
| 10,586,677 | B1 | 3/2020 | Okada |
| 10,600,613 | B2 | 3/2020 | Zeidler |
| 10,622,184 | B2 | 4/2020 | Knippelmeyer |
| 10,643,820 | B2 | 5/2020 | Ren |
| 10,741,355 | B1 | 8/2020 | Zeidler |
| 10,811,215 | B2 | 10/2020 | Zeidler |
| 10,854,423 | B2 | 12/2020 | Sarov |
| 10,879,031 | B2 | 12/2020 | Ren |
| 10,896,800 | B2 | 1/2021 | Riedesel |
| 2006/0145097 | A1 | 7/2006 | Parker |
| 2006/0289804 | A1 | 12/2006 | Knippelmeyer et al. |
| 2009/0001267 | A1 | 1/2009 | Enyama et al. |
| 2009/0014649 | A1 | 1/2009 | Nakasuji |
| 2010/0248166 | A1 | 9/2010 | Nagae et al. |
| 2012/0273690 | A1 | 11/2012 | Wieland et al. |
| 2014/0151570 | A1 | 6/2014 | Kato et al. |
| 2014/0197325 | A1 | 7/2014 | Kato |
| 2017/0133198 | A1 | 5/2017 | Kruit |
| 2019/0088440 | A1 | 3/2019 | Zeidler et al. |
| 2019/0333732 | A1 | 10/2019 | Ren |
| 2019/0355544 | A1 | 11/2019 | Riedesel et al. |
| 2019/0355546 | A1 | 11/2019 | Ando et al. |
| 2019/0355547 | A1 | 11/2019 | Ando et al. |
| 2020/0211810 | A1 | 7/2020 | Zeidler |
| 2020/0211820 | A1 | 7/2020 | Lyons et al. |
| 2020/0243300 | A1 | 7/2020 | Zeidler |
| 2020/0258714 | A1 | 8/2020 | Cook et al. |
| 2020/0312610 | A1 | 10/2020 | Hlavenka et al. |
| 2020/0373116 | A1 | 11/2020 | Zeidler |
| 2020/0381212 | A1 | 12/2020 | Ren et al. |
| 2021/0005423 | A1 | 1/2021 | Zeidler |
| 2021/0035773 | A1 | 2/2021 | Zeidler |
| 2021/0192700 | A1 | 6/2021 | Zeidler et al. |
| 2021/0210303 | A1 | 7/2021 | Zeidler et al. |
| 2021/0210306 | A1 | 7/2021 | Zeidler et al. |
| 2021/0217577 | A1 | 7/2021 | Zeidler et al. |
| 2022/0102104 | A1 | 3/2022 | Fritz et al. |
| 2022/0351936 | A1* | 11/2022 | Kaufmann .......... H01J 37/1474 |

FOREIGN PATENT DOCUMENTS

| | | | |
|---|---|---|---|
| JP | 59184524 | A | 10/1984 |
| JP | 60042825 | A | 3/1985 |
| JP | 60105229 | A | 6/1985 |
| JP | 61263217 | A | 11/1986 |
| JP | H0330248 | A | 2/1991 |
| JP | H05076133 | U | 10/1993 |
| JP | H05284028 | A | 10/1993 |
| JP | 2008066359 | A | 3/2008 |
| JP | 2014229481 | A | 12/2014 |
| JP | 2020-511733 | | 4/2020 |
| TW | 202044312 | A | 12/2020 |
| WO | WO 2007/028596 | A1 | 3/2007 |
| WO | WO2013032949 | A1 | 3/2013 |
| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |
| WO | WO2020249147 | A1 | 12/2020 |
| WO | WO 2021/239380 | A1 | 12/2021 |

OTHER PUBLICATIONS

E.R. Weidlich, Design of a Nonequisectored 20-Electrode Deflector For E-Beam Lithography Using a Field Emission Electron Beam, Microelectronic Engineering vol. 11, p. 347-350 (1990).

Notice of Allowance in Korean Appln. No. 10-2024-7001564, mailed on Aug. 29, 2025, 4 pages (with English translation).

Office Action in Taiwanese Appln. No. 110122125, mailed on Jun. 10, 2025, 13 pages (with English summary).

International Search Report and Written Opinion for corresponding PCT Appl No. PCT/EP2021/066255, dated Mar. 18, 2022.

Office Action in Japanese Appln. No. 2023-577601, mailed on May 12, 2025, 6 pages (with English translation).

Office Action in Korean Appln. No. 10-2024-7001564, mailed on Jun. 20, 2025, 6 pages (with English translation).

(56)           References Cited

OTHER PUBLICATIONS

Japanese Examination Report, with translation thereof, for corresponding JP Appl No. 2023-577601, dated Sep. 26, 2024.

* cited by examiner x y p q x p y x q p

DISTORTION OPTIMIZED MULTI-BEAM SCANNING SYSTEM

CROSS-REFERENCE TO RELATED APPLICATIONS

The present application is a continuation of, and claims benefit under 35 USC 120 to, international application PCT/EP2021/066255, filed Jun. 16, 2021. The entire disclosure of this application is incorporated by reference herein.

FIELD

The present disclosure relates to multi-beam charged particle inspection system and a method of operating a multi-beam charged particle inspection system. The present disclosure also relates to a multi-beam charged particle beam inspection system for wafer inspection with high resolution provided by an optimized scanner system for scanning deflection of a plurality of primary charged particle beamlets and a scanning corrector for inspection with extreme low distortion and high stigmation correction. With the method and the multi-beam charged particle beam inspection system a wafer inspection over a large imaging field with high precision is possible.

BACKGROUND

With the continuous development of ever smaller and more sophisticated microstructures such as semiconductor devices there can be a desire for further development and optimization of planar fabrication techniques and inspection systems for fabrication and inspection of the small dimensions of the microstructures. Development and fabrication of the semiconductor devices can involve for example design verification of test wafers, and the planar fabrication techniques involves process optimization for reliable high throughput fabrication. In addition, recently the analysis of semiconductor wafers for reverse engineering and customized, individual configuring of semiconductor devices can be involved. High throughput inspection tools for the examination of the microstructures on wafers with high accuracy are therefore demanded.

Typical silicon wafers used in manufacturing of semiconductor devices have diameters of up to 12 inches (300 mm). Each Wafer is segmented in 30-60 repetitive areas ("Dies") of about up to 800 sq mm size. A semiconductor device comprises a plurality of semiconductor structures fabricated in layers on a surface of the wafer by planar integration techniques. Due to the fabrication processes involved, semiconductor wafers have typically a flat surface. The feature size of the integrated semiconductor structures extends between few μm down to the critical dimensions (CD) of 5 nm, with even decreasing features sizes in near future, for example feature sizes or critical dimensions (CD) below 3 nm, for example 2 nm, or even below 1 nm. With the small structure sizes mentioned above, it is desirable for defects of the size of the critical dimensions to be identified in a very large area in a short time. For several applications, the desired accuracy of a measurement provided by an inspection device is even higher, for example a factor of two or an order of magnitude. For example, a width of a semiconductor feature is measured with an accuracy below 1 nm, for example 0.3 nm or even less, and a relative position of semiconductor structures is determined with an overlay accuracy of below 1 nm, for example 0.3 nm or even less.

A recent development in the field of charged particle microscopes (CPM) is the multi beam charged particle microscope (MSEM). A multi beam scanning electron microscope is disclosed, for example, in U.S. Pat. No. 7,244,949 and in US20190355544. In a multi beam electron microscope, a sample is irradiated by an array of electron beamlets, comprising for example 4 up to 10000 electron beams, as primary radiation, whereby each electron beam is separated by a distance of 1-200 micrometers from its next neighboring electron beam. For example, a multi beam charged particle microscope has about 100 separated electron beams or beamlets, arranged on a hexagonal array, with the electron beamlets separated by a distance of about 10 μm. The plurality of primary charged particle beamlets is focused by a common objective lens on a surface of a sample under investigation, for example a semiconductor wafer fixed on a wafer chuck, which is mounted on a movable stage. During the illumination of the wafer surface with primary charged particle beamlets, interaction products, e.g. secondary electrons, originate from the plurality of intersection points formed by the focus points of the primary charged particle beamlets, while the amount and energy of interaction products depend on the material composition and topography of the wafer surface. The interaction products form a plurality of secondary charged particle beamlets, which is collected by the common objective lens and guided onto a detector arranged at a detector plane by a projection imaging system of the multi-beam inspection system. The detector comprises a plurality of detection areas with each comprising a plurality of detection pixels and detects an intensity distribution for each of the plurality of secondary charged particle beamlets and an image patch of for example 100 μm×100 μm is obtained. Certain known multi-beam charged particle microscopes comprise a sequence of electrostatic and magnetic elements. At least some of the electrostatic and magnetic elements are adjustable to adjust focus position and stigmation of the plurality of secondary charged particle beams. Certain known multi-beam charged particle microscopes comprise at least one cross over plane of the primary or for the secondary charged particles. Certain known multi-beam charged particle microscopes comprise detection systems to facilitate the adjustment. Certain known multi-beam charged particle microscopes comprise at least a deflection scanner for collectively scanning the plurality of primary charged particle beamlets over an area of a sample surface to obtain an image patch of the sample surface. More details of a multi-beam charged particle microscope and method of operating a multi-beam charged particle microscope is described in PCT/EP2021/061216, filed on Apr. 29, 2021, which is hereby incorporated by reference.

In charged particle microscopes for wafer inspection, however, it is desired to maintain imaging conditions stable, such that imaging can be performed with high reliability and high repeatability. The throughput depends on several parameters, for example speed of the stage and re-alignment at new measurement sites, as well as the measured area per acquisition time itself. The latter is determined by dwell time, resolution and the number of beamlets. In addition, for a multi-beam charged particle microscope, time consuming image postprocessing is used, for example the signal generated by the detection system of the multi-beam charged particle microscope is digitally corrected, before the image patch is stitched together from a plurality of image subfields.

The plurality of primary charged particle beamlets can deteriorate from the regular raster positions within a raster configuration, for example a hexagonal raster configuration.

In addition, the plurality of primary charged particle beamlets can deteriorate from the regular raster positions of a raster scanning operation within the planar area segment, and the resolution of the multi-beam charged particle inspection system can be different and depend on the individual scan position of each individual beamlet of the plurality of primary charged particle beamlets. These scanning induced distortion differences between the plurality of primary charged particle beamlets have not been addressed so far. With a plurality of primary charged particle beamlets, each beamlet is incident on the intersection volume of a common scanning deflector at a different angle, and each beamlet is deflected to a different exiting angle, and each beamlet is traversing the intersection volume of a common scanning deflector at a different path. Therefore, each beamlet experiences a different distortion pattern during scanning operation. Certain known single-beam dynamic correctors are unsuitable to mitigate any scanning induced distortion of a plurality of primary beamlets. US20090001267 A1 illustrates the calibration of a primary-beam layout or static raster pattern configuration of a multi beam charged particle system comprising five primary charged particle beamlets. Three causes of deviations of the raster pattern are illustrated: rotation of the primary-beam layout, scaling up or down of the primary-beam layout, a shift of the whole primary-beam layout. US20090001267 A1 therefore considers the basic first order distortion (rotation, magnification, global shift or displacement) of the static primary-beam raster pattern, formed by the static focus points of the plurality of primary beamlets. In addition, US20090001267 A1 includes the calibration of the first order properties of the collective raster scanner, the deflection width and the deflection direction for collectively raster scanning the plurality of primary beamlets. A mechanism for compensation of these basic errors in the primary-beam layout is discussed. No solutions are provided for higher order distortions of the static raster patterns, for example third order distortion. Even after calibration of the primary beam layout and optionally also the secondary electron beam path, scanning distortions are introduced during scanning in each individual primary beamlet, which are not addressed by calibration of the static raster pattern of the plurality of primary beamlets.

US20190088440 A1 proposes a multi-aperture plate in the multi beam generation unit comprising a plurality of openings with multiple electrodes for controlling the spot sizes and shapes of the focus points of the plurality of primary beamlets. No dynamic mechanism to control a scanning distortion aberration during an image scan is provided.

Dynamic correctors for single beam scanning systems are well known. For example, it is well known how a field curvature or a field dependent astigmatism of a single scanning electron beam can be dynamically compensated during scanning of a single charged particle beam. A scanning induced third order distortion of a single beam can be compensated by addition of correction field term of cubic order to the linear scanning power of a scanning deflector. However, with certain known methods, dynamic aberrations are corrected for a single beam, traversing an intersection volume of a scanning deflector with a single beam path at a single angle of incidence and a single exiting angle relative to the optical axis.

WO2007028596 A1 describes configurations of multi-aperture plates configured for a predetermined deflection of a plurality of primary charged particle beamlets. According to the configurations, a collective deflection of a plurality of beamlets is performed and for example a fast switching of an operation mode can be achieved. In one particular example, the number of primary beamlet is changed by deflecting a plurality of beamlets into a beam stop. In an example, individual deflection angles of each of the plurality of primary beamlets are determined by the mechanical layout of a pair of consecutive multi aperture plates and application of an appropriate voltage difference between the two multi-aperture plates. Thereby, for example a predetermined telecentricity property of the plurality of beamlets is achieved. However, WO2007028596 A1 does not provide a solution to handle scanning induced distortions. WO2007028596 A1 mentions so called blanking aperture arrays. Similar to the mode switching operation of WO2007028596 A1, blanking aperture arrays are configured for fast binary switching operations of beamlets between an on-state and an off-state and do not provide any mechanism for individual and continuous scanning deflection of individual primary beamlets with high precision.

U.S. Pat. No. 6,897,458 B2 shows a scanning deflector array for collectively scanning deflection of a plurality of beamlets for a multi-column system. US20100248166A1 shows a collective scanning deflector for collective scanning deflection of a plurality of primary beamlets in combination with a static deflector array for adjusting a position of each of the primary beamlets. The static deflector array serves the purpose adjusting the static focus points within the static raster configuration.

SUMMARY

The disclosure seeks to provide a charged particle system and method of operation of a charged particle system with high throughput, that allows a high precision measurement of semiconductor features with an accuracy below 1 nm, below 0.3 nm or even 0.1 nm.

The disclosure seeks to provide a multi-beam charged particle inspection system with a mechanism to enable high precision and high-resolution image acquisition with high throughput. The disclosure seeks to provide a multi-beam charged particle inspection system that achieves a high precision image acquisition of a planar area segment with deviations from predetermined raster positions within the desired specification of a measurement task.

With the increasing demand on resolution and throughput, conventional charged particle microscopes can be considered to be at their limit. Even in a single beam corrected charged particle microscope, scanning induced aberrations such as residual scanning induced distortion, scanning induced astigmatism or spherical aberration deteriorate resolution and accuracy. The disclosure seeks to provide a charged particle inspection system with a mechanism to enable high precision and high-resolution image acquisition with high throughput. The disclosure also seeks to provide a mechanism for correction of a scanning induced distortion difference of a plurality of primary beamlets during an image scanning operation with a collective deflection scanner of a multi-beam system. The disclosure also seeks to compensate a distortion error variation of the collective deflection scanner or the imaging optics for raster scanning and focusing of the plurality of primary beamlets on the surface of a wafer.

With the embodiments of the disclosure, scanning induced aberrations of a charged particle microscope are reduced. The disclosure provides an improved multi-beam charged particle microscope, an improved method of operation of a multi-beam charged particle microscope and an improved method of calibration of a multi-beam charged particle microscope. With the improvements, scanning induced aberrations such as a scanning induced distortion, induced during collective raster scanning of a plurality of J primary charged particle beamlets over an image field of the multi-beam charged particle microscope, are reduced. The improved multi-beam charged particle microscope comprises a mechanism for compensating scanning induced aberrations. The mechanism for compensating scanning induced aberrations comprise at least an electrostatic correction element configured for influencing during use at least a first primary charged particle beamlet of the plurality of J primary charged particle beamlets and a control mechanism to operate the electrostatic correction element during use synchronized with the collective raster scanning deflection of the plurality of J primary charged particle beamlets. The improved method of operation is configured to minimize a scanning induced aberration such as a scanning induced distortion synchronized with a raster scanning of the plurality of J primary charged particle beamlets with a collective raster scanning deflector. The collective raster scanning deflector is configured and controlled to raster scan the plurality of J primary charged particle beamlets over a surface area of an object such as a wafer over an image field comprising a plurality of J image subfields. Each of the plurality of J primary beamlets is raster scanned over a corresponding image subfield. Within each of the image subfields with a lateral extension of about 8 μm to 121 μm, for example 10 μm, a primary charged particle beamlet is scanning deflected synchronized with the plurality of J primary charged particle beamlets to expose a plurality of image pixel positions with a resolution of about 0.5 nm to 3 nm, for example 1 nm or 2 nm, and an image information of the surface area is obtained. With the disclosure, a scanning induced distortion of each primary charge particle beamlet within the corresponding image subfield is reduced. The scanning induced distortion can be different for each primary charge particle beamlet within the corresponding image subfield. In an example, a difference between the scanning induced distortions in the plurality of image subfields is reduced. In an example, a scanning induced distortion of about 0.1 nm to 5 nm is determined in each of the plurality of image subfields with the improved calibration method and control parameters are determined, suitable for operating the improved multi-beam charged particle microscope with reduced scanning induced distortion. During an operation of the improved multi-beam charged particle microscope, the control parameters are applied to reduce the scanning induced distortions of the plurality of J primary charged particle beamlets. Thereby, the scanning induced distortions in the plurality of J image subfields is reduced. For example, a difference between the scanning induced distortions in the plurality of image subfields is reduced. The improved method of calibration is configured to determine a scanning induced distortion and derive control parameters for the control mechanism. The disclosure is however not limited to the scanning induced distortions of a plurality of primary charged particle beamlets, but can be applied to scanning induced aberrations such as a variation or difference in a scanning induced astigmatism, a variation or difference in scanning induced change of focus position, a variation or difference in scanning induced spherical aberration of the plurality of J primary charged particle beamlets.

A multi-beam charged particle microscope (1) for wafer inspection according some embodiments of the disclosure is comprising a charged-particle multi-beamlet generator (300) for generating a plurality of primary charged particle beamlets (3), and an object irradiation unit (100) for illuminating an image patch (17.1) on a wafer surface (25) arranged in an object plane (101) by the plurality of J primary charged particle beamlets (3), thereby generating during use a plurality of J secondary electron beamlets (9) emitting from the wafer surface (25), and a detection unit (200) with a projection system (205) and an image sensor (207) for imaging the plurality of J secondary electron beamlets (9) onto the image sensor (207), and for acquisition during use a digital image of the image patch (17.1) of the wafer surface (25). The image patch (17.1) is divided into a plurality of J image subfields (31), wherein each of the subfields is corresponding to a primary charged particle beamlet. The multi-beam charged particle microscope (1) is further comprising a collective multi-beam raster scanner (110) comprising at least a first set of deflection electrodes and an intersection volume (189), the plurality of J primary charged particle beamlets (3) traversing during use the intersection volume (189), and a control unit (800), configured to provide during use at least a first scanning voltage difference VSp(t) to the first set of deflection electrodes for collective raster scanning of the plurality of J primary charged particle beamlets (3) in a first or p-direction. The multi-beam charged particle microscope (1) further comprises a mechanism to individually compensate a residual scanning induced distortion of at least a first primary charged particle beamlet. The plurality of J primary charged particle beamlets comprise at least the first primary charged particle beamlet incident on the intersection volume (189) with a first inclination angle β1 and a second primary charged particle beamlet incident on the intersection volume (189) with a second inclination angle β2, different from β1. During an image scan, the first primary beamlet is raster scanned by the collective multi-beam raster scanner (110) over a first image subfield, and the second primary beamlet is synchronously raster scanned by the collective multi-beam raster scanner (110) over a second image subfield. Each image subfield has a diameter of about 5 μm to 12 μm, for example 8 μm or 10 μm. By the mechanism to compensate a residual scanning induced distortion of at least the first primary charged particle beamlet, a difference of the scanning induced distortions between the first image subfield and the second image subfield is minimized. As a result, both focus points of the first and second primary charged particle beamlets are raster scanned during use over respective predetermined raster coordinates within a first and the second subfield with a deviation below a predetermined threshold of for example 1 nm, below 0.3 nm or even below 0.1 nm. The mechanism to compensate a residual scanning induced distortion are configured for a synchronized operation with a scanning deflection of the plurality of primary charged particle beamlets by the collective multi-beam raster scanner (110).

In an example, the mechanism to compensate residual scanning induced distortions are comprising a scanning induced distortion compensator array to individually compensate the residual scanning induced distortions of the plurality of primary beamlets comprising the first primary charged particle beamlet and of the second primary charged particle beamlet.

In an example, the mechanism to compensate the residual scanning induced distortions comprises a mechanism of the collective raster scanner (110), the mechanism being configured to generate a predetermined inhomogeneous scanning deflection field distribution in the intersection volume (189) for reduction of the scanning induced distortions of the plurality of primary beamlets comprising the first primary charged particle beamlet and the second primary charged particle beamlet incident on the intersection volume (189) at the inclination angle β2 deviating from (31.

A multi-beam charged particle microscope comprises a raster scanner for long stroke scanning deflection of at least a primary charged particle beamlet, to which during use a scanning deflection voltage difference VSp(t) is provided. The scanning deflection voltage difference VSp(t) is a temporally varying voltage difference, for example a voltage ramp, applied to the raster scanner electrodes for collective scanning deflection of a plurality of primary charged particle beamlets. The multi-beam charged particle microscope further comprises at least a first scanning corrector element, to which during use a first correction voltage difference VC1($t$) is provided. The correction voltage difference VC1($t$) is generated from the scanning deflection voltage difference VSp(t) by a static voltage conversion unit, which substantially reduces the scanning deflection voltage difference VSp(t) to a correction voltage difference VC1($t$) by at least one order of magnitude, such as by two or more orders of magnitude. The static voltage conversion unit can comprise a programmable resistor sequence or array, which is controlled by a plurality of control signals. Thereby, the correction voltage difference VC1($t$) is reduced and proportional to the scanning deflection voltage difference VSp(t). Thereby it is possible to control a plurality of scanning corrector elements synchronized with the collective raster scanner with high speed. Typically, a scanning deflection has a temporal frequency of about 80 MHz to 200 MHz, for example 100 MHz. With the static voltage conversion unit according the disclosure, a plurality of synchronized correction voltage differences can be provided with the same temporal frequency of about 80 MHz to 200 MHz to a plurality of correction elements. With the static voltage conversion unit according the disclosure, a scanning deflection voltage difference VSp(t) for a long stroke scanning deflection of each the plurality of primary charged particle beamlets by for example 10 μm is reduced to a correction voltage difference VC1($t$) for a corrective, short stroke scanning deflection of each the plurality of primary charged particle beamlets by for example 5 nm, and thereby individual scanning induced distortions of primary charge particle beamlets are reduced. With the embodiments of the disclosure it is therefore possible to generate the scanning deflection voltage difference VSp(t) of about −100V to 100V with a scanning frequency of about for example 100 MHz between scanning voltages for large stroke deflection and a plurality of correction voltage differences VCi(t) of up to about 100 mV synchronized with the scanning deflection voltage difference VSp(t) and with the same scanning frequency of for example 100 MHz.

In an example, the first scanning corrector element is a first scanning deflection element, configured for a short stroke deflection of at least a first primary charged particle beamlet synchronized with the longs stroke deflection. In an example, the plurality of charged particle beamlets is raster scanned by the first, long stroke raster scanner over a dimension of an image subfield D of for example +/−5 μm, and in parallel and synchronized the long stroke raster scanner, scanning induced distortions of each of the plurality of primary beamlet are compensated by a plurality of short stroke raster scanners, forming a scanning corrector array, with maximum scanning induced distortions of up to +/−5 nm. Each short stroke scanning deflection element for reduction of a scanning induced aberration of an individual beamlet is synchronized with a long stroke scanning operation with a reduction in a scanning power of about 3 orders of magnitude. Each beamlet is focused by the objective lens of the multi-beam charged particle microscope on predetermined scanning coordinates with a precision of more than 3 orders of magnitude better than a scanning coordinate. For example, a predetermined maximum scanning coordinate at a maximum image height of an image subfield of 5.0 μm is achieved with an accuracy of below 3 nm, such as below 0.3 nm or even below 0.1 nm.

The multi-beam charged particle microscope can comprise further scanning corrector elements, to which during use a further correction voltage differences VCi(t) are provided synchronized and proportional with the scanning deflection voltage difference VSp(t). Thereby, scanning induced aberrations such as a scanning induced telecentricity aberration, or a scanning induced astigmatism is reduced during an image scan. Beyond the scanning deflection voltage difference VSp(t) for long stroke scanning deflection of the primary beamlet in the first or p-direction, a second scanning deflection voltage difference VSq(t) can be provided to the long stroke raster scanner for long stroke scanning deflection in the second or q-direction, perpendicular to the p-direction.

During use further correction voltage differences VCj(t) are provided to the scanning corrector element, synchronized and proportional with the second scanning deflection voltage difference VSq(t).

In a first embodiment, a multi-beam charged particle microscope comprises a collective multi-beam raster scanner for long stroke scanning deflection of a plurality of primary charged particle beamlets. A first scanning corrector element is provided within the collective multi-beam raster scanner and the scanning induced aberration of a collective multi-beam raster scanner is minimized by a modified raster scanner design. Typically, scanning induced aberration increase with increasing propagation angle β of a beamlet propagating through an intersection volume of the collective multi-beam raster scanner.

With the modified deflection scanner design, an inhomogeneous an variable electrostatic deflection field in generated, by which the scanning induced aberrations are minimized for the beamlets propagating at an angle β through the intersection volume, especially for the beamlets propagating at a large angle β through the intersection volume. In an example, the collective multi-beam raster scanner comprises a set of deflection electrodes and at least a first set of correction electrodes, configured for generating during use a correction field in addition to a scanning deflection field. The inhomogeneous correction field is a scanning correction field generated by a scanning voltage difference provided to the set of correction electrodes synchronously to a scanning voltage difference provided to the set of deflection electrodes. In an example, additional scanning induced aberrations, for example induced in an objective lens of the multi-beam charged particle microscope are minimized by the predetermined inhomogeneous electrostatic deflection field. The set of correction electrodes and the scanning voltage difference provided to the set of correction electrodes are configured to generate a predetermined inhomogeneous electrostatic deflection field synchronized with a scanning voltage difference provided to the set of deflection electrodes and a scanning induced aberration of a multi-beam charged particle microscope is minimized.

In the first embodiment, the multi-beam charged particle microscope (1) for wafer inspection is comprising a charged-particle multi-beamlet generator (300) for generating a plurality of primary charged particle beamlets (3), and an object irradiation unit (100) for illuminating an image patch (17.1) on a wafer surface (25) arranged in an object plane (101) by the plurality of primary charged particle beamlets (3), thereby generating during use a plurality of secondary electron beamlets (9) emitting from the wafer surface (25), and a detection unit (200) with a projection system (205) and an image sensor (207) for imaging the plurality of secondary electron beamlets (9) onto the image sensor (207), and for acquisition during use a digital image of the image patch (17.1) of the wafer surface (25). The multi-beam charged particle microscope (1) is further comprising a collective multi-beam raster scanner (110) comprising at least a first set of deflection electrodes and an intersection volume (189), the plurality of primary charged particle beamlets (3) traversing during use the intersection volume (189), and a control unit (800), configured to provide during use at least a first scanning voltage difference $VSp(t)$ to the first set of deflection electrodes for collective raster scanning of the plurality of primary charged particle beamlets (3) in a first or p-direction. The collective multi-beam raster scanner (110) is configured to generate a predetermined inhomogeneous scanning deflection field distribution in the intersection volume (189) for reduction of a scanning induced aberration of a primary charged particle beamlet incident on the intersection volume (189) at an inclination angle $\beta$ deviating from an optical axis of the multi-beam charged particle microscope (1).

In an example, a deflection electrode of the first set of deflection electrodes is configured by two spatially separated electrodes and the control unit (800) is configured to provide during use a first and a second scanning voltage difference $VSp1(t)$ and $VSp2(t)$ to the two spatially separated electrodes, wherein the first and second scanning voltage differences $VSp1(t)$ and $VSp2(t)$ are different.

In an example, the collective multi-beam scanning raster scanner (110) of the multi-beam charged particle microscope (1) comprises a second set of deflection electrodes for generation during use a second predetermined inhomogeneous scanning deflection field distribution, the plurality of primary charged particle beamlets (3) traversing the second predetermined inhomogeneous scanning deflection field distribution in the intersection volume (189) for scanning deflection of the plurality of primary charged particle beamlets (3) in a second or q-direction, perpendicular to the first direction, and the control unit (800) configured to provide during use at least a second scanning voltage difference $VSq(t)$ to the second set of deflection electrodes.

In an example, the shape and geometry of the at least first set or second set of deflection electrodes of the collective multi-beam raster scanner (110) is adapted to a cross section of the intersection volume (189) of the plurality of primary charged particle beamlets (3). In an example, the cross section of the intersection volume (189) is of hexagonal shape and the first set or second set of deflection electrodes are arranged at an elliptical circumference. In an example, the cross section of the intersection volume (189) is of rectangular shape and the first set or second set of deflection electrodes are arranged at a rectangular circumference. Thereby, a predetermined field inhomogeneity of the inhomogeneous electrostatic field distribution can be generated.

In an example, in a mean direction of propagation of the plurality of primary charged particle beamlets (3), the first set of deflection electrodes and the second set of deflection electrodes have a different length. Thereby, a predetermined field inhomogeneity of the inhomogeneous electrostatic field distribution can be generated.

In an example, the collective multi-beam raster scanner (110) further comprises a first set of correction electrodes (185, 193) configured for generation during use a predetermined scanning correction field contributing to the predetermined inhomogeneous electrostatic field distribution. In an example, an electrode (185.1, 185.2, 185.3, 185.4) of the first set of correction electrodes is arranged outside of the intersection volume (189) in a space between an electrode of the first set of deflection electrodes and an electrode of the second set of deflection electrodes. In an example, the collective multi-beam raster scanner (110) further comprises a second set of correction electrodes (187, 195) configured for generation during use a predetermined second scanning correction field contributing to the predetermined inhomogeneous electrostatic field distribution.

In an example, the collective multi-beam raster scanner (110) is configured for an adjustment of the lateral position of the predetermined inhomogeneous scanning deflection field distribution with respect to the intersection volume, and the control unit (800) is configured to provide during use a voltage offset to at least one of the first set of deflection electrodes or the second set of deflection electrodes. Thereby, a position of the predetermined inhomogeneous electrostatic field distribution is adjusted and a scanning induced aberration difference between the plurality of primary charged particle beamlets is minimized.

In an example, the multi-beam charged particle microscope (1) is comprising a first static deflection system (701) arranged between the charged-particle multi-beamlet generator (300) and the collective multi-beam raster scanner (110) arranged and configured for adjusting a lateral position of the plurality of primary charged particle beamlets (3) with respect to the intersection volume (189). Thereby, a position of the plurality of primary charged particle beamlets with respect to the predetermined inhomogeneous electrostatic field distribution is adjusted and a scanning induced aberration difference between the plurality of primary charged particle beamlets is minimized.

In an example, the multi-beam charged particle microscope (1) is comprising a second static deflection system (701) between the a charged-particle multi-beamlet generator (300) and the collective multi-beam raster scanner (110), arranged and configured for adjusting a mean angle of incidence of the plurality of primary charged particle beamlets (3) at the entrance side of the intersection volume (189), with the mean angle of incidence of the plurality of primary charged particle beamlets (3) being the mean value of the plurality of angles of incidence of each individual primary beamlet. Thereby, a scanning induced aberration difference between the plurality of primary charged particle beamlets is minimized.

In a second embodiment, the object irradiation unit of a multi-beam charged particle microscope comprises a first multibeam scanning corrector or multibeam scanning correction system, such as a scanning distortion compensator array for individual compensation of scanning induced aberrations for each primary beamlet during a raster or image scan. The first multibeam scanning correction system controls a position of each individual beamlet at a surface of a sample during collective raster scanning with the long stroke collective multi-beam raster scanner. The collective multi-beam raster scanner collectively deflects the plurality of primary charged particle beamlets over the respective image subfields on the surface of a substrate with an image subfield extension of about D=8 $\mu$m or 12 $\mu$m. The collective multi-beam scanning deflector can be an optimized multi-beam scanning deflector according the first embodiment. The first multibeam scanning correction system is configured as an array element with a plurality of apertures, and with a plurality of deflection elements provided at the plurality of apertures, and each beamlet of the plurality of primary beamlets can be scanning deflected individually by a different amount of scanning deflection, synchronized with a collective raster scanning of the plurality of primary beamlets by the collective multi-beam raster scanner. The multibeam scanning correction system, such as the scanning distortion compensator array dynamically corrects a residual scanning distortion of about r=1 nm to 5 nm, to a value below 0.3 nm, such as below 0.2 nm or even below 0.1 nm individually for each beamlet.

According the second embodiment of the disclosure, a multi-beam charged particle microscope (1) for wafer inspection is comprising a charged-particle multi-beamlet generator (300) for generating a plurality of primary charged particle beamlets (3), an object irradiation unit (100) for illuminating an image patch (17.1) on a wafer surface (25) arranged in an object plane (101) by the plurality of primary charged particle beamlets (3), thereby generating during use a plurality of secondary electron beamlets (9) emitting from the wafer surface (25), a detection unit (200) with a projection system (205) and an image sensor (207) for imaging the plurality of secondary electron beamlets (9) onto the image sensor (207), and for acquisition during use a digital image of the image patch (17.1) of the wafer surface (25), and a collective multi-beam raster scanner (110). The multi-beam charged particle microscope (1) is further comprising a multibeam scanning correction system, configured as a scanning distortion compensator array (601) arranged in propagation direction of the plurality of primary charged particles upstream of the collective multi-beam raster scanner (110), with a plurality of apertures, each of the plurality of apertures configured for transmitting during use a corresponding primary charged particle beamlet of the plurality of primary charged particle beamlets, each of the plurality of apertures comprising first deflection elements for individually deflecting each corresponding primary charged particle beamlet in a first or p-direction and second deflection elements for individually deflecting each corresponding primary charged particle beamlet in a second or q-direction perpendicular to the first direction, and a control unit (800), configured to provide during use at least a first scanning voltage difference VSp(t) to the collective multi-beam raster scanner (110) for scanning deflection of the plurality of primary charged particle beamlets (3) in the first or p-direction. The scanning distortion compensator array (601) further comprises a scanning array control unit (622) with a first static voltage conversion unit or array (611), configured to provide a plurality of first correction voltage differences to the plurality of first deflection elements and a second static voltage conversion array (612) configured to provide a plurality of second correction voltage differences to the plurality of second deflection elements to compensate a scanning induced aberration during the scanning deflection of the plurality of primary charged particle beamlets (3) in the first direction. The first static voltage conversion array (611) and the second static voltage conversion array (612) are coupled to the control unit (800) and are configured to provide to each of the plurality of first and second deflection elements at least a plurality of first voltage difference components synchronized with the first scanning voltage difference VSp(t).

In an example, the control unit (800) is configured to provide during use a second scanning voltage difference VSq(t) to the collective multi-beam raster scanner (110) for scanning deflection of the plurality of primary charged particle beamlets (3) in a second or q-direction, perpendicular to the first direction. The first static voltage conversion array (611) and the second static voltage conversion array (612) are coupled to the control unit (800) and configured to provide to each of the plurality of first and second deflection elements at least a plurality of second voltage difference components synchronized with the second scanning voltage difference VSq(t). In an example, the first static voltage conversion array (611) is coupled to the control unit (800) and configured to provide to each of the plurality of first deflection elements at least a first voltage component synchronized with the first scanning voltage difference VSp(t) and a second voltage component synchronized with the second scanning voltage difference VSq(t).

In an example, the first or second static voltage conversion array (611, 612) is configured as a programmable resistor array.

Thereby, a scanning positions of the plurality of focus points of the plurality of primary charged particle beamlets on the object surface are adjusted synchronized with an image scan and a scanning induced distortion difference between the plurality of primary charged particle beamlets is minimized.

In a third embodiment, the object irradiation unit comprises a second multi-beam scanning correction system, for example a scanning compensator array (602) for compensation of a scanning induced telecentricity aberration, arranged between the first multibeam scanning correction system and the collective multi-beam raster scanner for individual control of an angle of incidence of each individual beamlet at a surface of a sample. The second scanning compensator array (602) for compensation of a scanning induced telecentricity aberration, arranged in the proximity of an intermediate image plane (321) of the multi-beam charged particle microscope (1), with a plurality of deflection elements arranged at a plurality of apertures and a second scanning array control unit (622.2) with a second static voltage conversion array, configured to provide a plurality of second correction voltage differences to each of the plurality of deflection elements to compensate a scanning induced telecentricity aberration during an image scan for each of the primary charged particle beamlets (3). Thereby, each beamlet of the plurality of primary beamlets can be deflected individually by a different amount of deflection, synchronized with a collective deflection scanning of the plurality of primary beamlets by the collective multi-beam deflection scanner. Thereby, the angles of incidence of the plurality of primary charged particle beamlets on the object surface are adjusted synchronized with an image scan and a scanning induced telecentricity error of each of the plurality of primary charged particle beamlets is minimized.

In an example, the multi-beam charged particle microscope (1) is comprising a further multi-beam scanning correction system configured as a scanning stigmator array or a scanning lens array for compensation of a scanning induced aberration, such as scanning induced astigmatism or focus plane deviation of each beamlet of the plurality primary charged particle beamlets (3) during raster scanning of the plurality of primary beamlets (3). Thereby, an imaging aberration such as an astigmatism of each of the plurality of primary charged particle beamlets on the object surface is adjusted synchronized with an image scan and a scanning induced imaging aberration of each of the plurality of primary charged particle beamlets is minimized.

In a forth embodiment, a method of operation of a multi-beam charged particle microscope is provided, comprising a step of calibration of the charged particle microscope by measurement of a scanning induced aberration. In a further step, static control parameters or signals are derived and a reduction factor for the generation of a driving voltage differences VC(t) for the correction electrodes or the first or second scanning correction system are generated. The static control parameters and reduced driving voltage differences are provided to the first or second scanning correction system. During an image scan, a scanning deflection voltage difference VS(t) is reduced by the reduction factor to at least one driving or correction voltage difference VC(t) and provided to the correction electrodes and a scanning induced aberration is reduced during operation of the charged particle microscope.

In a fifth embodiment, a multi-beam charged particle microscope (1) for wafer inspection is comprising a charged-particle multi-beamlet generator (300) for generating a plurality of primary charged particle beamlets (3), an object irradiation unit (100) for illuminating an image patch (17.1) on a wafer surface (25) arranged in an object plane (101) by the plurality of primary charged particle beamlets (3), thereby generating during use a plurality of secondary electron beamlets (9) emitting from the wafer surface (25), a detection unit (200) with a projection system (205) and an image sensor (207) for imaging the plurality of secondary electron beamlets (9) onto the image sensor (207), and for acquisition during use a digital image of the image patch (17.1) of the wafer surface (25), and a collective multi-beam raster scanner (110) with at least a first set of deflection electrodes and an intersection volume (189), the plurality of primary charged particle beamlets (3) traversing the intersection volume (189). The multi-beam charged particle microscope (1) is further comprising a first static deflection system (701) arranged between the charged-particle multi-beamlet generator (300) and the collective multi-beam raster scanner (110), configured for adjusting a lateral position of the plurality of primary charged particle beamlets (3) with respect to the intersection volume (189). A control unit (800) is configured to provide during use at least a first scanning voltage difference VSp(t) to the collective multi-beam raster scanner (110) for scanning deflection of the plurality of primary charged particle beamlets (3) in the first or p-direction. The collective multi-beam raster scanner of a multi-beam charged particle microscope is configured with an intersection volume, through which during use the plurality of primary charged particle beamlets propagates. According the first embodiment, the collective multi-beam raster scanner is configured to generate an inhomogeneous electrostatic scanning deflection field in the intersection volume. The residual scanning induced aberrations depend on the lateral traversing position and angle of incidence of the plurality of primary beamlets at the intersection volume of the collective multi-beam deflection scanner. In the fifth embodiment, a multi-beam charged particle microscope comprises a first static deflector upstream the collective multi-beam deflection scanner. With the first static deflector, either the lateral traversing position or the angle of incidence of the plurality of primary charged particle beamlets is adjusted at the intersection volume. In an example, the object irradiation unit of the multi-beam charged particle microscope comprises a second static deflector between the first static deflector and the collective multi-beam raster scanner for adjustment of lateral traversing position and angle of incidence of plurality of primary beamlets. In a method of operation, a traversing position at the intersection volume is adjusted to a predetermined position with a first static deflector and a mean angle of incidence of the plurality of primary beamlets on the intersection volume is adjusted by the second static deflector.

In an example, the multi-beam charged particle microscope (1) is comprising a second static deflection system (703) between the a charged-particle multi-beamlet generator (300) and the collective multi-beam raster scanner (110) arranged and configured for adjusting a mean angle of incidence of the plurality of primary charged particle beamlets (3) at the entrance side of the intersection volume (189).

Thereby, a scanning induced imaging aberration such as a distortion or an astigmatism of each of the plurality of primary charged particle beamlets on the object surface is reduced, synchronized with an image scan and a scanning induced imaging aberration of each of the plurality of primary charged particle beamlets is minimized.

In a sixth embodiment, an improved multi-beam charged particle microscope is provided with a long stroke raster scanner which is capable of a lateral displacement or a tilt. In an example, the lateral displacement or tilt is achieved by laterally displacing or tilting the electrostatic deflection field with respect to an intersection volume by additional correction electrodes or by providing a plurality of predetermined voltage offset to the deflection electrodes and the correction electrodes of the first embodiment of the disclosure. In an alternative example, the long stroke raster scanner comprises a mechanical mechanism including a guidance element or stage and at least an actuator for adjustment of a lateral position or tilt angle of the deflection electrodes and optional correction electrodes to displace the electrostatic deflection field with respect to the intersection volume.

Thereby, a scanning induced imaging aberration such as a distortion or an astigmatism of each of the plurality of primary charged particle beamlets on the object surface is reduced, synchronized with an image scan and a scanning induced imaging aberration of each of the plurality of primary charged particle beamlets is minimized.

In a seventh embodiment, an improved multi-beam charged particle microscope is provided with a combination of the fifth and sixth embodiment In an example, a method of operation of a multi-beam charged particle microscope is provided. In a first step 1, the system is calibrated, and actual control parameters are stored in a memory. In a second step 2, the beam position of the plurality of primary beamlets at the intersection volume of the collective multi-beam raster scanner is adjusted. In an example according the fifth embodiment, adjustment is achieved by first and optionally second static deflectors. In an example according the sixth embodiment, a lateral displacement of the inhomogeneous deflection field is obtained by offset signals provided to the collective multi-beam deflection scanner. In a third step, control signals are provided. In an example, a correction field is generated from the control signals with the actual control parameters stored in step 1 and a scanning correction field is generated by correction electrodes provided with a correction voltage difference synchronized with a scanning voltage difference. In an example, a plurality of correction voltage differences is generated from the static control signals, and each of the beamlets is individually deflected by the multibeam scanning correction system. Thereby, a scanning induced imaging aberration such as a distortion or an astigmatism of each of the plurality of primary charged particle beamlets on the object surface is reduced, synchronized with an image scan and a scanning induced imaging aberration of each of the plurality of primary charged particle beamlets is minimized.

In an eighth embodiment, at least two of the mechanisms of the first to the seventh embodiments described above are combined and a further reduction of a scanning induced aberration is achieved.

In a ninth embodiment of the disclosure, a multi-beam charged particle microscope for wafer inspection is provided, comprising a beamlet generator for generating at least a first primary charged particle beamlet and an object irradiation unit for illuminating an image subfield of a surface of a sample arranged in an object plane by the first primary charged particle beamlet and a collective raster scanner. The multi-beam charged particle microscope is further comprising a control unit, configured to provide during use at least a first scanning voltage difference VSp(t) to the collective raster scanner for a scanning deflection of the at least one first primary charged particle beamlet in a first or p-direction over the image subfield, the image subfield having a lateral extension of at least 5 μm, such as 8 μm or more, and at least a first scanning corrector configured to generate during use a first scanning correction field for influencing the first primary charged particle beamlet. The control unit is configured to provide the first scanning voltage difference VSp(t) to the first scanning corrector and the first scanning corrector is configured to reduce a scanning induced aberration of the first primary charged particle beamlet synchronized with the collective scanning deflection of the plurality of primary charged particle beamlets. The first scanning corrector comprises a static voltage conversion unit for conversion of the first scanning voltage difference VSp(t) into at least a first scanning correction voltage difference VCp(t), adapted to generate the first scanning correction field synchronized with the first scanning voltage difference VSp(t). The static voltage conversion unit can comprise at least a programmable resistor sequence, configured to be programmed by a plurality of static control signals, such that the static voltage conversion unit is configured to generate the first scanning correction voltage difference VCp(t) proportional to the first scanning voltage difference VSp(t). The control unit can comprise a first delay line configured to synchronize the first scanning correction field with the collective raster scanning of the plurality of primary charged particle beamlets by the collective raster scanner. The first scanning corrector comprises at least a first deflection element configured to compensate during use a scanning induced distortion of at least the first primary charged particle beamlet of about 0.5 nm to 5 nm to a reduced amount of below 0.3 nm, such as below 0.2 nm or below 0.1 nm. In analogy, other scanning induced aberrations of the multi-beam charged particle microscope can be reduced, for example a scanning induced astigmatism, which typically increases with increasing field height of the image subfield of the first primary charged particle beamlet. In an example, the scanning induced aberration is a residual scanning induced distortion, and the first deflection element is configured to individually compensate during use a scanning induced distortion of the first primary charged particle beamlet in the first direction synchronized with the scanning deflection of the plurality of primary charged particle beamlets by the collective raster scanner in the first direction. A second deflection element can be configured to individually compensate during use a scanning induced distortion of the first primary charged particle beamlet in a second direction synchronized with the scanning deflection of the plurality of primary charged particle beamlets by the collective raster scanner in the first direction perpendicular to the second direction. Generally, the scanning induced aberration is at least one of the group of a scanning induced distortion, scanning induced astigmatism, a scanning induced telecentricity aberration, a scanning induced spherical aberration or a scanning induced coma. In an example, the multi beam charged particle microscope is comprising a static correction system for correction of a dispersion, field curvature or a static spherical aberration. In an example, the multi-beam charged particle microscope further comprises a second scanning corrector, configured for reduction of a second scanning induced aberration during a raster scan of the first primary charged particle beamlet by the collective raster scanner, the second scanning induced aberration being for example a scanning induced astigmatism, a scanning induced telecentricity aberration, a scanning induced spherical aberration or a scanning induced coma.

In a forth embodiment of the disclosure, a method of operating a multi-beam charged particle microscope (1) with a charged-particle multi-beamlet generator (300), an object irradiation unit (100), a detection unit (200), a collective multi-beam raster scanner (110) for collective raster scanning of a plurality of primary charged particle beamlets (3), and a scanning distortion compensator array (601) arranged in propagation direction of the plurality of primary charged particles upstream of the collective multi-beam raster scanner (110), and a control unit (800) is provided. The method is comprising the steps of providing at least a first scanning voltage difference VSp(t) to a scanning array control unit (622), generating a plurality of voltage difference components from at least the first voltage difference VSp(t) and from a plurality of static control signals, and providing the plurality of voltage difference components to a plurality of deflection elements of scanning distortion compensator array (601) to individually scanning deflecting each beamlet of the plurality of primary charged particle beamlets to compensate a scanning induced distortion during collective raster scanning of the plurality of primary charged particle beamlets (3).

In an example, the method of operating a multi-beam charged particle microscope (1) is further comprising the steps of determining a scanning induced distortion by raster scanning a plurality of primary charged particles over an image patch of a reference object, extraction of a plurality of amplitudes of at least a linear part of a scanning induced distortion for each primary charged particle beamlet, deriving the plurality of static control signals from each of the plurality of amplitudes, and providing the plurality of static control signal to a scanning array control unit (622) of the scanning distortion compensator array (601).

With the embodiments of the disclosure, a scanning induced aberration of an individual primary beamlet is compensated in parallel and synchronized with a collective raster scanning operation of the plurality of primary beamlets. The scanning induced aberration of an individual primary beamlet is compensated by scanning correctors, including a first scanning corrector, in which a plurality of individual voltage differences is generated. The plurality of individual voltage differences is generated from a voltage difference VSp(t) generated for long stroke raster scanning by a raster scanner in a first scanning direction. A multi-beam charged particle microscope for wafer inspection according an embodiment is therefore comprising a generator for generating a plurality of primary beamlets, comprising at least a first individual beamlet, and an object irradiation unit for illuminating an image patch on a surface of a sample arranged in an object plane by the plurality of primary beamlets, thereby generating during use a plurality of secondary electron beamlets emitting from the surface, and a detection unit with a projection system and an image sensor for imaging the plurality of secondary electron beamlets onto the image sensor for acquisition during use a digital image of the image patch of the surface of the sample. The multi-beam microscope for wafer inspection according the embodiments further comprises a collective multi-beam raster scanner comprising at least a first set of deflection electrodes and an intersection volume, the plurality of primary beamlets traversing the intersection volume, and at least a first scanning corrector, configured to generate during use a first scanning electrostatic field for influencing at least the first individual primary beamlet, and a control unit, configured to provide during use at least a first scanning voltage difference VSp(t) to the first set of deflection electrodes for a collective raster scanning of the plurality of primary beamlets in a first or p-direction. The control unit is further configured to provide the first scanning voltage difference VSp(t) to the first scanning corrector, the first scanning corrector being configured to reduce a scanning induced aberration of at least the first individual beamlet. In an example, the first scanning corrector of a multi-beam charged particle microscope comprises a first static voltage conversion unit for conversion of the first scanning voltage difference VSp(t) into at least a first scanning correction voltage difference VCp(t), adapted to generate the first scanning correction field synchronized with the first scanning voltage difference VSp(t). In an example, the first static voltage conversion unit is configured to generate the first scanning correction voltage difference VCp(t) proportional to the first scanning voltage difference VSp(t). In an example, the static voltage conversion unit comprises at least a programmable resistor sequence, configured to be programmed by a plurality of static control signals. In an example, the control unit comprises a first delay line configured to synchronize the first scanning correction field with the collective raster scanning of the plurality of primary beamlets by the collective multi-beam raster scanner.

In an example, the first scanning corrector of the multi-beam charged particle microscope comprises a plurality of deflection elements configured to compensate during use a scanning induced distortion for each of the plurality of primary beamlets. For example, the plurality deflection elements is comprising a first deflection element configured to individually compensate during use a scanning induced distortion of the first individual primary beamlet in the first direction synchronized with the scanning deflection of the plurality of primary beamlets by the collective multi-beam raster scanner in the first direction and a second deflection element configured to individually compensate during use a scanning induced distortion of the first individual beamlet in a second direction perpendicular to the first direction, synchronized with the scanning deflection of the plurality of primary beamlets by the collective multi-beam raster scanner in the first direction. The plurality of deflection elements is further comprising a third deflection element configured to individually compensate during use a scanning induced distortion of a second individual primary beamlet in a first direction synchronized with the scanning deflection of the plurality of primary beamlets by the collective multi-beam raster scanner in the first direction. The plurality of deflection elements is comprising further deflection elements configured to individually compensate during use a scanning induced distortion of each individual primary beamlet in the first direction and further deflection elements configured to individually compensate during use a scanning induced distortion of each individual primary beamlet in the second direction synchronized with the scanning deflection of the plurality of primary beamlets by the collective multi-beam raster scanner in the first direction. In an example, the static voltage conversion unit comprises a plurality of programmable resistor sequences, each programmable resistor sequences electrically connected to a deflection element of the plurality of deflection elements, the plurality of programmable resistor sequence forming a programmable resistor array controlled by a plurality of static control signals, configured to generate during use a plurality of scanning correction voltage differences VCAp(i,t), each synchronized with the first scanning voltage difference VSp(t).

In an example, the first scanning corrector is comprising at least a correction electrode configured to contribute during use to an inhomogeneous electrostatic field distribution generated in the intersection volume of the collective multi-beam deflection system, configured for reduction of a scanning induced aberration of an individual primary beamlet incident on the intersection volume at an inclination angle β deviating from an optical axis of the multi-beam charged particle microscope.

A method of operating a multi-beam charged particle microscope according an embodiment comprises the steps of generating a scanning voltage difference VSp(t) and providing the scanning voltage difference VSp(t) to a collective multi-beam raster scanner for collectively deflection scanning of a plurality of primary beamlets with the collective multi-beam raster scanner in a first direction. The method further comprises generating from the scanning voltage difference VSp(t) at least a first scanning correction voltage difference VCp(t), synchronized with the scanning voltage difference VSp(t) and providing the first scanning correction voltage difference VCp(t) to a deflection element of a scanning corrector for reduction of a scanning induced aberration of at least one individual primary beamlet. For generating the first scanning correction voltage difference VCp(t), the method includes the step of providing a plurality of static control signals to the scanning corrector for generating the first scanning correction voltage difference VCp(t). To synchronize of a scanning deflection of the at least one primary beamlet and the reduction of the scanning induced aberration of the at least one individual beamlet, the method is further comprising the step of generating a predetermined time delay between the first scanning correction voltage difference VCp(t) and the scanning voltage difference VSp(t).

A multi-beam charged particle microscope according the first to ninth embodiment comprises a static voltage conversion array configured to provide at least one scanning correction voltage difference to the at least one scanning corrector or compensation element in dependency of a scan position (p,q) in an image field during an image or raster scan. The static voltage conversion array is configured to provide the scanning correction voltage difference from at least one common, long stroke scanning voltage difference, thereby maintaining the dependency of the scanning induced aberration from a scan position (p,q) in an image field during an image scan. In an example, the static voltage conversion array is programmable by a plurality of static control signals. The multi-beam charged particle microscope further comprises a control unit which is configured to provide the plurality of static control signals to the static voltage conversion array. In an example, the control unit is configured to generate the plurality of static control signals from a calibration measurement. In an example, the control unit is configured to generate the plurality of static control signals by monitoring of the status of the charged particle microscope.

The control unit is configured to provide during use at least a first scanning voltage difference VSp(t) to the first set of deflection electrodes for a long stroke scanning deflection of the single or plurality of primary beamlets in a first or p-direction. The control unit is further configured to provide the first scanning voltage difference VSp(t) to the first scanning corrector, the first scanning corrector being configured to reduce a scanning induced aberration of at least a first individual primary beamlet. In an example, the first scanning corrector of a multi-beam charged particle microscope comprises a first static voltage conversion unit for conversion of the first scanning voltage difference VSp(t) into at least a first scanning correction voltage difference VCp(t), adapted to generate the first scanning electrostatic field synchronized with the first scanning voltage difference VSp(t). The first static voltage conversion unit is configured to generate the first scanning correction voltage difference VCp(t) proportional to the first scanning voltage difference VSp(t).

The static voltage conversion array of an example is implemented as a programmable resistor array, configured to be programmed by the plurality of static control signals. With the programmable resistor array, the dynamic signals used to compensate the scanning distortion for each of the plurality of beamlets is reduced to only two scanning control voltage differences VCp(t) and VCq(t), which are obtained from the scanning voltage differences VSp(t) and VSq(t) generated by a scanning control unit for driving the collective multi-beam raster scanner. From the two control voltage differences VCp(t) and VCq(t), a compensation or correction of scanning induced aberrations is achieved, for example for the scanning induced distortion, scanning induced telecentricity aberration or scanning induced astigmatism. In an example, the control unit comprises a first delay line configured to synchronize the first scanning corrector field with the collective raster scanning of the plurality of primary beamlets by the collective multi-beam raster scanner. The compensation or correction is directly connected via delay lines and thus directly depending from the scanning voltage differences VSp(t) and VSq(t) and therefore, the compensation or correction of scanning induced aberrations is synchronized with a scanning operation and proportional to the scanning coordinate (p,q) for each image subfield. In an example, the linear part of scanning induced aberrations, which forms the major part of the scanning induced aberrations, is compensated by the proportionality of the control voltage differences VCp(t) and VCq(t) to the scanning voltage differences VSp(t) and VSq(t). For each of the plurality of image subfields and corresponding beamlets, the amplitudes of the linear parts of the scanning induced aberrations are different, and the used control signals are derived from the common control voltage differences VCp(t) and VCq(t) for example by the programmable resistor array, by which for each electrode the corresponding proportional voltage difference is generated from the common control voltage differences VCp(t) and VCq(t). Each individual voltage difference provided to an electrode of for example the scanning distortion compensator array or the correction electrodes of the collective multi-beam raster scanner is directly coupled to the common control voltage differences VCp(t) and VCq(t) via a programmable resistor sequence of the programmable resistor array. For example, the individual voltage difference provided to an electrode for compensation of a scanning induced aberration of an individual beamlet is controlled by a plurality of predetermined static control signals, by which each programmable resistor sequence is programmed. Thereby, the individual voltage differences are also proportional to the scanning voltage differences VSp(t) and VSq(t) and thus proportional to the scanning coordinates (p,q) in each image subfield. With proper engineering of for example the scanning distortion compensator array, including the at least one static voltage conversion array and electrically conductive connection lines to each individual deflector electrode, propagation effects (i.e. time delays for different deflectors) are reduced and a highly dynamic compensation of scanning induced aberrations with a dynamic range of 50 MHz and more are possible, for example of about 80 MHz, or even 100 MHz. Static delay lines are implemented to synchronize the compensation of scanning induced aberrations with the scanning deflection of the plurality of primary charged particle beamlets with the collective multi-beam deflection system. In addition, the electrically conductive connections for providing the highly dynamic correction voltage differences to the electrodes can be configured as high frequency connections and for example shielded by ground lines and cross talk or radiation losses are avoided.

In an example, a scanning corrector of the multi-beam charged particle microscope comprises a plurality of deflection elements configured to compensate during use a scanning induced distortion for each of the plurality of primary beamlets. For example, the plurality deflection elements is comprising a first deflection element configured to individually compensate during use a scanning induced distortion of the first individual beamlet in the first direction synchronized with the scanning deflection of the plurality of primary beamlets by the collective multi-beam raster scanner in the first direction and a second deflection element configured to individually compensate during use a scanning induced distortion of the first individual beamlet in a second direction perpendicular to the first direction synchronized with the scanning deflection of the plurality of primary beamlets by the collective multi-beam raster scanner in the first direction. The plurality deflection elements are further comprising a third deflection element configured to individually compensate during use a scanning induced distortion of a second individual beamlet in a first direction synchronized with the scanning deflection of the plurality of primary beamlets by the collective multi-beam raster scanner in the first direction. In an example, the static voltage conversion unit comprises a plurality of programmable resistor sequences, each programmable resistor sequences connected to a deflection element of the plurality of deflection elements, the plurality of programmable resistor sequence forming a programmable resistor array controlled by a plurality of static control signals, configured to generate during use a plurality of scanning correction voltage differences VCAp(i,t), each synchronized with the first scanning voltage difference VSp(t).

In an example, the first scanning corrector is comprising at least a correction electrode configured to contribute during use to an inhomogeneous electrostatic field distribution generated in the intersection volume of the collective multi-beam deflection system, configured for reduction of a scanning induced aberration of an individual primary beamlet propagating in at least a segment of the intersection volume at an angle deviating from an optical axis of the multi-beam charged particle microscope.

A method of operating a multi-beam charged particle microscope according an embodiment comprises the steps of generating a scanning voltage difference VSp(t) and providing the scanning voltage difference VSp(t) to a collective multi-beam raster scanner for collectively deflection scanning of a plurality of primary beamlets with the collective multi-beam raster scanner in a first direction. The method further comprises generating from the scanning voltage difference VSp(t) at least a first scanning correction voltage difference VCp(t), synchronized with the scanning voltage difference VSp(t) and providing the first scanning correction voltage difference VCp(t) to a deflection element of a scanning corrector for reduction of a scanning induced aberration of at least one individual beamlet of the plurality of primary beamlets. For generating the first scanning correction voltage difference VCp(t), the method includes the step of providing a plurality of static control signals to the scanning corrector for generating the first scanning correction voltage difference VCp(t). To synchronize of a collective raster scanning of the plurality of primary beamlets and the reduction of the scanning induced aberration of the at least one individual beamlet, the method further comprising the step of generating a predetermined time delay between the first scanning correction voltage difference VCp(t) and the scanning voltage difference VSp(t).

In some examples, a scanning of the plurality of primary charged particle beamlets over the wafer surface is achieved by the first collective multi-beam raster scanner (110) only in the first direction, and the wafer is continuously moved by the wafer stage in the second direction. In this example, the scanning voltage differences VSq(t) in the second direction is at a constant voltage difference or zero.

The collective multi-beam raster scanner for collectively deflection scanning of a plurality of primary charged particles according the first embodiment generates during use reduced scanning induced aberrations. With the optimized design of the collective multi-beam raster scanner for generating a predetermined inhomogeneous field distribution for deflection scanning, scanning induced aberrations are reduced. Residual scanning induced aberrations are different for each beamlet, since for each beamlet, propagation angles through the intersection volume of the collective multi-beam raster scanner are different. Generally, even if nonlinear scanning aberrations are minimized for example for a plurality of zonal field points with similar distance to an optical axis, there will be for example residual scanning distortions for the other field points corresponding to other beamlets. The disclosure is thus important for multi-beam systems comprising more than one beam traversing a deflection scanner at different symmetry positions, and for the large field of view of for example a multi-beam scanning electron microscope. The angular spread of beam angles at the scanning deflector corresponds to the field patch size divided by the focal length f of the objective lens. Since f can not become very large and f is limited by the practical limit for the diameter of the objective lens, the angular spread is significantly larger at a multi-SEM scanner compared to single beam scanner. The field patch size is for example a factor of 10 higher compared to a typical single beam SEM. For an overlay or absolute position accuracy of 1 nm, the ratio provided by the collective multi-beam raster scanner is 100.000:1. A resolution of 16 bit is thus not sufficient, at least 32 bit is used corresponding to a 32 bit DAC conversion for generating the deflection voltage differences VSp(t) and VSq(t).

Typically, the objective lens comprises a thick magnetic lens. Traversing paths of plurality of primary charged particle beamlets are different for all field points and change during scanning. Thereby, during scanning, residual aberrations and differences of aberrations between individual beamlets are introduced by the objective lens. With the modified design of the deflection electrodes the scanning induced distortion in the image subfields is reduced during an image scan. For example, with the separation of deflection electrodes in pairs of deflection electrodes, with deflection electrodes of modified azimuthal or longitudinal extension or with deflection electrodes optimized or adapted for the raster configuration of the plurality of primary charge particle beamlets, the scanning induced distortion in the image subfields is reduced. With additional correction electrodes the scanning distortion can be further reduced. In an example, the performance of the deflection system is optimized together with the imaging aberrations induced by other optical elements such as objective lens (102), and the scanning induced distortion in the plurality of image subfields for each of primary charged particle beamlets is further reduced. With the additional degrees of freedom by the larger number of deflection electrodes and correction electrodes, fabrication tolerances or drifts of the deflection system can be compensated by adjustment of the plurality of voltages applied to the plurality of deflection electrodes and the plurality of correction electrodes. The modified deflection system according the first embodiment can reduce the residual scanning induced distortion by for example at least 15%, by at least 20% or even by 30%. Compared to an uncorrected scanning distortion with a conventional deflection system of for example about 2 nm, a residual scanning distortion of for example below 1.5 nm is achieved with the first embodiment. A further improvement can be achieved, but increases the sensitivity to alignment errors, noise and drift. An additional improvement of the imaging performance is described in the second embodiment. Thereby, the scanning distortion is reduced by at least 80%, and a residual scanning induced distortion of below 0.3 nm is achieved. With any of the mechanisms of the first to eighth embodiments, scanning induced aberrations from the collective multi-beam raster scanner and other optical elements such as the objective lens are compensated and scanning induced aberrations are effectively minimized. With a combination of the embodiments as described in the eighth embodiment, the residual scanning distortion is reduced by at least 90%, for example by 95%, and residual scanning induced distortion of for example below 0.2 nm, such as below 0.1 nm or even below is achieved.

By the embodiments of the disclosure, a scanning induced aberration of an individual primary beamlet is compensated in parallel and synchronized with a collective raster scanning of the plurality of primary beamlets. The scanning induced aberration of an individual primary beamlet is compensated by scanning correctors, including a first scanning corrector, to which a plurality of individual voltage differences is provided or in which a plurality of individual voltage differences is generated. The plurality of individual voltage differences for correction or compensation of a scanning induced aberration is generated from the voltage differences VSp(t) and VSq(t) generated for collective raster scanning by a collective multi-beam raster scanner. The present disclosure provides a solution for minimizing the scanning induced aberrations, and especially the scanning induced distortion of a multi-beam charged particle microscope. The imaging performance of the conventional multi-beam charged particle microscope is deteriorated by a scanning distortion [dp,dq]. For example, a scanning induced distortion generates an overlay error and variation in pixel spacing or pixel size over the digital image of an image patch of a wafer surface. For systems with a large number J of beamlets, the scanning induced distortion increases and can reach values of 2 nm to 5 nm or more. In addition to the scanning distortion, other scanning induced imaging aberrations such as scanning astigmatism or scanning defocus deteriorate the imaging performance. It is one aspect of the disclosure, that the desired scanning correction is achieved by a reduction of the huge data-rate corresponding to the scanning induced aberration and a compensation of scanning aberrations is made possible with high speed. The correction or compensation of the scanning induced aberrations is enabled by expansion of the scanning induced aberration in a predetermined set of scanning induced aberrations vectors for each image subfield, determining a plurality of amplitudes of normalized scanning induced aberrations vectors for each of the plurality of image subfields, deriving a plurality of static correction or compensation control signals from the amplitudes of each image subfield, and obtaining a control voltage difference for electrostatic compensation or correction elements proportional to common scanning voltage difference VSp(t), VSq(t) in the first and second scanning direction (p,q) in each image subfield, whereby the proportionality is achieved by a static voltage conversion array controlled by the static correction or compensation control signals. For example, a plurality of J linear scanning distortions in a plurality of J image subfields, scanned in parallel by scanning of the plurality of J primary charged particle beamlets with a collective multi-beam raster scanner, is compensated by at least an electrostatic correction field for each beamlet, generated by at least one electrostatic compensation or correction element, whereby each of the correction voltage differences of the at least one electrostatic compensation or correction element for each of the J beamlets is provided by a static voltage conversion array. A static voltage conversion array is for example implemented as a programmable resistor array, comprising a plurality of programmable resistor sequences, with two highly dynamic drive signals proportional to the common scanning voltage differences VSp(t) and VSq(t) for parallel scanning of the plurality of J primary charged particle beamlets in the first and second directions (p,q) with the collective multi-beam raster scanner.

Further details are described at the example of the embodiments. Further embodiments comprise combinations or variations of the examples and embodiments described above.

BRIEF DESCRIPTION OF THE DRAWINGS

More details will be disclosed with reference to the attached drawings.

DETAILED DESCRIPTION

Figure 1:
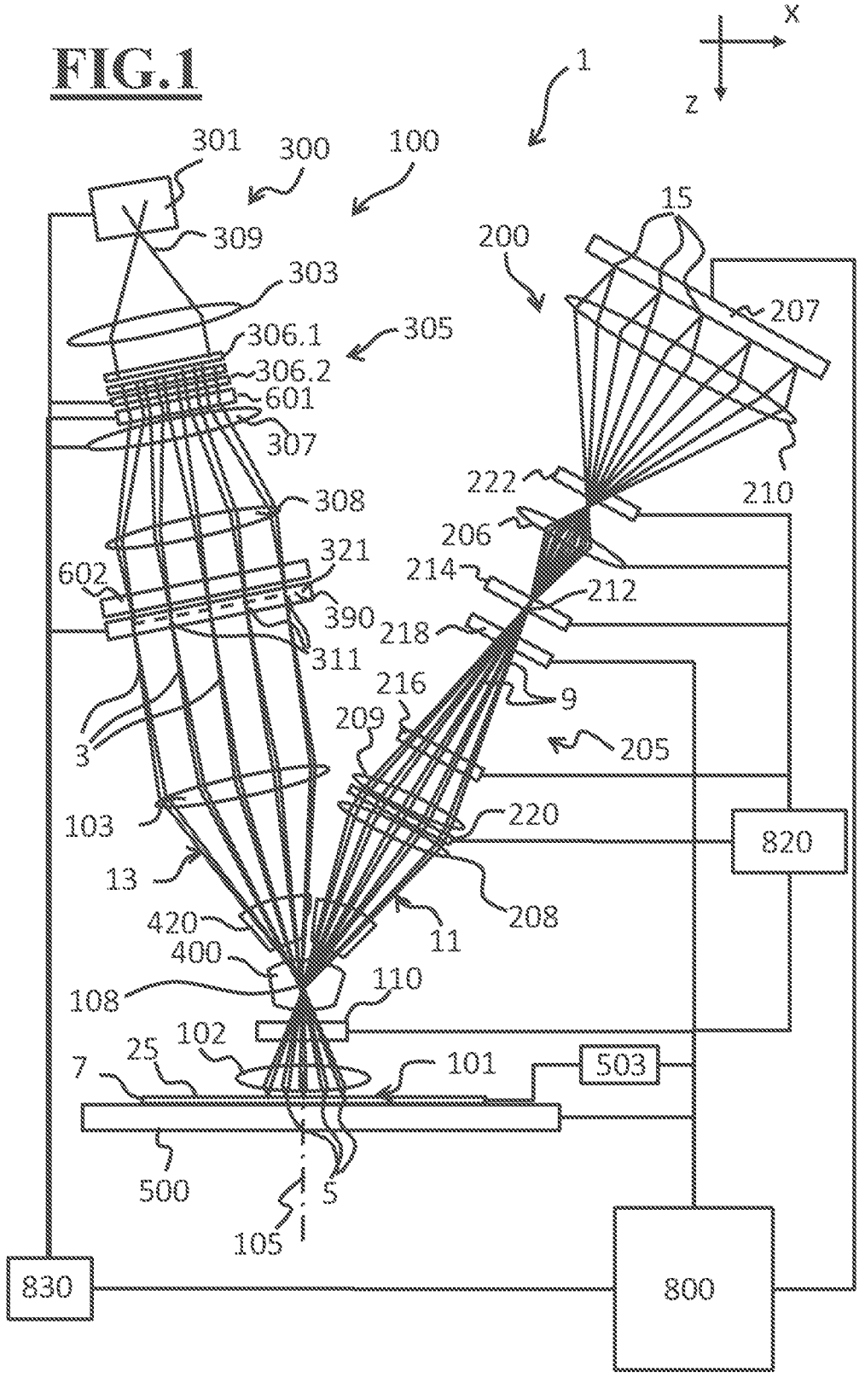
FIG. 1 is an illustration of a multi-beam charged particle microscope system according to an embodiment.

In the exemplary embodiments described below, components similar in function and structure are indicated as far as possible by similar or identical reference numerals.

The schematic representation of FIG. 1 illustrates basic features and functions of a multi-beam charged-particle microscopy system 1 according some embodiments of the disclosure. It is to be noted that the symbols used in the figure do not represent physical configurations of the illustrated components but have been chosen to symbolize their respective functionality. The type of system shown is that of a multi-beam scanning electron microscope (MSEM or Multi-SEM) using a plurality of primary electron beamlets 3 for generating a plurality of primary charged particle beam spots 5 on a surface of an object 7, such as a wafer located with a top surface 25 in an object plane 101 of an objective lens 102. For simplicity, only five primary charged particle beamlets 3 and five primary charged particle beam spots 5 are shown. The features and functions of multi-beamlet charged-particle microscopy system 1 can be implemented using electrons or other types of primary charged particles such as ions and in particular Helium ions.

The microscopy system 1 comprises an object irradiation unit 100 and a detection unit 200 and a beam splitter unit 400 for separating the secondary charged-particle beam path 11 from the primary charged-particle beam path 13. Object irradiation unit 100 comprises a charged-particle multi-beam generator 300 for generating the plurality of primary charged-particle beamlets 3 and is adapted to focus the plurality of primary charged-particle beamlets 3 in the object plane 101, in which the surface 25 of a wafer 7 is positioned by a sample stage 500.

The primary beam generator 300 produces a plurality of primary charged particle beamlet spots 311 in an intermediate image surface 321, which is typically a spherically curved surface to compensate a field curvature of the object irradiation unit 100. The primary beamlet generator 300 comprises a source 301 of primary charged particles, for example electrons. The primary charged particle source 301 emits a diverging primary charged particle beam 309, which is collimated by at least one collimating lens 303 to form a collimated beam. The collimating lens 303 is usually consisting of one or more electrostatic or magnetic lenses, or by a combination of electrostatic and magnetic lenses. The collimated primary charged particle beam is incident on the primary multi-beam forming unit 305. The multi-beam forming unit 305 basically comprises a first multi-aperture plate 306.1 illuminated by the primary charged particle beam 309. The first multi-aperture plate 306.1 comprises a plurality of apertures in a raster configuration for generation of the plurality of primary charged particle beamlets 3, which are generated by transmission of the collimated primary charged particle beam 309 through the plurality of apertures. The multi-beamlet forming unit 305 comprises at least further multi-aperture plates 306.2 and 306.3 located, with respect to the direction of movement of the electrons in beam 309, downstream of the first multi-aperture plate 306.1. For example, a second multi-aperture plate 306.2 has the function of a micro lens array and can be set to a defined potential so that a focus position of the plurality of primary beamlets 3 in intermediate image surface 321 is adjusted. A third, active multi-aperture plate arrangement 306.3 (not illustrated) comprises individual electrostatic elements for each of the plurality of apertures to influence each of the plurality of beamlets individually. The active multi-aperture plate arrangement 306.3 consists of one or more multi-aperture plates with electrostatic elements such as circular electrodes for micro lenses, multi-pole electrodes or sequences of multipole electrodes to form static deflector arrays, micro lens arrays or stigmator arrays. The multi-beamlet forming unit 305 is configured with an adjacent first electrostatic field lenses 307, and together with a second field lens 308 and the second multi-aperture plate 306.2, the plurality of primary charged particle beamlets 3 is focused in or in proximity of the intermediate image surface 321. Downstream of the multi-beamlet forming unit 305, a scanning distortion compensator array 601 according the second embodiment of the disclosure is arranged. The scanning distortion compensator array 601 is described below in more detail.

In or in proximity of the intermediate image plane 321, a static beam steering multi aperture plate 390 is arranged with a plurality of apertures with electrostatic elements, for example deflectors, to manipulate individually each of the plurality of charged particle beamlets 3. The apertures of the beam steering multi aperture plate 390 are configured with larger diameter to allow the passage of the plurality of primary charged particle beamlets 3 even in case the focus spots of the primary charged particle beamlets 3 deviate from the intermediate image plane or their lateral design position. In proximity of the intermediate image plane, a scanning compensator array 602 for compensation of a scanning induced telecentricity error according the third embodiment of the disclosure is arranged. The scanning compensator array 602 for compensation of a scanning induced telecentricity error is described below in more detail. In an example, the beam steering multi aperture plate 390 and the scanning compensator array 602 can also be formed as a single multi-aperture element.

The plurality of focus points of primary charged particle beamlets 3 passing the intermediate image surface 321 is imaged by field lens group 103 and objective lens 102 in the image plane 101, in which the investigated surface 25 of the object 7 is positioned. The object irradiation system 100 further comprises a collective multi-beam raster scanner 110 in proximity to a first beam cross over 108 by which the plurality of charged-particle beamlets 3 can be deflected in a direction perpendicular to the direction of the beam propagation direction or the optical axis 105 of the objective lens 102. In the example of FIG. 1, the optical axis 105 is parallel to the z-direction. The collective multi-beam raster scanner 110 according the first embodiment of the disclosure is optimized for a minimal scanning induced distortion for the plurality of primary charged particles passing the collective multi-beam raster scanner 110 at different propagation angles β. Details of the collective multi-beam raster scanner 110 according the first embodiment are described below. Objective lens 102 and collective multi-beam raster scanner 110 are centered at the optical axis 105 of the multi-beamlet charged-particle microscopy system 1, which is perpendicular to wafer surface 25. The wafer surface 25 arranged in the image plane 101 is then raster scanned with collective multi-beam raster scanner 110. Thereby the plurality of primary charged particle beamlets 3, forming the plurality of beam spots 5 arranged in a raster configuration, is scanned synchronously over the wafer surface 101. In an example, the raster configuration of the focus spots 5 of the plurality of primary charged particle beamlets 3 is a hexagonal raster of about hundred or more primary charged particle beamlets 3. The primary beam spots 5 have a distance about 6 μm to 151 μm and a diameter of below 5 nm, for example 3 nm, 2 nm or even below. In an example, the beam spot size is about 2 nm, and the distance between two adjacent beam spots is 8 μm. At each scan position of each of the plurality of primary beam spots 5, a plurality of secondary electrons is generated, respectively, forming the plurality of secondary electron beamlets 9 in the same raster configuration as the primary beam spots 5. The intensity of secondary charged particle beamlets generated at each beam spot 5 depends on the intensity of the impinging primary charged particle beamlet 3, illuminating the corresponding spot, and the material composition and topography of the object 7 under the beam spot 5. Secondary charged particle beamlets 9 are accelerated by an electrostatic field generated by a sample charging unit 503, and collected by objective lens 102, directed by beam splitter 400 to the detection unit 200. Detection unit 200 images the secondary electron beamlets 9 onto the image sensor 207 to form there a plurality of secondary charged particle image spots 15. The detector comprises a plurality of detector pixels or individual detectors. For each of the plurality of secondary charged particle beam spots 15, the intensity is detected separately, and the material composition of the wafer surface 25 is detected with high resolution for a large image patch with high throughput. For example, with a raster of 10×10 beamlets with 8 μm pitch, an image patch of approximately 88 μm×88 μm is generated with one image scan with collective multi-beam raster scanner 110, with an image resolution of for example 2 nm or below. For example, the image patch is sampled with half of the beam spot size, thus with a pixel number of 8000 pixels per image line for each beamlet, such that the digital data set representing the image patch generated by 100 beamlets comprises 6.4 gigapixel. The image data is collected by control unit 800. Details of the image data collection and processing, using for example parallel processing, are described in German patent application 102019000470.1 and in U.S. Pat. No. 9,536,702, which are hereby incorporated by reference.

The plurality of secondary electron beamlets 9 passes the first collective multi-beam raster scanner 110 and is scanning deflected by the first collective multi-beam raster scanner 110 and guided by beam splitter unit 400 to follow the secondary beam path 11 of the detection unit 200. The plurality of secondary electron beamlets 9 are travelling in opposite direction from the primary charged particle beamlets 3, and the beam splitter unit 400 is configured to separate the secondary beam path 11 from the primary beam path 13 usually via magnetic fields or a combination of magnetic and electrostatic fields. Optionally, additional magnetic correction elements 420 are present in the primary or in the secondary beam paths. Projection system 205 further comprises at least a second collective raster scanner 222, which is connected to projection system control unit 820. Control unit 800 is configured to compensate a residual difference in position of the plurality of focus points 15 of the plurality of secondary electron beamlets 9, such that the position of the plurality secondary electron focus spots 15 are kept constant at image sensor 207.

The projection system 205 of detection unit 200 comprises further electrostatic or magnetic lenses 208, 209, 210 and a second cross over 212 of the plurality of secondary electron beamlets 9, in which an aperture 214 is located. In an example, the aperture 214 further comprises a detector (not shown), which is connected to projection system control unit 820. Projection system control unit 820 is further connected to at least one electrostatic lens 206 and a third deflection unit 218. The projection system 205 further comprises at least a first multi-aperture corrector 220, with apertures and electrodes for individual influencing each of the plurality of secondary electron beamlets 9, and an optional further active element 216, for example a multi-pol element connected to control unit 800.

The image sensor 207 is configured by an array of sensing areas in a pattern compatible to the raster arrangement of the secondary electron beamlets 9 focused by the projecting lens 205 onto the image sensor 207. This enables a detection of each individual secondary electron beamlet 9 independent of the other secondary electron beamlets 9 incident on the image sensor 207. A plurality of electrical signals is created and converted in digital image data and processed to control unit 800. During an image scan, the control unit 800 is configured to trigger the image sensor 207 to detect in predetermined time intervals a plurality of timely resolved intensity signals from the plurality of secondary electron beamlets 9, and the digital image of an image patch is accumulated and stitched together from all scan positions of the plurality of primary charged particle beamlets 3.

The image sensor 207 illustrated in FIG. 1 can be an electron sensitive detector array such as a CMOS or a CCD sensor. Such an electron sensitive detector array can comprise an electron to photon conversion unit, such as a scintillator element or an array of scintillator elements. In an example, the image sensor 207 can be configured as electron to photon conversion unit or scintillator plate arranged in the focal plane of the plurality of secondary electron particle image spots 15. In this example, the image sensor 207 can further comprise a relay optical system for imaging and guiding the photons generated by the electron to photon conversion unit at the secondary charged particle image spots 15 on dedicated photon detection elements, such as a plurality of photomultipliers or avalanche photodiodes (not shown). Such an image sensor is disclosed in U.S. Pat. No. 9,536,702, which is cited above. In an example, the relay optical system further comprises a beam splitter for splitting and guiding the light to a first, slow light detector and a second, fast light detector. The second, fast light detector is configured for example by an array of photodiodes, such as avalanche photodiodes, which are fast enough to resolve the image signal of the plurality of secondary electron beamlets 9 according the scanning speed of the plurality of primary charged particle beamlets 3. The first, slow light detector can be a CMOS or CCD sensor, providing a high-resolution sensor data signal for monitoring the focus spots 15 or the plurality of secondary electron beamlets 9 and for control of the operation of the multi-beam charged particle microscope.

In the example, the primary charged particle source is implemented in form of an electron source 301 featuring an emitter tip and an extraction electrode. When using primary charged particles other than electrons, for example helium ions, the configuration of the primary charged-particle source 301 may be different to that shown. Primary charged-particle source 301 and active multi-aperture plate arrangement 306.1 . . . 306.3 and beam steering multi aperture plate 390 are controlled by primary beamlet control module 830, which is connected to control unit 800.

During an acquisition of an image patch by scanning the plurality of primary charged particle beamlets 3, the stage 500 is optionally not moved, and after the acquisition of an image patch, the stage 500 is moved to the next image patch to be acquired. In an alternative implementation, the stage 500 is continuously moved in a second direction while an image is acquired by scanning of the plurality of primary charged particle beamlets 3 with the collective multi-beam raster scanner 110 in a first direction. Stage movement and stage position is monitored and controlled by known sensors, such as Laser interferometers, grating interferometers, confocal micro lens arrays, or similar.

Figure 2:
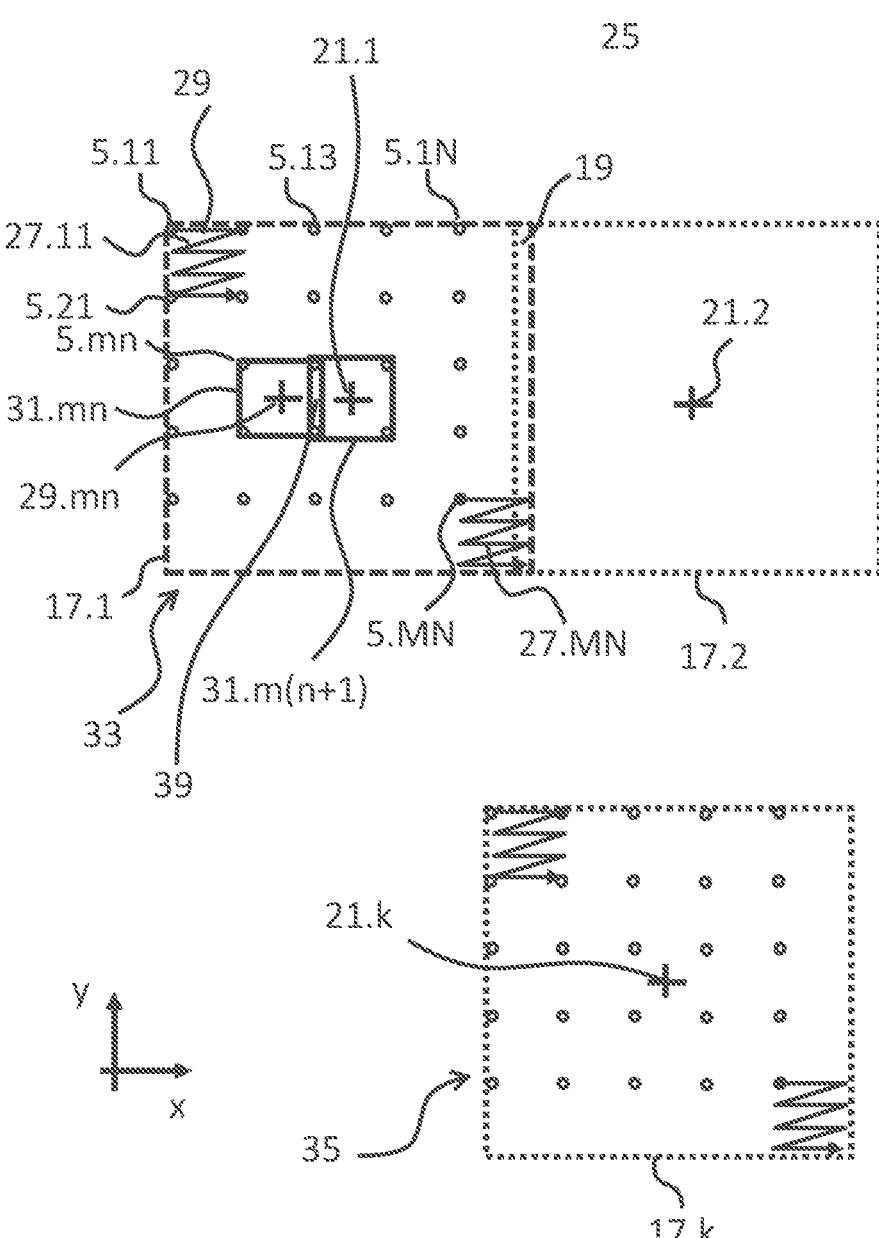
FIG. 2 is an illustration of the coordinates of a first inspection site comprising a first and a second image patch and a second inspection site.

The method of wafer inspection by acquisition of image patches is explained in more detail in FIG. 2. The wafer is placed with its wafer surface 25 in the focus plane of the plurality of primary charged particle beamlets 3, with the center 21.1 of a first image patch 17.1. The predefined position of the image patches 17.1 . . . k corresponds to inspection sites of the wafer for inspection of semiconductor features. The application is not limited to wafer surfaces 25, but is for example also applicable for lithography masks used for semiconductor fabrication. The word "wafer" shall thus not be limited to semiconductor wafers, but include general objects used for or fabricated during semiconductor fabrication.

The predefined positions of the first inspection site 33 and second inspection site 35 are loaded from an inspection file in a standard file format. The predefined first inspection site 33 is divided into several image patches, for example a first image patch 17.1 and a second image patch 17.2, and the first center position 21.1 of the first image patch 17.1 is aligned under the optical axis 105 of the multi-beam charged-particle microscopy system 1 for the first image acquisition step of the inspection task. The first center of a first image patch 21.1 is selected as the origin of a first local wafer coordinate system for acquisition of the first image patch 17.1. Methods to align the wafer 7, such that the wafer surface 25 is registered and a local coordinate system of wafer coordinates is generated, are well known.

The plurality of primary beamlets 3 is distributed in a regular raster configuration in each image patch 17.1 . . . k and is scanned by a raster scanning mechanism to generate a digital image of the image patch. In this example, the plurality of primary charged particle beamlets 3 is arranged in a rectangular raster configuration with N primary beam spots 5.11, 5.12 to 5.1N in the first line with N beam spots, and M lines with beam spots 5.11 to beam spot 5.MN. Only M=five times N=five beam spots are illustrated for simplicity, but the number of beam spots J=M times N can be larger, for example J=61 beamlets, or about 100 beamlets or more, and the plurality of beam spots 5.11 to 5.MN can have different raster configurations such as a hexagonal or a circular raster.

Each of the primary charged particle beamlet is scanned over the wafer surface 25, as illustrated at the example of primary charged particle beamlet with beam spot 5.11 and 5.MN with scan path 27.11 and scan path 27.MN. Scanning of each of the plurality of primary charged particles is performed for example in a back- and forth movement with scan paths 27.11 . . . 27.MN, and each focus point 5.11 . . . 5.MN of each primary charged particle beamlet is moved by the multi-beam scanning deflector system 110 collectively in x-direction from a start position of an image subfield line, which is in the example the most left image point of for example image subfield 31.mn. Each focus point 5.11 . . . 5.MN is then collectively scanned by scanning the primary charged particle beamlets 3 collectively to the right position, and then the collective multi-beam raster scanner 110 moves each of the plurality of charged particle beamlets in parallel to line start positions of the next lines in each respective subfield 31.11 . . . 31.MN. The movement back to line start position of a subsequent scanning line is called flyback. The plurality of primary charged particle beamlets 3 follow in parallel scan paths 27.11 to 27.MN, and thereby a plurality scanned images of the respective subfields 31.11 to 31.MN is obtained in parallel. For the image acquisition, as described above, a plurality of secondary electrons is emitted at the focus points 5.11 to 5.MN, and a plurality of secondary electron beamlets 9 is generated. The plurality of secondary electron beamlets 9 are collected by the objective lens 102, pass the first collective multi-beam raster scanner 110 and are guided to the detection unit 200 and detected by image sensor 207. A sequential stream of data of each of the plurality of secondary electron beamlets 9 is transformed synchronously with the scanning paths 27.11 . . . 27.MN in a plurality of 2D datasets, forming the digital image data of each image subfield. The plurality of digital images of the plurality of image subfields is finally stitched together by an image stitching unit to form the digital image of the first image patch 17.1. Each image subfield is configured with small overlap area with adjacent image subfield, as illustrated by overlap area 39 of subfield 31.mn and subfield 31.m(n+1).

Next, the desired properties or specifications of a wafer inspection task are illustrated. For a high throughput wafer inspection, the time for image acquisition of each image patch 17.1 . . . k including the time used for image post-processing is fast. On the other hand, tight specifications of image qualities such as the image resolution, image accuracy and repeatability is maintained. For example, the desired image resolution is typically 2 nm or below, and with high repeatability. Image accuracy is also called image fidelity. For example, the edge position of features, in general the absolute position accuracy of features is to be determined with high absolute precision. Typically, the desired position accuracy is about 50% of the desired resolution or even less. For example, measurement tasks involve an absolute precision of the dimension of semiconductor features with an accuracy below 1 nm, below 0.3 nm or even 0.1 nm. Therefore, a lateral position accuracy of each of the focus spots 5 of the plurality of primary charged particle beamlets 3 is below 1 nm, for example below 0.3 nm or even below 0.1 nm. Under high image repeatability it is understood that under repeated image acquisition of the same area, a first and a second, repeated digital image are generated, and that the difference between the first and second, repeated digital image is below a predetermined threshold. For example, the difference in image distortion between first and second, repeated digital image is below 1 nm, for example 0.3 nm or even such as below 0.1 nm, and the image contrast difference is below 10%. In this way a similar image result is obtained even by repetition of imaging operations. This is important for example for an image acquisition and comparison of similar semiconductor structures in different wafer dies or for comparison of obtained images to representative images obtained from an image simulation from CAD data or from a database or reference images.

One of the desired properties or specifications of a wafer inspection task is throughput. The measured area per acquisition time is determined by the dwell time, resolution and the number of beamlets. Typical examples of dwell times are between 20 ns and 80 ns. The pixel rate at the fast image sensor 207 is therefore in a range between 12 Mhz and 50 MHz and each minute, about 15 to 20 image patches or frames could be obtained. For 100 beamlets, typical examples of throughput in a high-resolution mode with a pixel size of 0.5 nm is about 0.045 sqmm/min (square-millimeter per minute), and with larger number of beamlets, for example 10000 beamlets and 25 ns dwell time, a throughput of more than 7 sqmm/min is possible. However, in certain known systems the desired digital image processing limits the throughput significantly. For example, a known digital compensation of a scanning distortion can be very time consuming and therefore unwanted. In the embodiments of the disclosure, the desired properties for image postprocessing are reduced and throughput of a measurement task with high precision is enhanced. The embodiments of the disclosure enable the high throughput of a wafer inspection task while maintaining the image performance specification well within the desired properties described above.

Figure 3:
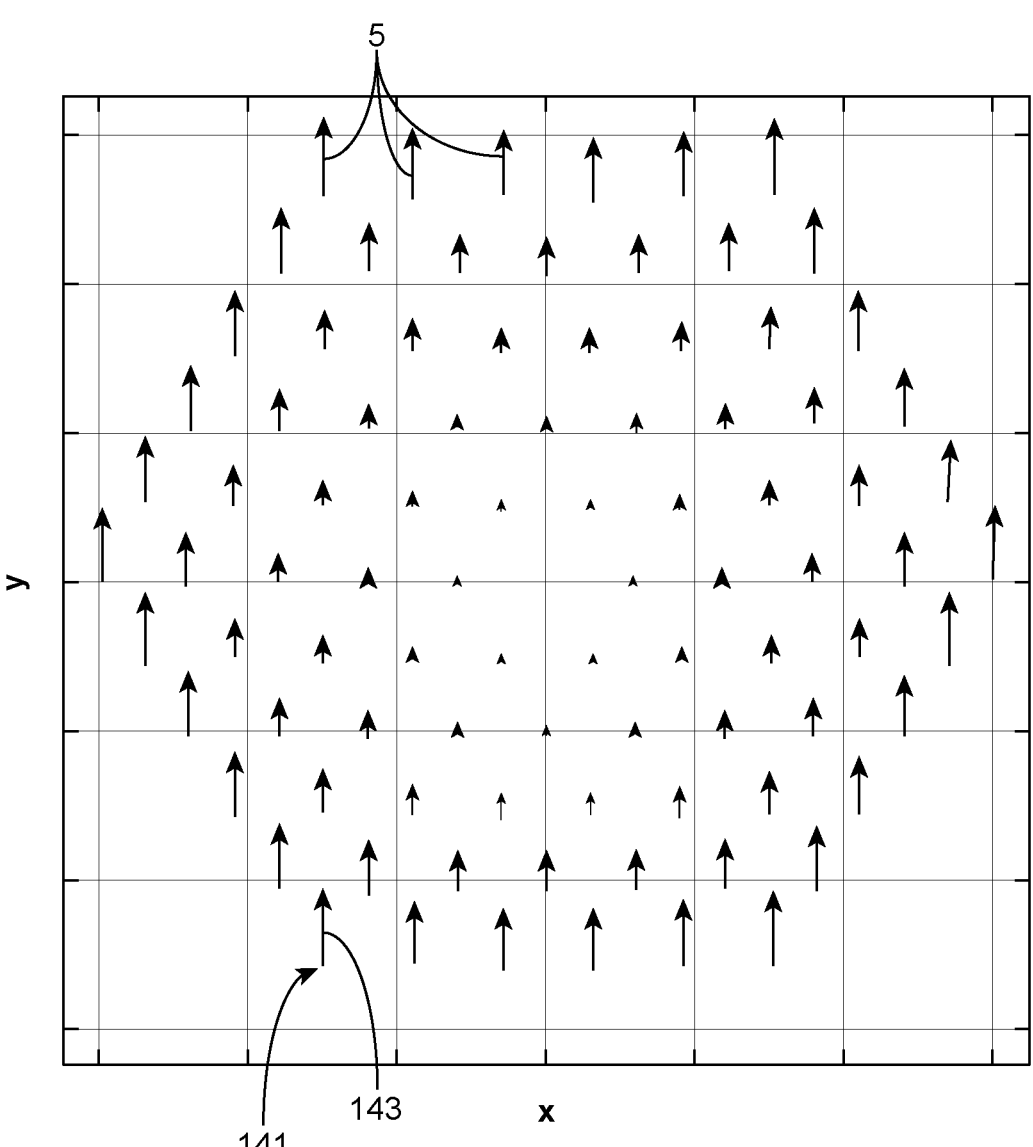
FIG. 3 is an illustration of a static distortion offset of the plurality of primary charged particle beamlets.

The imaging performance of a charged particle microscope 1 is limited by design and higher order aberrations of the electrostatic or magnetic elements of the object irradiation unit 100, as well as fabrication tolerances of for example the primary multi-beamlet-forming unit 305. The imaging performance is limited by aberrations such as for example distortion, focus aberration, telecentricity and astigmatism of the plurality of charged particle beamlets. FIG. 3 illustrates at an example a typical static distortion aberration of a plurality of primary charged particle beamlets 3 in the image plane 101. The plurality of primary charged particle beamlets 3 is focused in the image plane to form a plurality of primary charged particle beam spots 5 (three are indicated) in a raster configuration, in this example in a hexagonal raster. In an ideal system, with the collective multi-beam raster scanner 110 switched off, each of the beam spots 5 is formed at the center position 29.*mn* (see FIG. 2) of a corresponding image subfield 31.*mn* (with index m for the line number and n for the column number). In a real system, however, the beam spots 5 are formed at slightly deviating positions, which deviate from the ideal positions on the ideal raster such as illustrated by the static distortion vectors in FIG. 3. For the illustrated example of the primary beam spot 141, the deviation from the ideal position on the hexagonal raster is described by distortion vector 143. The distortion vectors give the lateral differences [dx, dy] from the ideal positions and the maximum absolute value of distortion vectors can be in range of several nm, for example above 1 nm, 2 nm or even above 5 nm. Typically, the static distortion vectors of a real system are measured and compensated by an array of static deflection elements such as any of the active multi-aperture plate arrangements 306.2. In addition, drifts or a dynamic change of the static distortion is considered and compensated, as described in German patent application No. 102020206739.2, filed on May 28, 2020, which is incorporated by reference. The control and compensation of aberrations is achieved by a monitoring or detection system and a control loop capable of driving compensators for example several times during an image scan, such that aberrations of the multi-beam charged particle microscope 1 are compensated.

However, the imaging performance of a charged particle microscope is not only limited by the design aberrations and drift aberrations of the electrostatic or magnetic elements of the object irradiation unit 100, but in particular also by the first collective multi-beam raster scanner 110. Deflection scanning systems and their properties have been investigated in great depth for single beam microscopes. However, for multi-beam microscopes, conventional deflection scanning system for scanning deflection of a plurality of charged particle beamlets exhibits an intrinsic property which is believed to have been previously undisclosed. The intrinsic property is illustrated at the beam path through a deflection scanner in FIG. 4 in more detail.

Figure 4A:
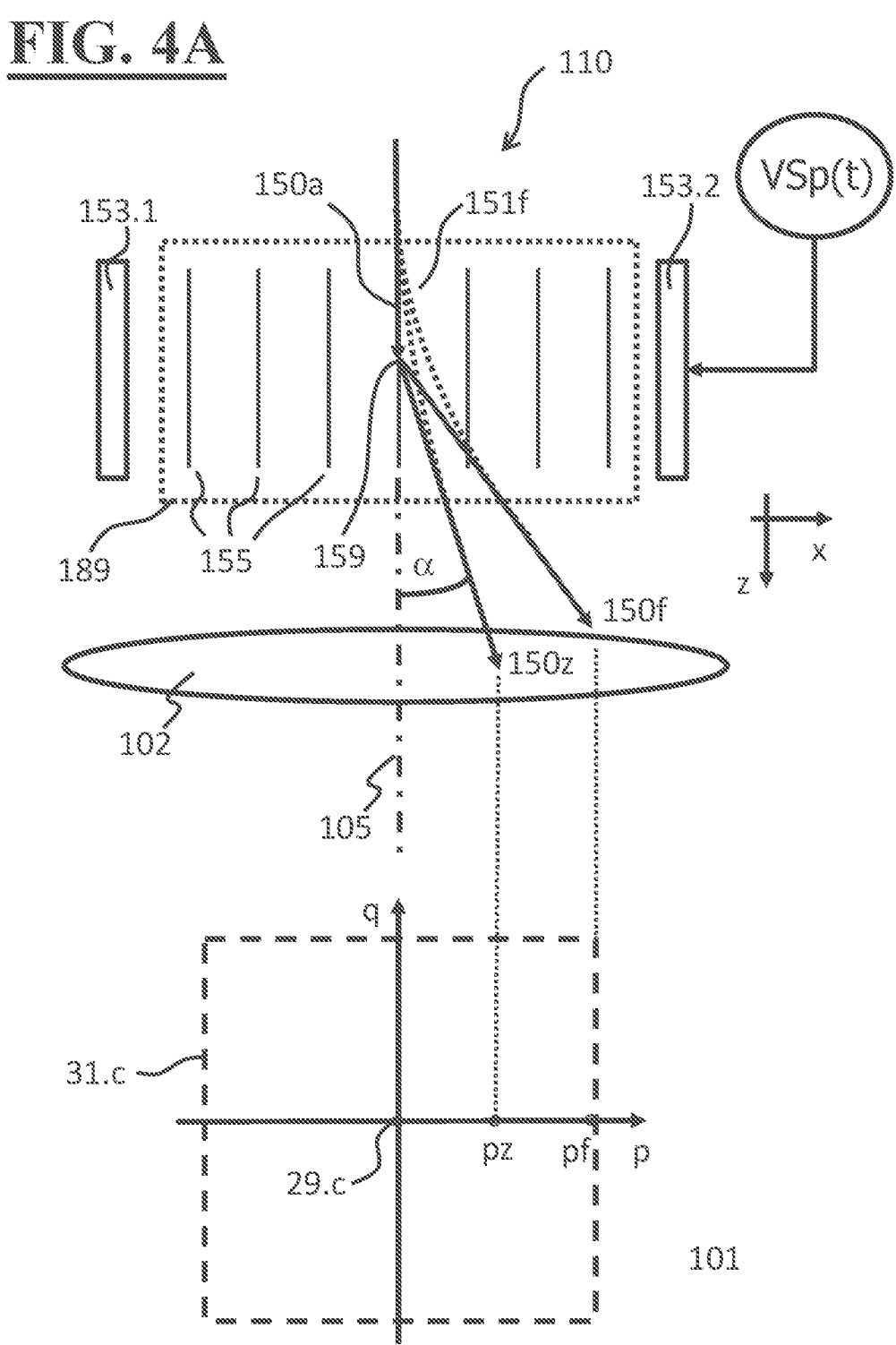
FIGS. 4A and 4B illustrate a scanning deflection at a scanning deflector (a) for an axial beamlet and (b) with scanning induced distortion for an off axis beamlet with propagation angle β.

FIG. 4A illustrates a beam path of a single primary charged particle beam through a scanning deflector 110 of the prior art with deflector electrodes 153.1 and 153.2 and a voltage supply. For sake of simplicity, only the deflection scanner electrodes for raster scanning deflection in the first direction are illustrated. During use, a scanning deflection voltage difference VSp(t) is applied and an electrostatic field is formed with equipotential lines 155 between the electrodes 153.1 and 153.2. An axial charged particle beamlet 150*a*, corresponding to an image patch 31.*c* with image patch center 29.*c* coincident with the optical axis 105, is deflected by the electrostatic field and passes the intersection volume 189 between the deflector electrodes 153.1 and 153.2 along real beam path 151*f*. The beam trajectory can be approximated by first order beam-paths 150*a* and 150*f* with a single virtual deflection at pivot point 159. The charge particle beamlet travelling along path 150*z* is focused by objective lens 102 in the object plane 101, illustrated in the lower part of FIG. 4A. The subfield coordinates are given in relative coordinates (p,q) relative to the center point 29.*c* of the subfield 31.*c*.

For a maximum deflection to a maximum subfield point at coordinate $p_f$, a maximum voltage difference of $VSp_{max}$ is applied, and for deflection of the incident beamlet 150*a* to a subfield point at distance $p_z$, a corresponding voltage VSp is applied, and the incident beamlet 150*a* is deflected by deflection angle α in direction of beam path 150*z*. Nonlinearities of the deflector are compensated by determining the functional dependency of the deflection angle α and the deflector voltage difference VSp. By calibration of the functional dependency VSp(sin(a)), an almost ideal scanner for a single primary charged particle beamlet is achieved, with a single common pivot point 159 for deflection scanning of a single charged particle beamlet. It is noted that the lateral displacement (p,q) of a beam spot position in the image plane is proportional to the focal length f of the objective lens 102 multiplied by the sin(α). For example of the zonal field point, $p_z = f \sin(\alpha_z)$. For small angles α, the function sin(α) is typically approximated by α. As will be described in more detail below, despite the fact that a scanning induced distortion can be minimized for a single beam microscope, nevertheless other scanning induced aberrations such as astigmatism, defocus, coma or spherical aberration can deteriorate the resolution of a charged particle microscope with increasing field size. In addition, with increasing field size, a deviation from the virtual pivot point 159 becomes more and more significant.

Figure 4B:
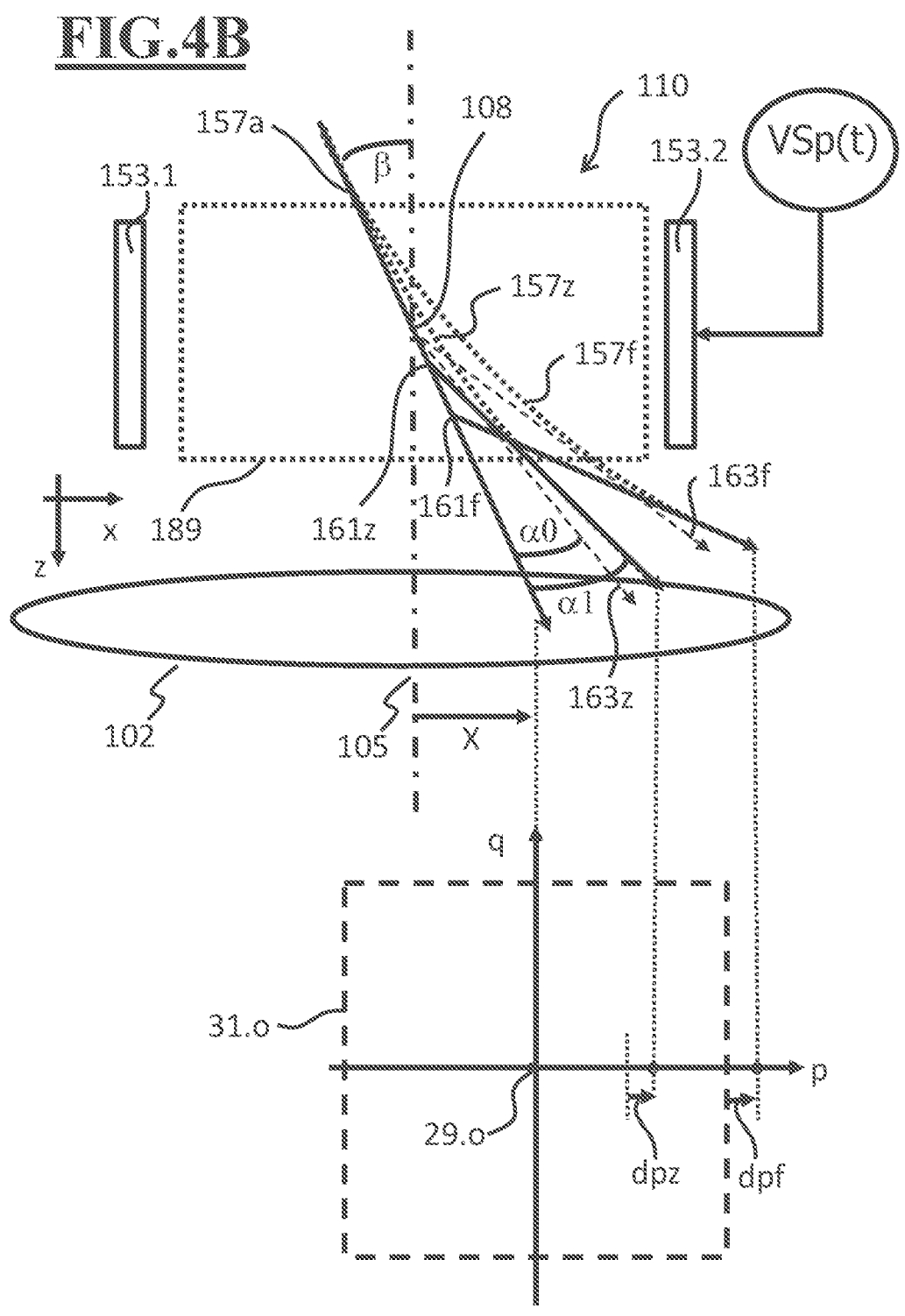

In a multi-beam system, a plurality of charged particle beamlets is scanned in parallel with the same deflection scanner and the same voltage differences according the functional dependency VSp(sin(α)). In FIG. 4B, the cross over 108 of the plurality of primary charged particle beamlets is coincident with the virtual pivot point 159 of the axial primary beamlet 150*a*, and each of the charged particle beamlets pass the electrostatic field at different angles. A charged particle beamlet 157*a* with angle of incidence of β is illustrated, with corresponding subfield 31.*o* with center of image subfield 29.*o*. The angle β is related to the distance X of the center coordinate 29.*o* to the optical axis 105 by sin(β)=X/f, with the focal length f of the objective lens 102. With deflection scanner 110 switched off (VSp(t)=0V), the beamlet traverses the path 157*a* and is focused by objective lens 102 to the center point 29.*o* of the subfield 31.*o*. However, if a voltage difference is applied, despite the fact that the deflection scanner is approximately ideal for an axial beamlet as illustrated in FIG. 4A, it is not ideal for a field beamlet under angle of incidence β. Due to the finite thickness of the deflection field, the path lengths through the electrostatic field are different for each incident beamlet of different angle of incidence β, and the real beam-paths 157*z* and 157*f* deviate from ideal beam-paths of first order 163*z* and 163*f*. This is illustrated for beam-paths for the two subfield points with coordinates $p_z$ and $p_f$ with real beam-paths 157*z* and 157*f*. The angles of the real beam-paths 157*z* and 157*f* deviate from the angles of the ideal beam paths 163*z* and 163*f*, and each beam is virtually deflected at a different virtual pivot point 161*z* and 161*f* deviating from the beam cross over 108. For example, if voltage VSp(sin(α_o)) is applied, the primary charged particle beamlet 157*a* is deflected by angle α1 instead of angle α0 and follows beam-path 157*z* with a virtual deflection point 161*z*. The charge particle beam spot is therefore distorted by local distortion vector dpz.

The deviation of deflection angles increases with increasing angle of incidence 3, and an increasing scanning induced distortion is generated by the collective multi-beam raster scanner 110. In a first embodiment of the disclosure, the scanning induced distortion is reduced by a modified design and operation of the collective multi-beam raster scanner 110. In a second embodiment of the disclosure, a first multi-beam scanning correction system 601 is provided and residual scanning induced distortion is further reduced.

Figure 5:
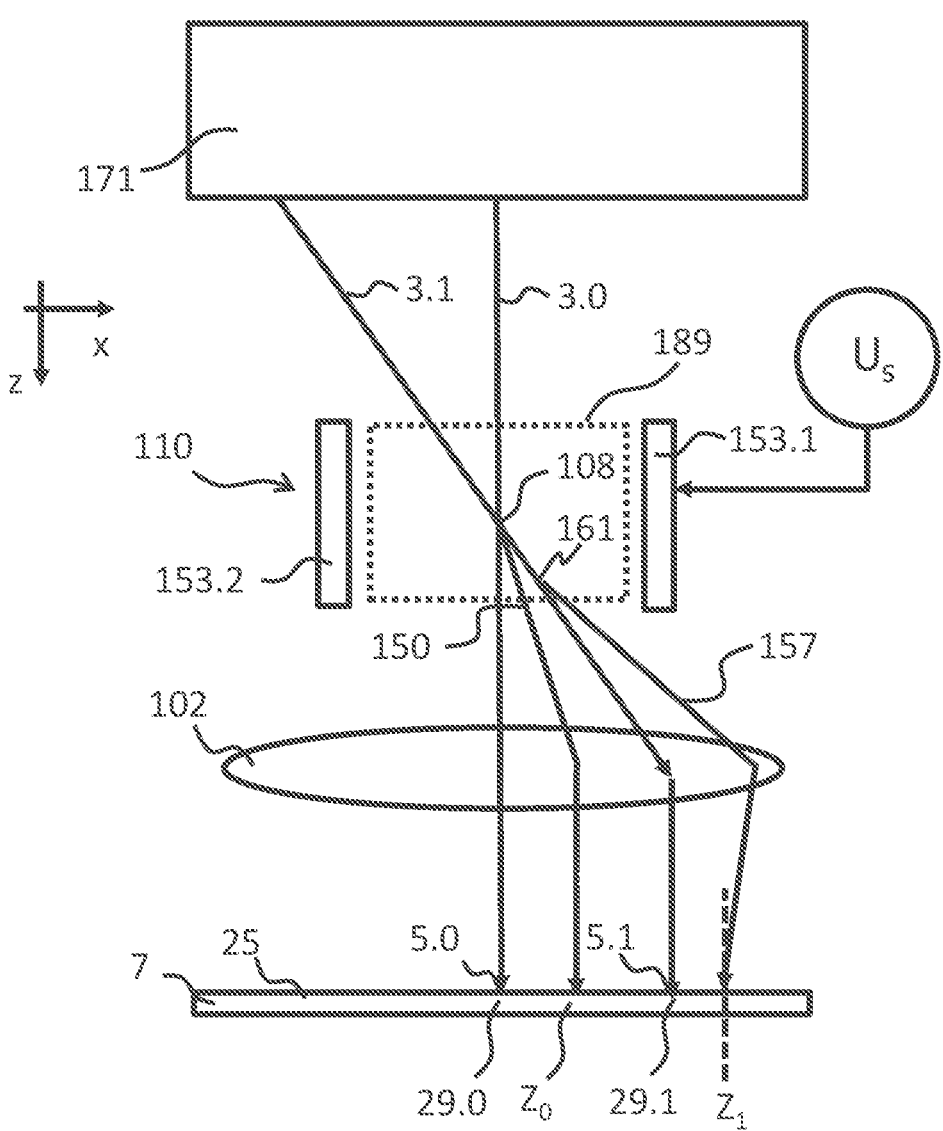
FIG. 5 is an illustration of a scanning induced telecentricity aberration for an off axis beamlet with propagation angle β.

The differences of the deflection angles α generate a scanning induced distortion, the differences in the position of the virtual pivot point are the cause for scanning induced telecentricity aberrations. FIG. 5 illustrates simplified the system 171 upfront the scanning collective multi-beam raster scanner 110, from which a plurality of primary charged particles is incident on the first collective multi-beam raster scanner 110. The plurality of charged particle beamlets is illustrated by two beamlets including an axial charged particle beamlet 3.0 and an off axis beamlet 3.1, which pass the intersection volume 189 of the raster scanner 110 and are focused by objective lens 102 to form a plurality of focus points, illustrated by focus points 5.0 and 5.1 on a surface 25 of a wafer 7. When the raster scanner 110 is in an off state and no voltage difference VSp is applied to the electrodes 153, the beam spots 5.0 and 5.1 are at the center points 29.0 and 29.1 of the respective image subfields. If a voltage difference $VSp(\sin(\alpha_0))$ is applied, the beamlet 3.0 follows the ideal path 150 and is deflected to zonal field point $Z_0$. In the linear representation of FIG. 5, beamlet 3.0 appears to be deflected at the beam cross over 108 corresponding to the virtual pivot point 159 of FIG. 4A. Therefore, beamlet 3.0 illuminates the wafer surface 25 at the same angle of incidence as at center position 29.0. The off axis beamlet 3.1 is deflected to the corresponding zonal field point $Z_1$ of the corresponding image subfield. Off axis beamlet 3.1 appears to be deflected along representative beam-path 157 at virtual deflection point 161, deviating from the beam cross over 108. Therefore, the telecentricity angle of the beamlet 3.1 at scanning position for the zonal field point $Z_1$ deviates from the telecentricity angle at the central field 29.1, corresponding to a scanning induced telecentricity aberration for beamlet 3.1 in addition to the distortion described above. In a third embodiment of the disclosure, scanning induced telecentricity aberration is reduced by a second multibeam scanning correction system 602.

Figure 6:
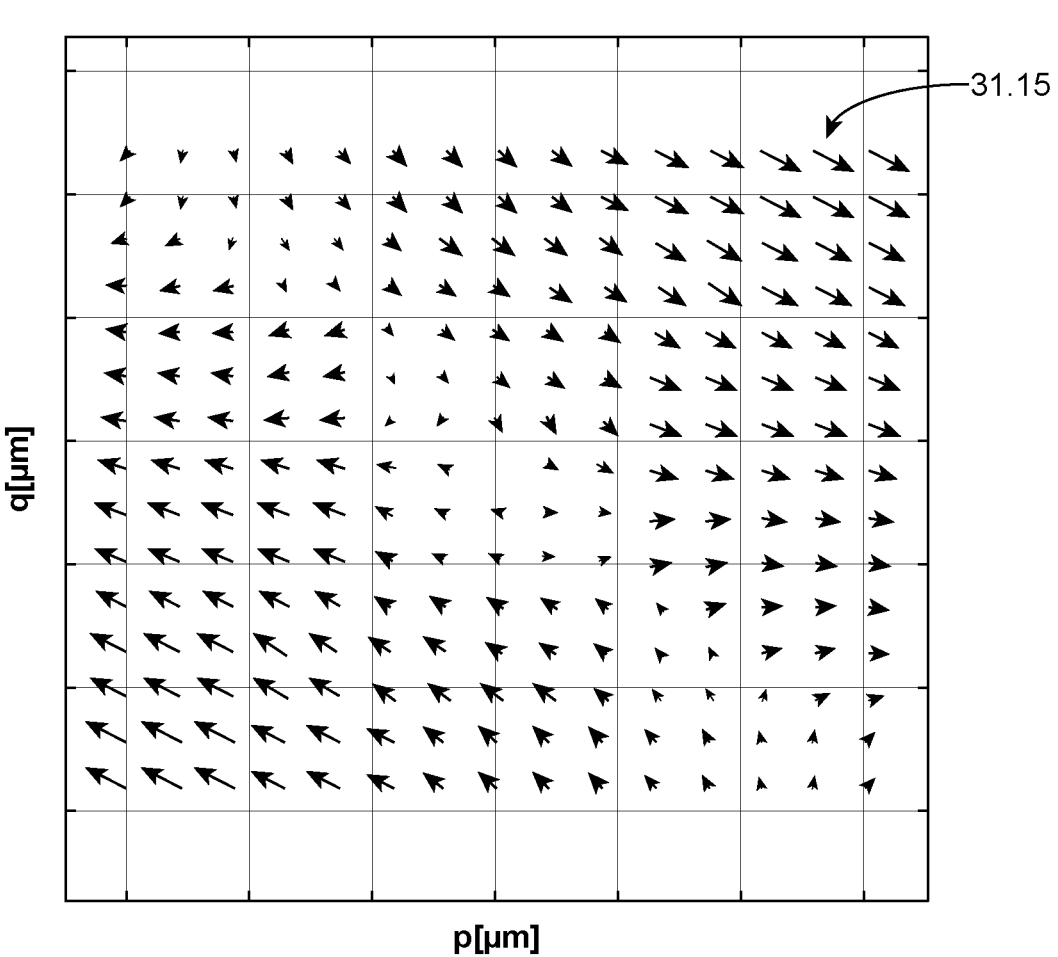
FIG. 6 is an illustration of a typical scanning induced distortion of single beamlet during scanning over an image subfield with image subfield coordinates (p,q); a) scanning distortion vectors dp, dq; b) amplitude of scanning distortion.

The deviation of the focus positions at the scan positions of each of the plurality of charged particle beamlets 3 is described by a scanning distortion vector field for each image subfield 31.11 to 31.MN. FIG. 6 illustrates the scanning distortion at the example of the image subfield 31.15 (see FIG. 7). Throughout the disclosure, the image subfield coordinates (p,q) relative to the respective center of each image subfield 31._mn_ are used, and the scanning distortion is described by vector [dp,dq] as a function of image subfield coordinates (p,q) for each individual image subfield 31._mn_. The center position (p,q)=(0,0) of each image subfield is described in (x,y)-coordinates with respect to the optical axis 105. Each image center coordinate can be distorted from a predetermined ideal raster configuration by a static offset (dx,dy) as a function of (x,y)-coordinates, as illustrated in FIG. 3. The static distortion is typically compensated by static multi aperture plate 306.2, and not considered in the scanning distortion [dp,dq]. Since the scanning distortion is different in each image subfield 31.11 . . . 31.MN, the scanning distortion is generally described by a four-dimensional scanning distortion vector $[dp,dq]=[dp,dq](p,q; x_{ij},y_{ij})$ with the local image subfield coordinates (p,q) and the discrete center coordinates of image subfields $(x_{ij},y_{ij})$.

FIG. 6 shows the scanning distortion vectors [dp,dq] over the image subfield 31.15. In this example, the maximum scanning distortion is at the maximum image subfield coordinate p=q=6 μm with the scanning distortion vector [dp, dq]=[2.7 nm, −1.6 nm]. The length of the maximum scanning distortion vector in this image subfield is 3.5 nm. Typical maximum scanning distortion aberrations in the image subfields are in the range of 1 nm to 4 nm, but may even exceed 5 nm.

Figure 7:
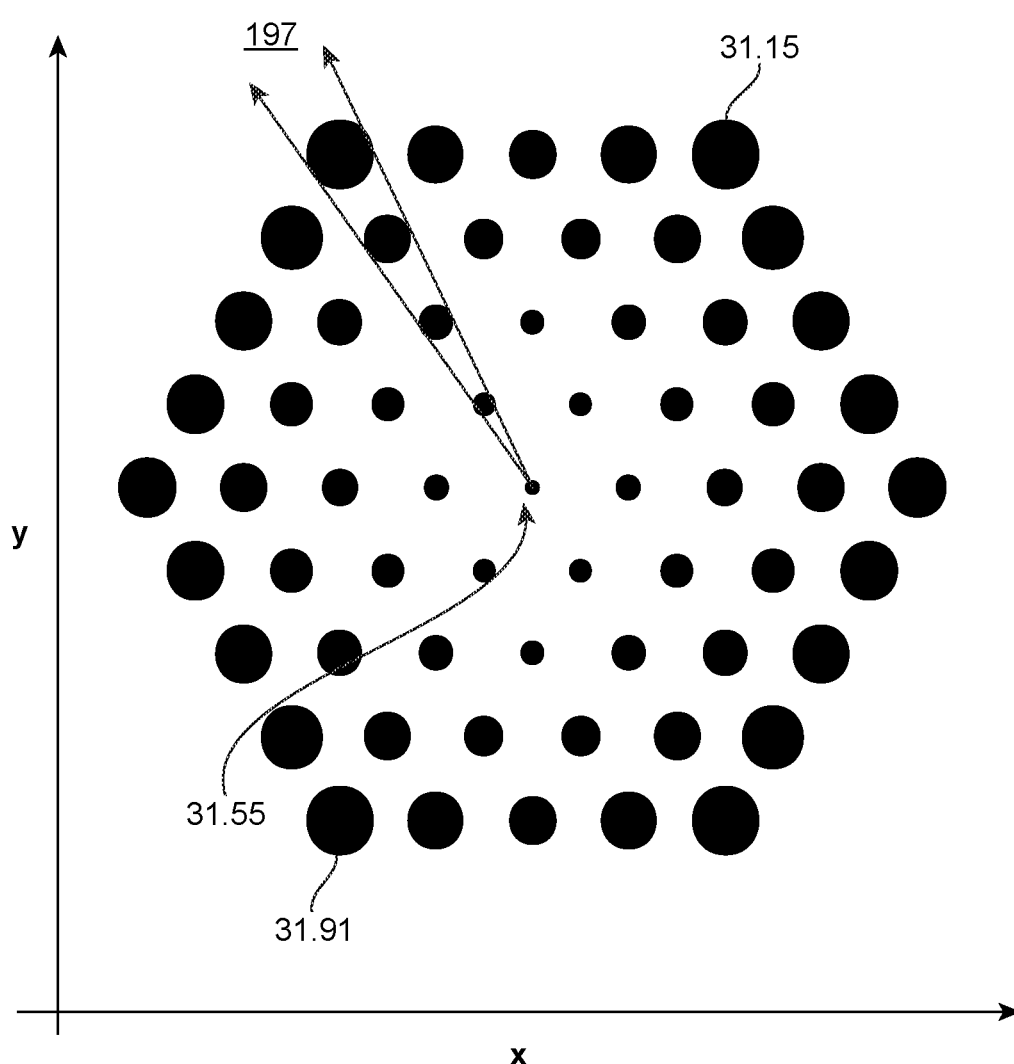
FIG. 7 is an illustration of the maximum scanning distortion vectors for each image subfield for a plurality of primary charged particle beamlets with image subfield center coordinates $x_{ij}$, $y_{ij}$.

FIG. 7 illustrates the maximum scanning distortion of each image subfield 31.11 to 31.MN at the example of a perfectly aligned conventional multi-beam charged particle microscope with a plurality of J=61 primary charged particle beamlets in a hexagonal raster configuration. The maximum scanning distortion for each image subfield is illustrated by the area of circles. The maximum scanning distortion of the image subfield 31.55 on the optical axis of the multi-beam charged particle microscope is small or almost zero. The maximum scanning distortion increases with increasing distance of the image subfield to the optical axis and reaches the maximum of all maximum scanning distortions at the image subfields 31.15 or 31.91 with maximum distance to the optical axis and therefore largest propagation angle β with respect to the optical axis 105 at the beam cross over 108. The area of the circles is representing the maximum of the scanning distortion of each subfield, the diameter of the circles is linear increasing with the distance of the image subfield center from the optical axis, as illustrated by lines 197. In the example, the scanning distortion has a dominating fraction which is in linear dependency from subfield coordinate (p,q) and in quadratic dependency from image subfield center position (x,y).

In the example in FIG. 7, the collective multi-beam raster scanner 110 is configured for a reduced scanning induced distortion for the axial beamlet of center subfield 31.55 and a maximum scanning induced distortion of the subfields corresponding to primary beamlets with a large angle of incidence β to the intersection volume. In an example of the disclosure, the scanning deflection voltages VSp(t) and VSq(t) for the collective multi-beam raster scanner 110 are configured in order to minimize the maximum scanning induced distortion at the expense of the scanning induced distortion of the axial beamlet, such that the axial beamlet of center subfield 31.55 shows some scanning induced distortion, but the maximum scanning induced distortion is reduced from for example 5 nm to below 3 nm.

In a first embodiment of the disclosure, the scanning imaging aberrations including the scanning distortion of a multi-beam charged particle microscope 1 are reduced by an improved design of collective multi-beam raster scanner 110. The improved collective multi-beam raster scanner 110 according the first embodiment minimizes the scanning distortion by generating a transversally optimized electrostatic deflection field, such that during operation, primary beamlets incident and propagating through the electrostatic field at different angles β are deflected by corrected deflection angles c and appear to be deflected at a common virtual pivot point corresponding to the beam cross over of the plurality of primary charged particle beamlets 3. The modified collective multi-beam raster scanner 110 comprises a set of deflection electrodes with an optimized physical design of the deflection electrodes and a set of correction electrodes for dynamically adjusting the electrostatic deflection field during scanning deflection of the plurality of primary charged particle beamlets. In an example, the set of correction electrodes comprises a correction electrode arranged between two deflection electrodes. In an example, set of correction electrodes comprises at least one correction electrode arranged upstream or downstream of at least one of the deflection electrodes in direction of propagation of the primary charged particle beamlets. In the first embodiment, the scanning imaging aberrations including the scanning distortion of a multi-beam charged particle microscope are reduced by an optimized multi-beam deflection scanner design, in which aberrations of the deflection system 110 and additional scanning aberrations of the charged particle microscope, for example of the objective lens 102, are compensated.

Figure 8A:
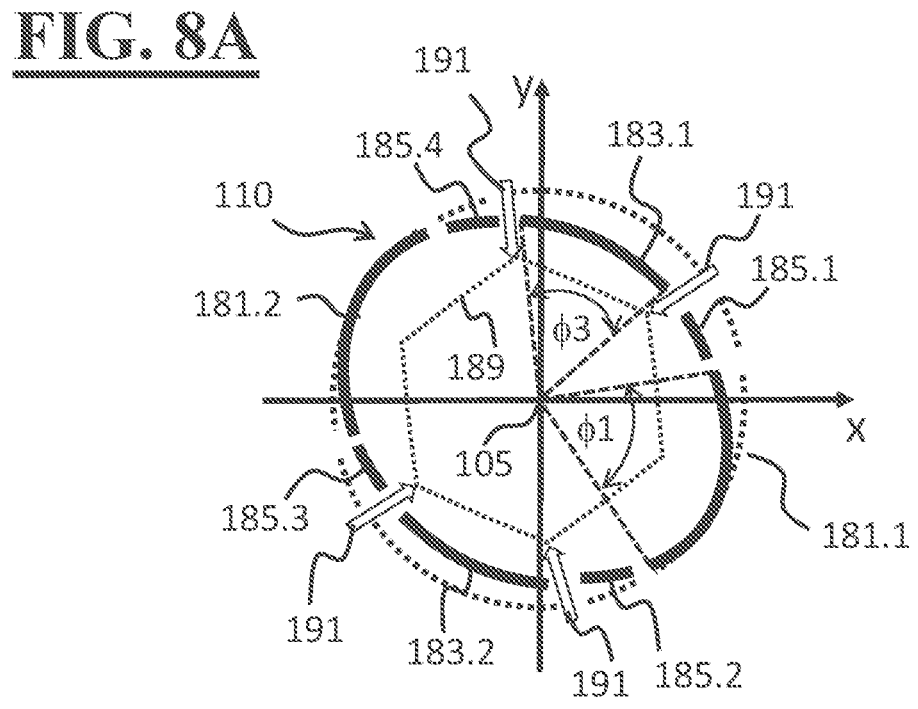
FIGS. 8A and 8B illustrate two examples of deflection electrodes and correction electrodes of a collective multi-beam raster scanner for generation of an inhomogeneous electrostatic deflection field inside an intersection volume of a plurality of primary charged particle beamlets.

FIG. 8A shows a first example of the first embodiment. A set of scanning deflection electrodes comprises first deflection electrodes 181.1 and 181.2 for scanning deflection of the plurality of primary charged particle beamlets in a first direction, and second set of deflection electrodes 183.1 and 183.2 for scanning deflection of the plurality of primary charged particle beamlets in a second direction. A design of the set of deflection electrodes optimized for the generation of a homogeneous deflection field is for example described for a single electron beam system in DESIGN OF A NON-EQUISECTORED 20-ELECTRODE DEFLECTOR FOR E-BEAM LITHOGRAPHY USING A FIELD EMISSION ELECTRON BEAM by E. R. Weidlich, Microelectronic Engineering Vol. 11, p. 347-350 (1990), which is incorporated by reference. The plurality of primary charged particle beamlets are arranged in a hexagonal raster configuration and each beamlet has a different propagation angle ($\beta_x, \beta_y$) through the collective multi-beam raster scanner 110 corresponding to the position in the hexagonal raster. The cross section of intersection volume 189 of the plurality of primary charged particle beamlets is therefore approximately of hexagonal shape. To compensate a rotation of the plurality of primary charged particle beamlets by the magnetic objective lens 102, the set of deflection electrodes 181 and 183 and the intersection volume 189 are rotated with respect to the global x-y-coordinate system. The maximum areas of the scanning distortion illustrated in FIG. 7 are indicated by arrows 191. The modified deflection scanner design comprises a configuration of the set of deflection electrodes deviating from a circular shape (dotted lines). In the example, the deflection electrodes are arranged in an elliptical shape, with a closer distance of the deflection electrode to the intersection volume 189 in direction of the areas of maximum scanning distortion indicated by arrows 191. In the example, the deflection electrodes have different azimuthal extension. The deflection electrodes 183.1 and 183.2 for deflection scanning in the second direction have a different azimuthal extension $\phi 3$ compared to the deflection electrodes 181.1 and 181.2 for deflection scanning in the first direction with azimuthal extension $\phi 1$.

In addition, a set of correction electrodes 185 comprising electrodes 185.1, 185.2, 185.3, 185.4 is arranged outside the intersection volume 189 and in sequence between the set of deflection electrodes. During use, a plurality of correction voltage differences VC(i=1 . . . 4,t) is applied to the correction electrodes synchronized with the scanning voltage differences VSp(t) and VSq(t) to the set of deflection electrodes. During use, the correction electrodes 185 generate a variable correction deflection field, which is added to the deflection field generated by the set of deflection electrodes 181 and 183. The set of correction electrodes is configured to generate during use a correction field, which acts especially on the beamlets of maximum propagation angle in the corners of the hexagonal raster configuration during scanning. During scanning, the correction voltage differences VC(i=1 . . . 4,t) are varied according the scanning distortion as for example illustrated at FIG. 6. Thereby, the scanning distortion is reduced during an image scan.

Figure 8B:
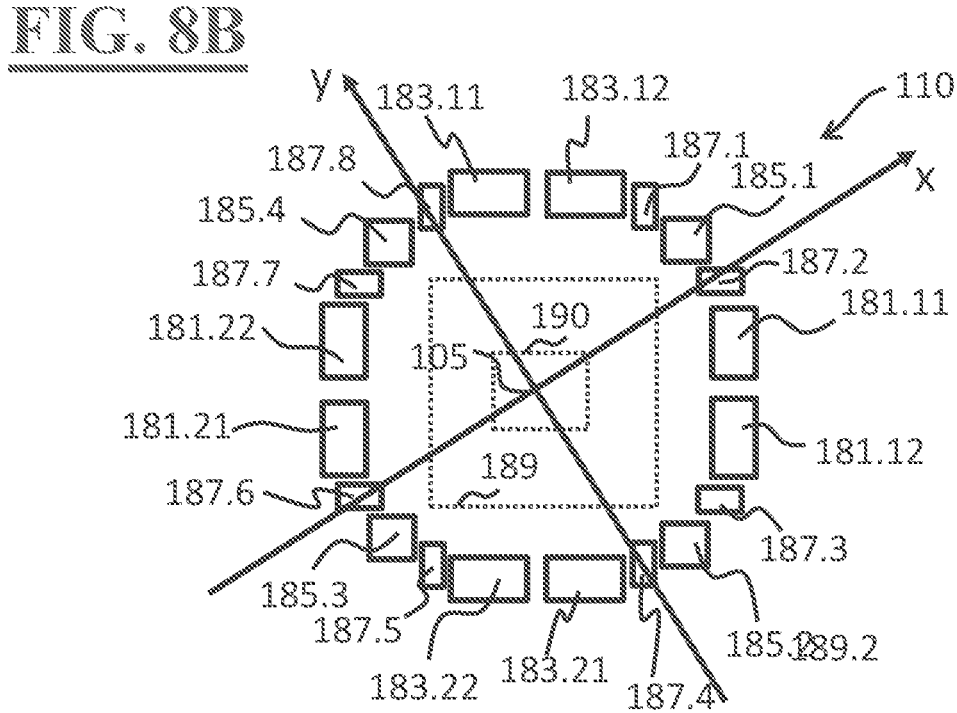

FIG. 8B illustrates a second example of the first embodiment, in which the modified collective multi-beam raster scanner 110 is adapted to the symmetry of the raster configuration. In this example, the plurality of primary charged particle beamlets is arranged in a cartesian or rectangular raster configuration with corresponding angles $\beta_x$, $\beta_y$, and the cross section of the intersection volume 189 has approximately the form of a rectangle. As in FIG. 8A, the deflector system 110 of FIG. 8B is rotated with respect to the global coordinate system (x,y) to pre-compensate the rotation by the objective lens 102 (see FIG. 1) arranged downstream of the collective multi-beam raster scanner 110. The set of deflection electrodes 181 and 183 for generating the deflection field for scanning deflection of the plurality of primary charged particle beamlets is arranged in a rectangular shape, including the deflection electrodes 181.11, 181.12, 181.21 and 181.22 for deflection or raster scanning in a first direction, and deflection electrodes 183.11, 183.12, 183.21 and 183.22 for deflection or raster scanning in a second direction. The collective multi-beam raster scanner 110 further comprises a first set of correction electrodes 185, comprising first correction electrodes 185.1 to 185.4, arranged in proximity of the beamlets of maximum propagation angle. The first set of correction electrodes 185 is configured to locally add an inhomogeneous correction field, which acts especially on the primary charged particle beamlets with large angles and therefore large scanning induced distortion. Next, the collective multi-beam raster scanner 110 further includes a second set of correction electrodes 187.1 to 187.8, arranged in between each pair of deflection electrodes 181 or 183 and first correction electrodes 185. With the second set of correction electrodes, additional degrees of freedom of correction field generation are provided, for example to control the coverage of the inhomogeneous correction field generated by the first set of correction electrodes.

In this example, each deflection electrode for generating the deflection field during image scanning is configured as a pair of deflection electrodes, for example the first pair of deflection electrodes 181.11 and 181.12 and the second pair of deflection electrodes 181.21 and 181.22 for scanning deflection in the first direction. By configuration of a deflection electrode by a pair of two or more electrodes, further degrees of freedom are provided. For example, during image scan in the first direction with the deflection electrodes 181.11 to 181.22, a variable inhomogeneous scanning deflection field can be generated, which is homogeneous in the center area of the intersection volume 190, but has a predetermined variable inhomogeneity for the beamlets of large propagation angle $\beta$ through the area 189. In addition, during image scan in the second direction with the deflection electrodes 183.11 to 183.22, a predetermined variable inhomogeneous scanning correction field in direction of the first scanning direction can be generated by the deflection electrodes 181.11 to 181.22 synchronous to the scanning deflection in the second direction, and for example a scanning distortion of the form of an image rotation for beamlets with a larger propagation angle can be compensated. In addition, with the further degrees of freedom, for example fabrication tolerances of a real collective multi-beam raster scanner 110 can be compensated.

Figures 9A, 9B:
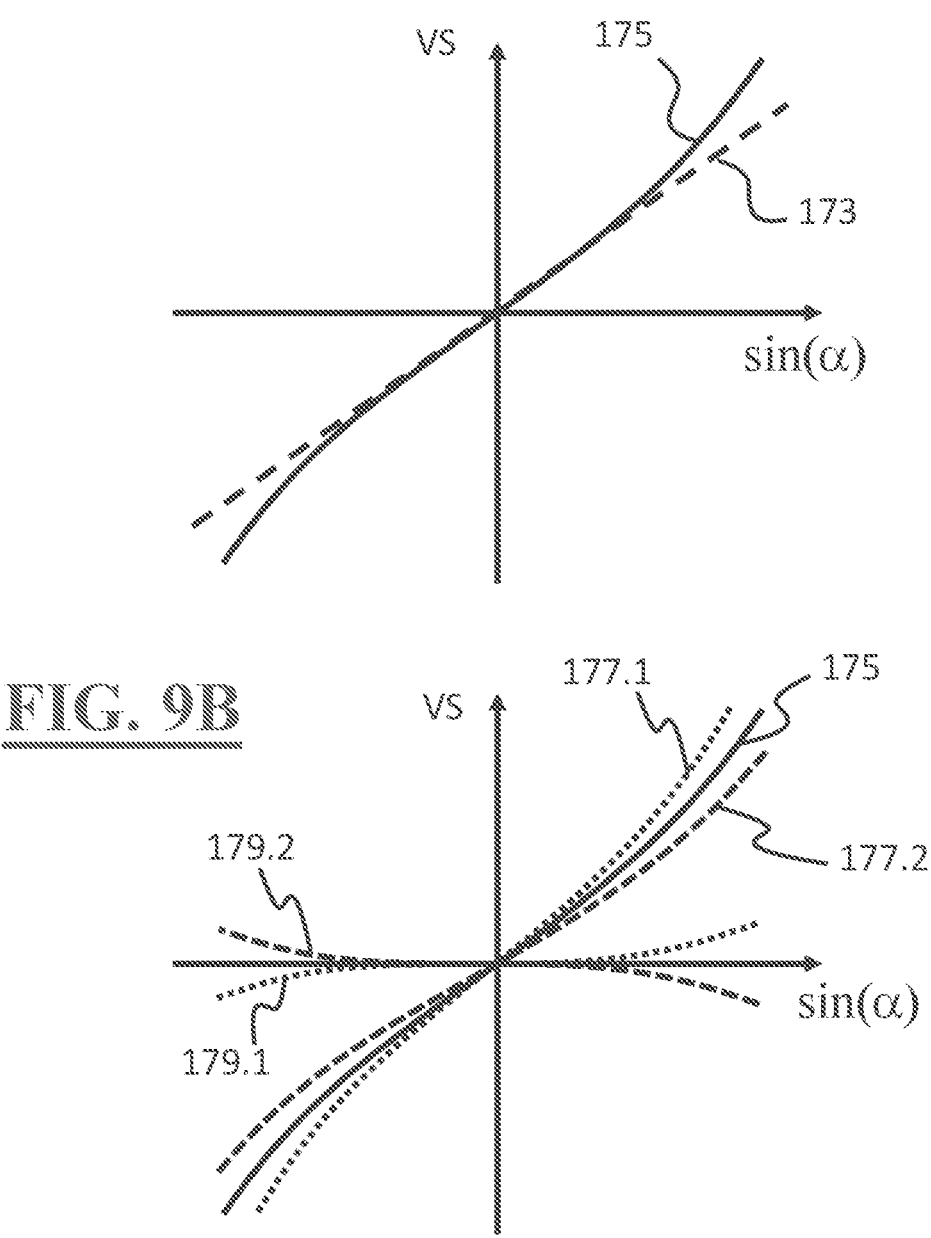
FIGS. 9A and 9B illustrate voltage difference in dependence of scanning angle α for scanning deflection; a) for a single deflection electrode; b) for a deflection electrode configured by two individual electrodes.

FIGS. 9A-9B illustrate an aspect of the modified deflection scanner according FIG. 8B, wherein the deflection scanner performance is optimized by a modified selection of voltage differences to the pairs of deflection electrodes of the collective multi-beam raster scanner 110. In the example, the deflection electrodes 181 for deflection scanning in a first direction comprises a first pair of deflection electrodes 181.11 and 181.12 and a second pair of deflection electrodes 181.21 and 181.22. In FIG. 9A, the used voltage difference as a function of deflection angle VSp(sin α) of a deflection scanner with single deflection electrodes is illustrated. The graph illustrates the used voltage difference 175 applied to two single deflection electrodes 181.1 and 181.2 for deflection scanning in a first direction. Nonlinear effects as described above are compensated by the deviation of the voltage difference 175 from a linear line 173. The modified voltage differences for the two pairs of deflection electrodes are illustrated in FIG. 9B. During use, a first voltage difference 177.1 is applied to opposing electrodes 181.11 and 181.21 with opposite sign, respectively, and a second voltage difference 177.2 is applied to opposing electrodes 181.12 and 181.22 with opposite sign, respectively. The average voltage difference applied to the pairs of electrodes is identical to voltage difference 175. The axial beamlet and the beamlets close to the optical axis transmit the inner area 190 in FIG. 8B. In this area, the difference in the electrostatic field generated by voltage differences 177.1 and 177.2 have little impact. A residual rotation can be compensated by a variable offset voltage 179.1 and 179.2 (illustrated not to scale) to the pairs of electrodes 183.11 to 183.22 for scanning in the second direction. Thereby, beamlets transmitting the outer zone of area 189 experience a slightly inhomogeneous deflection field. Thereby, scanning induced distortion can be reduced.

Figure 10:
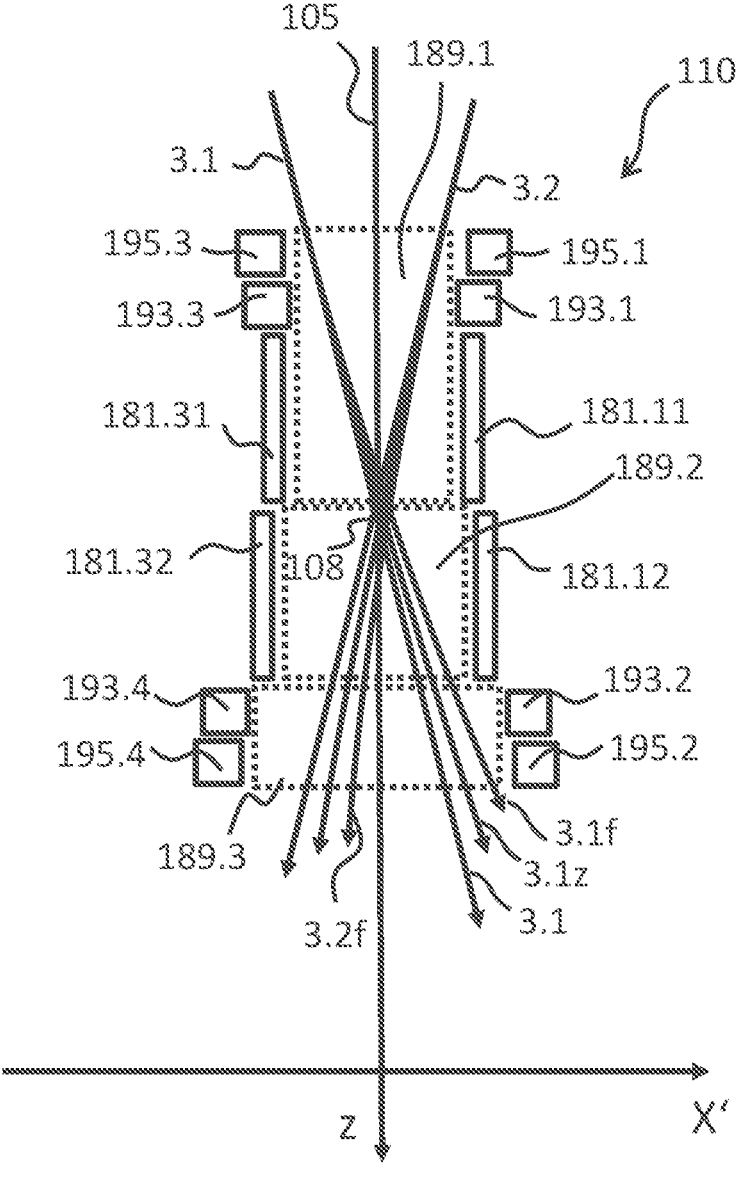
FIG. 10 is an illustration of deflection electrodes and correction electrodes of a collective multi-beam raster scanner arranged in direction of propagation for generation of an inhomogeneous electrostatic deflection field inside an intersection volume of a plurality of primary charged particle beamlets.

FIG. 10 illustrates a further example of the first embodiment. In this example, the set of correction electrodes comprises electrodes arranged upstream or downstream of the deflection electrodes in propagation direction of the plurality of primary charged particle beamlets 3. The first and second deflection electrodes 181.11, 181.12 are opposing the first and second deflection electrodes 181.31, 181.32 and configured for deflection scanning in a first direction X'. Due to the divergency of the plurality of primary charged particle beamlets, the plurality of beamlets transmit an intersection volume 189 forming a beam tube comprising z-segments 189.1 to 189.3 of different lateral extension. In the example, a set of first correction electrodes 195.1 to 195.4 is provided and configured for adding a correction field during scanning deflection of the plurality of primary charged particle beamlets. The correction electrodes are arranged—in propagation direction of the primary charged particle beamlets, which is in FIG. 10 the z-direction, upstream and downstream from the deflection electrodes 181. At these z-positions, the primary beamlets as for example beamlet 3.1 and 3.2 with a larger propagation angle reach a larger distance to the optical axis 105, and the impact of the inhomogeneous correction field generated by the correction electrodes increases with the propagation angle of the beamlet. An additional second set of correction electrodes 193.1 to 193.4 provides additional degrees of freedom to optimize the modified inhomogeneous scanning deflection field in the intersection volume 189. The correction electrodes 193 or 195 are illustrated in FIG. 10 in cross section and are arranged in segments along the circumference of the primary beamlets for locally influencing the plurality of charged particle beamlets similar to the correction electrodes illustrated in FIG. 8. During use, variable correction voltage differences are applied to the correction electrodes, and during deflection scanning, inhomogeneous correction fields with temporal variation are added synchronous to the scanning deflection fields. For example, at a deflection field the primary charged particle beamlet 3.1 is deflected to the right and propagates along path 3.1f, and transmits a correction field generated by correction electrodes 193.2 and 195.2, while the primary charged particle beamlet 3.2 following path 3.2f is further away from electrodes 193.2 and 195.2 and does not experience the inhomogeneous correction field. Thereby, a correction of a variation of the different local scanning distortions in the different image subfields is possible.

Figure 11:
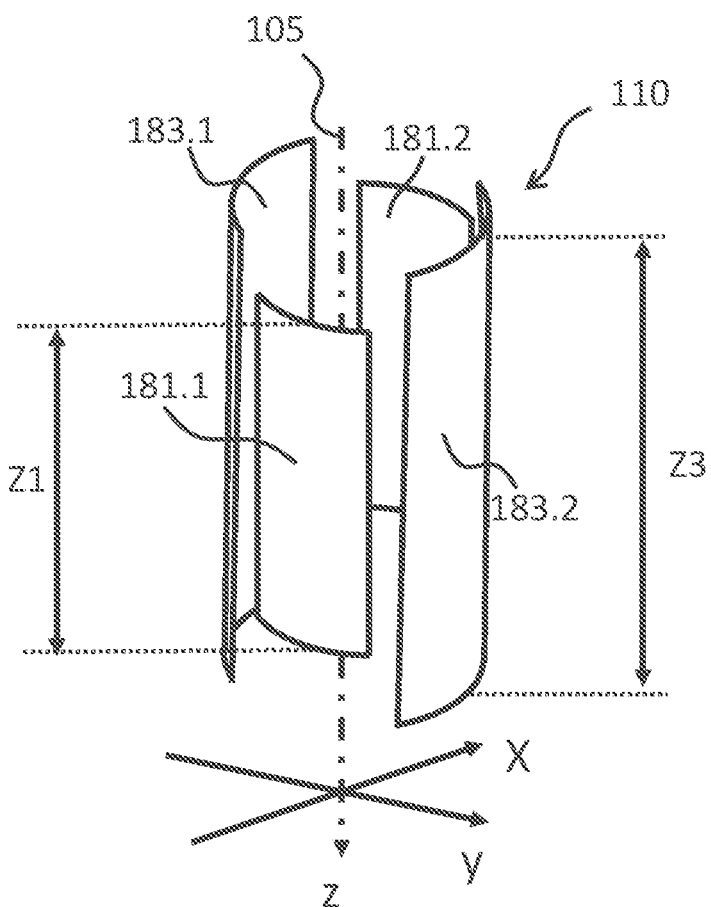
FIG. 11 is an illustration of deflection electrodes of different length for generation of an inhomogeneous electrostatic deflection field inside an intersection volume of a plurality of primary charged particle beamlets.

FIG. 11 illustrates a further aspect of a modified deflection scanning system 110. By adjusting the length or longitudinal extension of the deflection electrodes in z-direction with a length Z1 for deflections electrodes 181.1 and 181.2 for scanning deflection in a first direction and a length Z3 for deflection electrodes 183.1 and 183.2 for scanning deflection in a second direction, the increased scanning distortion in the four corners, for example indicated by arrows 191 in FIG. 8A, can be reduced.

By the modified design of the deflection electrodes, a predetermined inhomogeneous electrostatic field inside the intersection volume 189 of a collective multi-beam raster scanner 110 is provided. The predetermined inhomogeneous electrostatic field is variable over time and thereby a deflection scanning of the plurality of primary charged particle beamlets is achieved, whereby a scanning induced aberration such as the scanning induced distortion for beamlets transmitting the intersection volume with increasing angle β to the optical axis is minimized. In the first example, the deflection electrodes are configured to generate a predetermined inhomogeneous electrostatic scanning deflection field with increasing inhomogeneity for primary beamlets transmitting the intersection volume 189 with increasing angle β. In a second example, additional correction electrodes are provided for generating during an image scan a variable increasing inhomogeneity for primary beamlets transmitting the intersection volume 189 with increasing scanning deflection angle c. Shape and position of scanning electrodes and shape and position of correction electrodes is optimized during design and simulation of the multi-beam charged particle microscope 1. In an example, additional aberrations of other elements of the optical system are considered. The theoretical voltage differences VS(t) and VC(t) used for generation of the scanning deflection fields and for the scanning correction fields are computed and control signals for the generation of the scanning correction voltage differences VC(t) are stored in a memory of the control unit 800 of the multi-beam charged particle microscope 1. During adjustment and calibration of the multi-beam charged particle microscope 1, the voltage differences VS(t) and VC(t) used for scanning deflection and for the correction fields are adjusted and calibrated, and the calibrated voltage differences VS(t) and the control signals for the generation of the scanning correction voltage differences VC(t) are stored in the memory of the control unit 800 of the multi-beam charged particle microscope 1. During image scan, the calibrated voltage differences VS(t) and VC(t) are generated. An example of generation of a correction voltage difference VC(t) synchronous with the scanning voltage difference VS(t) is described below. In an example, an inhomogeneity of the scanning deflection field is generated with a correction field of parabolic shape or of shape of higher order in the first or second scanning direction. In an example, an inhomogeneity of the deflection field is generated by a correction field which has on the optical axis the shape of a saddle point and shows parabolic or higher order inhomogeneity of opposite sign in the first and second direction.

Figure 21:
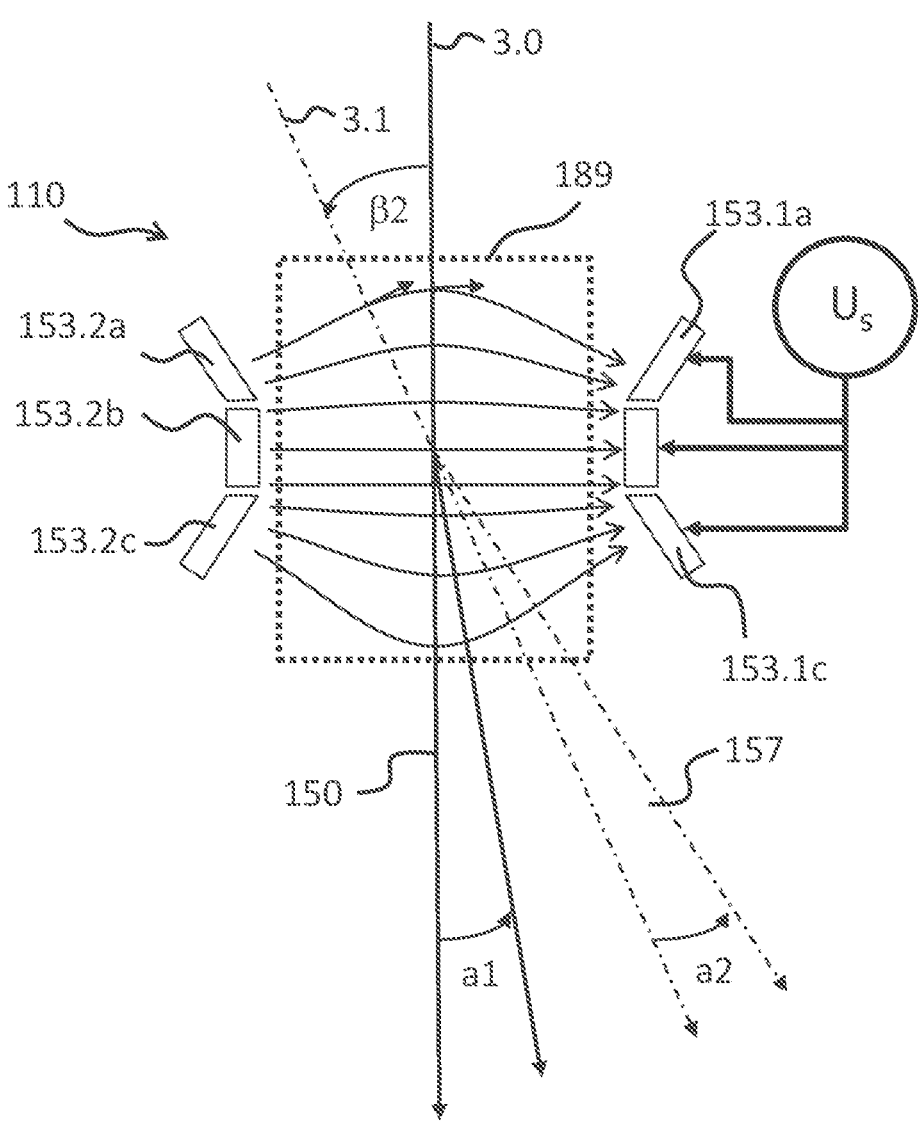
FIG. 21 illustrates an example of scanning correction electrodes with an inclination angle relative to the optical axis for generation of an inhomogeneous electrostatic deflection field inside an intersection volume of a plurality of primary charged particle beamlets.

FIG. 21 illustrates another example of a collective raster scanner 110 with predetermined inhomogeneous field distribution. In this example, additional electrodes 153.1a, 153.1c and 153.2a and 153.2c are provided, which form an angle with the optical axis of the charged particle microscope. Thereby, an inclination angle of the electrical field is controlled at the entrance side and the exit side of the charged particle beamlets of the intersection volume 189. With the correction electrodes forming an inclination angle with the optical axis it is possible to optimize of the effect of the scanning deflection field for a plurality of beamlets with different angles of incidence, comprising beamlet 3.0 being parallel to the optical axis and beamlet 3.1 with a maximum angle β2 to the optical axis.

Figure 12:
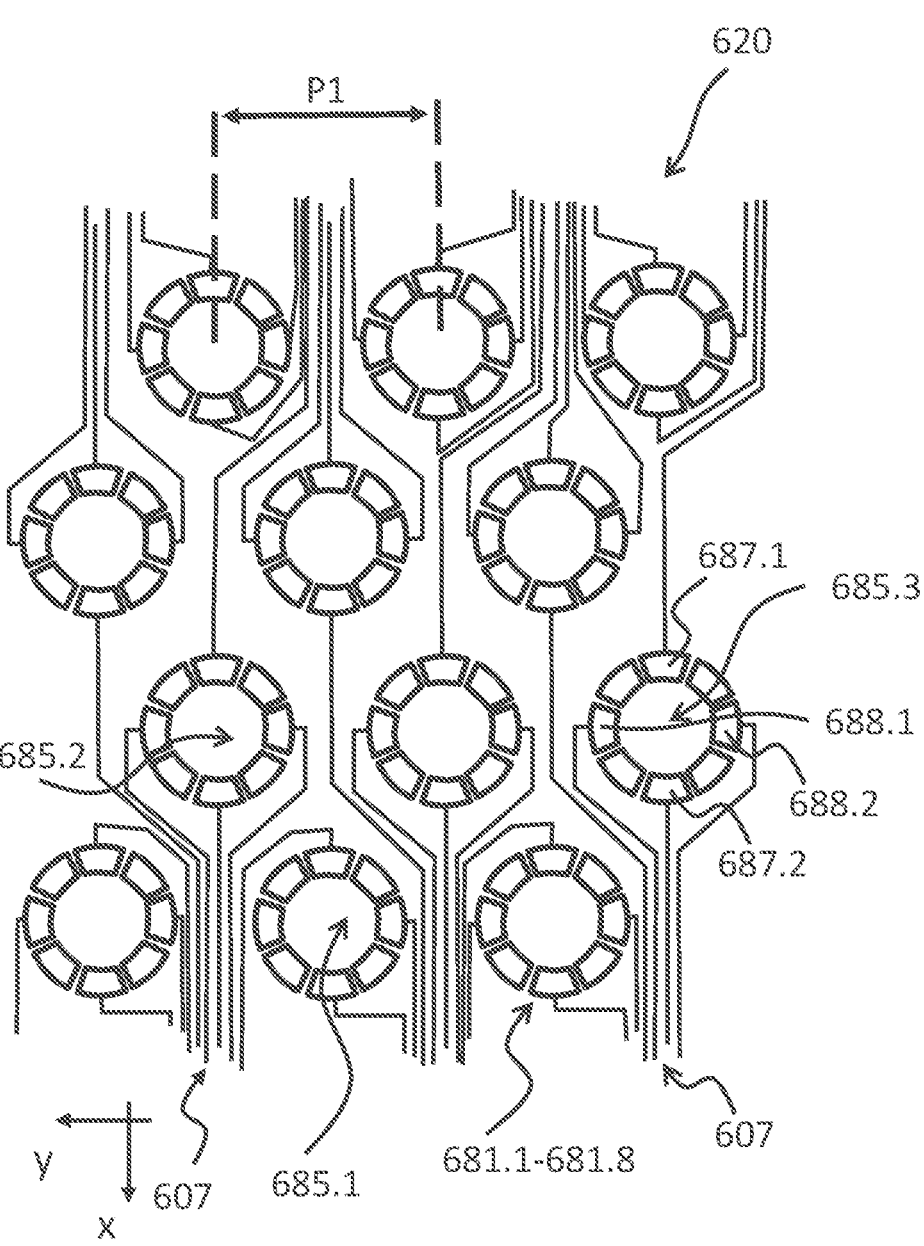
FIG. 12 is an illustration of a plurality of deflection elements arranged at a plurality of apertures of a multi-beam scanning distortion compensator array or scanning compensator array of telecentricity aberration.

According a second embodiment of the disclosure, the multi-beam charged particle microscope 1 comprises a multibeam scanning correction system such as a scanning distortion compensator array 601 configured for compensation of a residual scanning induced distortion during an image scan (see FIG. 1). With the scanning distortion compensator array 601 in the primary charged particle beam path, each individual primary charged particle beamlet is influenced individually and a scanning distortion induced by the long stroke collective multi-beam raster scanner 110 is compensated for each individual image subfield by scanning deflection of each primary beamlet by few nm. A scanning distortion compensator array 601 is illustrated in FIGS. 12 to 15. The short stroke scanning distortion compensator array 601 is configured as multi-aperture array 620 and comprises a plurality of apertures arranged in the raster configuration of the plurality of primary charged particle beamlets 3—in this example a hexagonal raster configuration. Aspects of the multi-aperture array 620 are illustrated in FIG. 12. Three of the apertures are illustrated with reference numbers 685.1 to 685.3. In the circumference of each of the plurality of apertures, a plurality of electrodes 681.1-681.8 is arranged, in this example the number of electrodes is eight for each aperture 685, but other numbers such as four or more are possible as well. The electrodes 681 are electrically insulated with respect to each other and with respect to a carrier of the multi aperture array 620. Each of the electrodes is connected by a electrically conductive line 607 to a fast array scanning control module.

Despite the design of a static multi-aperture array 620 is in principle known for a static compensation of a static distortion as described at FIG. 3, a scanning correction or compensation of a scanning induced aberration is not possible with conventional methods. For a scanning correction, synchronized with a scanning operation, at least two highly dynamic scanning correction voltage differences per beamlet, for example eight scanning correction voltage differences are generated and provided for each of the J primary beamlets at full scanning speed into the vacuum. By application of a sequence of predetermined scanning voltage differences VCA(t) synchronized with an image raster scan to each of the electrodes 681, each primary charged particle beamlet passing one of the apertures 685 is scanning deflected synchronously to the scanning deflection by the long stroke collective multi-beam raster scanner 110. Thereby, scanning distortion in an image subfield is compensated by a deflection of the individual beamlet corresponding to the image subfield in the opposite direction by the amount of the residual scanning induced distortion of for example up to 3 nm. Since only electrostatic effects are involved, the charged particle beamlet transmitting a corresponding aperture 685 can be adjusted or changed individually with high speed synchronously with the long stroke raster scanning.

More details are illustrated at the example of aperture 685.3. A first set of electrodes 687.1 and 687.2 for deflection scanning of the primary charged particle beamlet passing the aperture 685.3 in a first or p-direction are provided. A second set of electrodes 688.1 and 688.2 for deflection scanning of the primary charged particle beamlet passing the aperture 685.3 in a second or q-direction is illustrated. Further electrodes can be provided for other manipulations of the charged particle beamlet passing aperture 685.3, such as electrodes to correct astigmatism.

Figure 13:
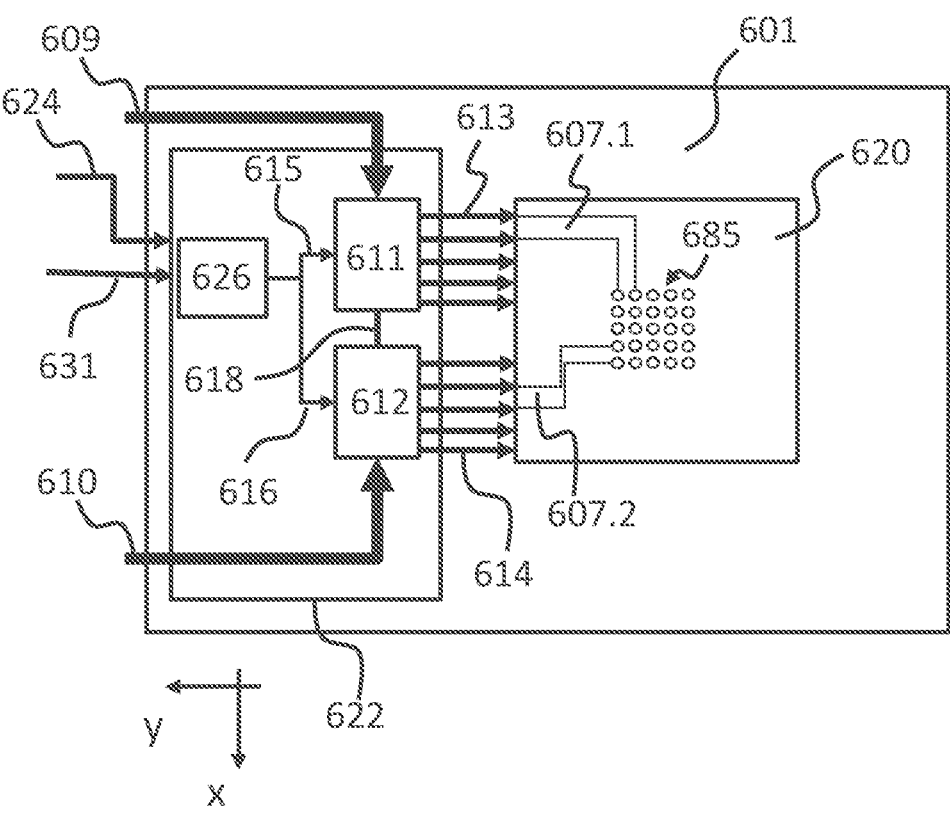
FIG. 13 is an illustration of a scanning array control unit at the example of a scanning distortion compensator array.
Figure 14:
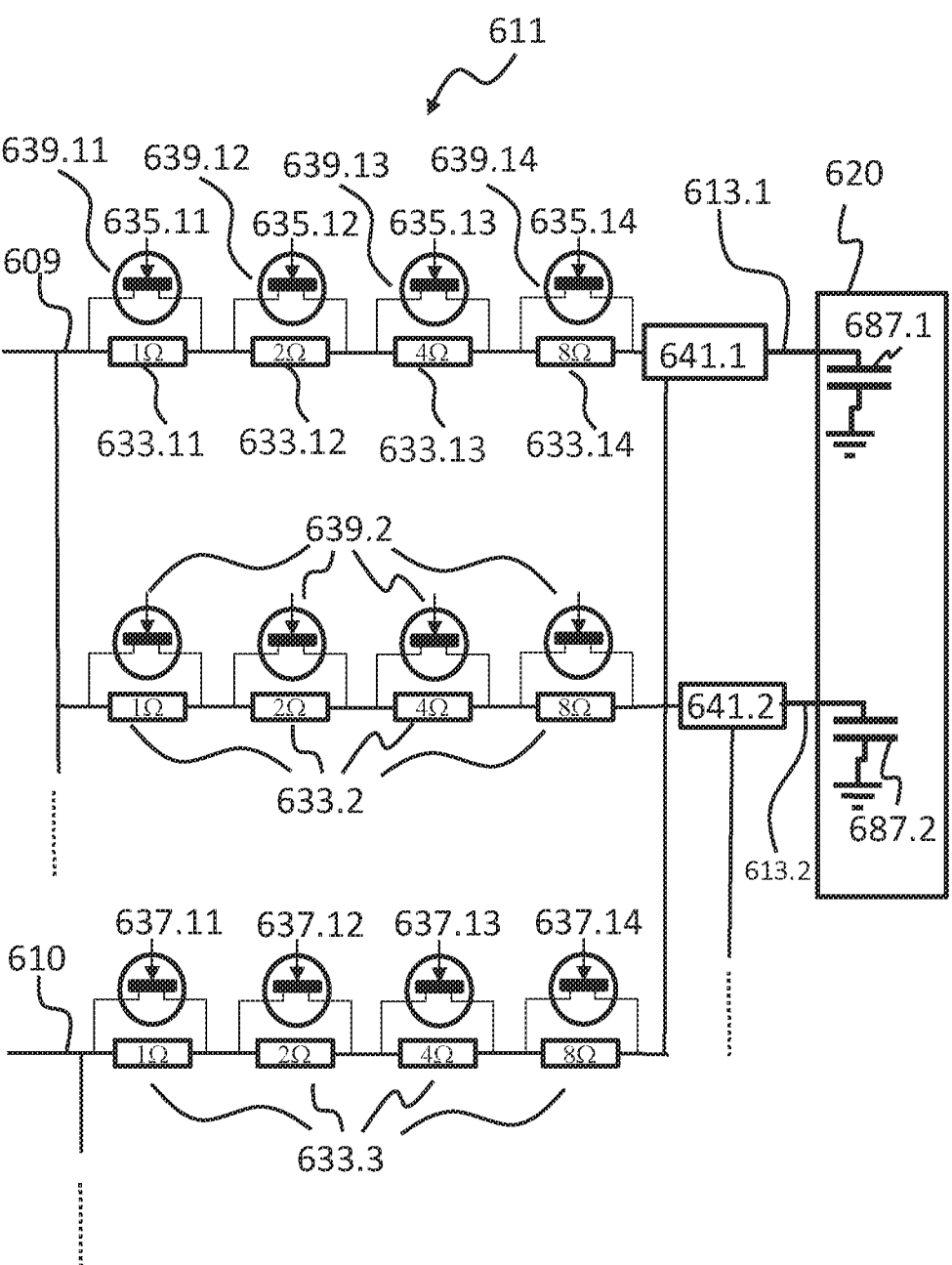
FIG. 14 is an illustration of a programmable resistor array as an example of a static voltage conversion unit.

The plurality of scanning correction voltage differences VCA(t) applied to the first and second set of deflection electrodes are provided synchronous with the raster scanning voltage difference VSp(t) and VSq(t) provided to the collective multi-beam raster scanner 110 with a signal frequency of about 20 MHz to 50 MHz. FIG. 13 illustrates the configuration of the scanning distortion compensator array 601 according the second embodiment of the disclosure capable for deflection scanning of a plurality of J=M×N primary charge particle beamlets with the number of charged particle beamlets J being more than 10 beamlets, such as about J=61 beamlets or even more, for example J>100 beamlets or even J>1000 beamlets. Considering at least 4 deflection electrodes for each beamlet, the number of driving signals or voltage differences VCA(i=1 . . . 4 J,t) for deflection scanning of J beamlets is at least 4 J, each of the 4 J signals or voltage differences VCA(i=1 . . . 4 J,t) are provided with a signal frequency of about 20 MHz to 50 MHz or even more, in accordance with the dwell time of about 25 ns at each pixel. The data rate therefore typically exceeds 10 Gbit/second. FIGS. 13 and 14 illustrate one example of implementing such high data rates at the example of static voltage conversion arrays 611 and 612 applied to the collective scanning voltages VSp(t) and VSq(t). The scanning distortion compensator array 601 comprises a multi-aperture plate 620 with a plurality of apertures 685 with deflection electrodes as illustrated in FIG. 12 and a scanning array control unit 622. Each electrode for deflection scanning in a first direction is connected via electrically conductive lines 607.1 and a first plurality of electrically conductive lines 613 to the output of a first static voltage conversion array or unit 611. The first static voltage conversion array 611 is controlled by first static control signal 615 provided by the operation control memory 626 of scanning array control unit 622. A first scanning deflection voltage difference VCAp(t) for parallel scanning deflection of each of the plurality of primary charged particle beamlets in the first direction is provided by a scanning voltage generator (not shown) via first power line 609. The first scanning deflection voltage difference VCAp(t) is proportional to the collective scanning voltages VSp(t) generated for deflection scanning by collective multi-beam scanning deflector 110. The first direction is the direction of the subfield coordinate p, parallel to the x-direction in the image plane. Scanning array control unit 622 comprises a memory 626 for storing the first plurality of control signals 615, comprising static control signals for each set of deflection electrodes for scanning correction in the first direction, for example electrodes 687.1 and 687.2 of FIG. 12. The first static voltage conversion array 611 generates the plurality of appropriate voltage differences VCAp(u=1 . . . 2 J,t) for the set of u deflection electrodes for scanning deflection of each of the charge particle beamlets in the first direction synchronous with the first scanning deflection voltage difference VCAp(t). Each voltage difference applied to a deflection electrode for deflection in the first direction, for example electrodes 687.1 and 687.2, is proportional to the scanning deflection voltage difference VCAp(t) and therefore proportional to the collective scanning voltage difference VSp(t).

A second set of static control signals 616 is provided to a second static voltage conversion array 612, which is connected via electrical conducting lines 614 and wiring 607.2 with each of the v second electrodes for deflection scanning in the second direction, comprising for example electrode 688.1 and 688.2 of aperture 685.3 as illustrated in FIG. 12. The second static voltage conversion array 612 generates the plurality of second voltage differences VCAq(v=1 . . . 2 J,t) for each of the v deflection electrodes for scanning deflection of a beamlet in the second direction (here in direction of the subfield coordinate q, parallel to the y-direction in the image plane) by reduction from the second scanning deflection voltage difference VCAq(t), provided via second power line 610. Thus, each voltage difference applied to each of the deflection electrodes for deflection in the second direction, for example electrodes 688.1 and 688.2, is proportional to the scanning deflection voltage difference VCAq(t) and therefore proportional to the collective scanning voltage difference VSq(t).

As illustrated in FIG. 6, the scanning distortion vector [dp,dq] in an image subfield has in general scanning distortion vector components in the first direction (here the p-coordinate) as well as in the second direction (here the q-coordinate). Therefore, in the example of FIG. 13, first and second voltage conversion unit 611, 612 are connected by signal line 618, and in addition to the above, a plurality of voltage differences VCp(v,t) for scanning deflection in the second directed is generated proportional to the first scanning deflection voltage difference VCAp(t) and provided to the plurality of electrodes for scanning in the second direction, and vice versa for VCAq(u,t). Thereby, a residual scanning distortion vector components in first direction dp(p,q) and second direction dq(p,q) are compensated synchronous with the collective scanning signals VSp(t) and VSp(t) provided to the collective multi-beam raster scanner 110. Since the scanning distortion amplitude ∥dp;dq∥ is small, for example below 3 nm, or below 1.5 nm, the voltage differences used for individual compensation of the scanning induced distortion of each of the plurality of charged particle beamlets are very low, for example below 100 mV, below 10 mV or even less.

An example of a static voltage conversion array or unit 611 or 612 is given by a programmable resistor array, which generates a plurality of output voltages proportional to a variable input voltage. FIG. 14 illustrates an example of a static voltage conversion array 611. In this example, the static voltage conversion array 611 is configured as programmable resistor array for individual reduction of the variable driving voltages VCAp(t) and VCAq(t) to the plurality of voltage differences VCAp(u,t) and VCAp(v,t) for individual compensation of the scanning induced distortion (dp,dq) of each of the plurality of charged particle beamlets. The static voltage conversion array 611 provides for each of the u=1 . . . 2 J correction deflection electrodes at least two components of voltage differences, including a first voltage difference VCAp(u,t) synchronous with a driving voltage VCAp(t) and a second voltage difference VCAq(u,t) synchronous with a driving voltage VCAq(t). The first and second driving voltages VCAp(u,t) and VCAq(u,t) are added by voltage adder 641.u and provided to the respective uth electrode, for example electrode 687.1 for compensation of a scanning induced distortion of an individual primary beamlet in the first direction. For each of the j=1 . . . 4 J deflection electrodes, a first sequence of resistors 633.j with increasing resistance, for example a sequence of resistors with 1Ω, 2Ω, 4Ω, 8Ω is arranged in sequence, and in parallel to each resistor, a sequence of transistors 639.n is arranged. For example, for deflection electrode 687.1, a first sequence of resistors 633.11 to 633.14 is arranged in parallel with a first sequence of transistors 639.11 to 639.14 for reduction of the driving voltage VCAp(t) provided at power line 609, whereby the amount of voltage reduction is controlled by the plurality of static control signals 635.11 to 635.14 provided to the first sequence of transistors 639.11 to 639.14. By switching for example a transistor 639.13 from an off to an on state by the control signal 635.13 provided to a gate of a resistor 639.13, the corresponding resistor 633.13 is bridged and the voltage is not reduced by resistor 633.13. If a transistor 639.11 to 639.14 is in off-state, the driving voltage, for example scanning deflection voltage difference VCAp(t), is reduced by the corresponding resistor 633.11 to 633.14. If all transistors are switched to the off-state, the driving voltage difference VCAp(t) is reduced to a minimum value and a minimum deflection of the corresponding beamlet is achieved. If all transistors are switched to an on-state, the full scanning deflection voltage difference VCAp(t) is applied to the corresponding electrode and a maximum deflection of the corresponding beamlet is achieved. Thereby, for example a maximum value of a scanning distortion of about up to 5 nm of a beamlet is compensated. With 4 resistors in sequence, the driving voltage difference VCAp(t) can be reduced to 16 different voltage levels between the maximum and the minimum voltage difference, such that the maximum residual distortion of about 5 nm can be reduced to about 0.3 nm.

With the plurality of static control signals 635 provided to the sequence of transistors 639 for switching and keeping the transistors in either on or off state, the scanning deflection voltage difference VCAp(t) is reduced in a predefined way for each of the plurality of electrodes of the multi-aperture array 620. The output voltage VCAp(u,t) 613.1 provided to the specific u$^{th}$ electrode, for example electrode 687.1 of FIG. 12, comprises a first correction voltage component VCAp(u,t) synchronous with a driving voltage VCAp(t), which is proportional to first scanning deflection voltage difference VSp(t) for long stroke raster scanning of the primary charged particle beamlet in the first or p-direction.

In an example, a scanning correction in the first direction, for example the p-direction depends on the scanning position in the second direction, for example the q-direction. The static voltage conversion array 611 therefore further comprises the voltage combiner 641.1, which is connected to a programmable resistor array including resistors 633.3 driven by the second scanning deflection voltage difference VCAq (t) provided by power line 610. With a set of drive signals 637.11 to 637.14, a second correction voltage component VCAq(u,t) synchronous with a driving voltage VCAq(t) is generated proportional to the second scanning deflection voltage difference VCAq(t), and added to the first correction voltage component proportional and synchronous to the second scanning deflection voltage difference VSq(t) for long stroke raster scanning in the second or q-direction.

In an example, a scanning correction in the second direction, here the q-direction depends on the scanning position in the first direction, here the p-direction. The static voltage conversion array 611 therefore comprises a further programmable resistor array driven by the first scanning deflection voltage difference VCAp(t) provided by power line 609. With a set of drive signals (not shown), a second correction voltage component VCAp(v,t) synchronous with a driving voltage VCAp(t) is generated proportional to the first scanning deflection voltage difference VSp(t), but for compensation of a scanning distortion vector component dq(p,q) in the second or q-direction, proportional to the scanning position in the first direction.

The number L of resistors, transistors and static control signals for reduction of the scanning deflection voltage difference to the predetermined voltage difference for compensation of a scanning induced distortion is by way of example illustrated by L=4, but the number L can be larger. The voltage combiners 641 can also be connected to additional voltage difference signals, for example to provide an individual predetermined voltage offset to each of the apertures 685 to compensate a static distortion offset as illustrated in FIG. 3. The programmable resistor array is one example of a quasi-static voltage converter, by which the large amount of data rate generated and provided to the 4 J electrodes of a scanning distortion compensator array 601 is enabled. Equivalent implementations are possible as well, for example an array of programmable source follower transistors, which limit for each source follower transistor a driving voltage difference to an amount proportional to static signal provided at the respective gate of each source follower transistor.

The plurality of static control signals, comprising the control signals 635.11 to 635.14 and control signals 637.11 to 637.14, are determined in a calibration step and stored in a memory 626 of the scanning array control unit 622 for each of the at least 4 J electrodes of the scanning distortion compensator array 601. The static control signals stored in the memory 626 can be modified during operation of a multi-beam charged particle microscope, for example between the image acquisition of a first image patch and a second image patch. Therefore, scanning array control unit 622 is connected to the operation control unit 800 via data connection 631 (see FIG. 13). In an example, scanning array control unit 622 is connected to a clock line 624 to synchronize operation of the scanning distortion compensator array 601 with the collective multi-beam raster scanner 110. During an image acquisition of an image patch, the plurality of static control signals 615 and 616 are constant, and the scanning distortion in each image subfield is corrected by a plurality of 4 J voltage differences provided to the 4 J deflection electrodes, whereby the 4 J voltage differences each comprise first and second components proportional to the first and second scanning deflection voltage differences VCAp(t) and VCAq(t), which are synchronous to the scanning deflection voltage difference VSp(t) and VSq(t) provided to the deflection scanner electrodes of the long stroke collective multi-beam raster scanner 110. Thereby, according the second embodiment, a scanning distortion generated by the collective multi-beam raster scanner 110 in combination with additional optical elements such as objective lens 102 are compensated by the scanning distortion compensator array 601.

In an example, the number J of primary charged particle beamlets in the raster configuration is J=100. At least 4 electrodes with correction voltage differences are used for correction of a scanning induced distortions [dp,dq] for each beamlet, therefore 4 J=400 correction voltage differences are generated by the programmable resistor array and provided to the plurality of electrodes. For each electrode, the voltage difference is a superposition of two components, a first component with linear dependency from the first scanning direction and a second component with linear dependency from the second scanning direction, the generation of 8 J=800 voltage difference components for the 4 J=400 electrodes involves 8 J=800 programmable resistor sequences. With for example 4 resistors in sequence and four control signals for the generation of each of the components of the voltage difference, a reduction of the residual scanning distortion by a factor of more than 10, for example up to 16 is achieved. The plurality of 32 J=3200 static control signals can be predetermined and provided from the memory of the operation control unit 622.

A further reduction can be achieved by providing more than four programmable resistors in sequence, for example 8 resistors, whereby a reduction of the scanning induced distortion of a factor of more than 100, for example of up to 256 can be achieved. Thereby, the scanning distortion is reduced by at least a factor of 10, such as with a factor of more than 100.

Figure 15:
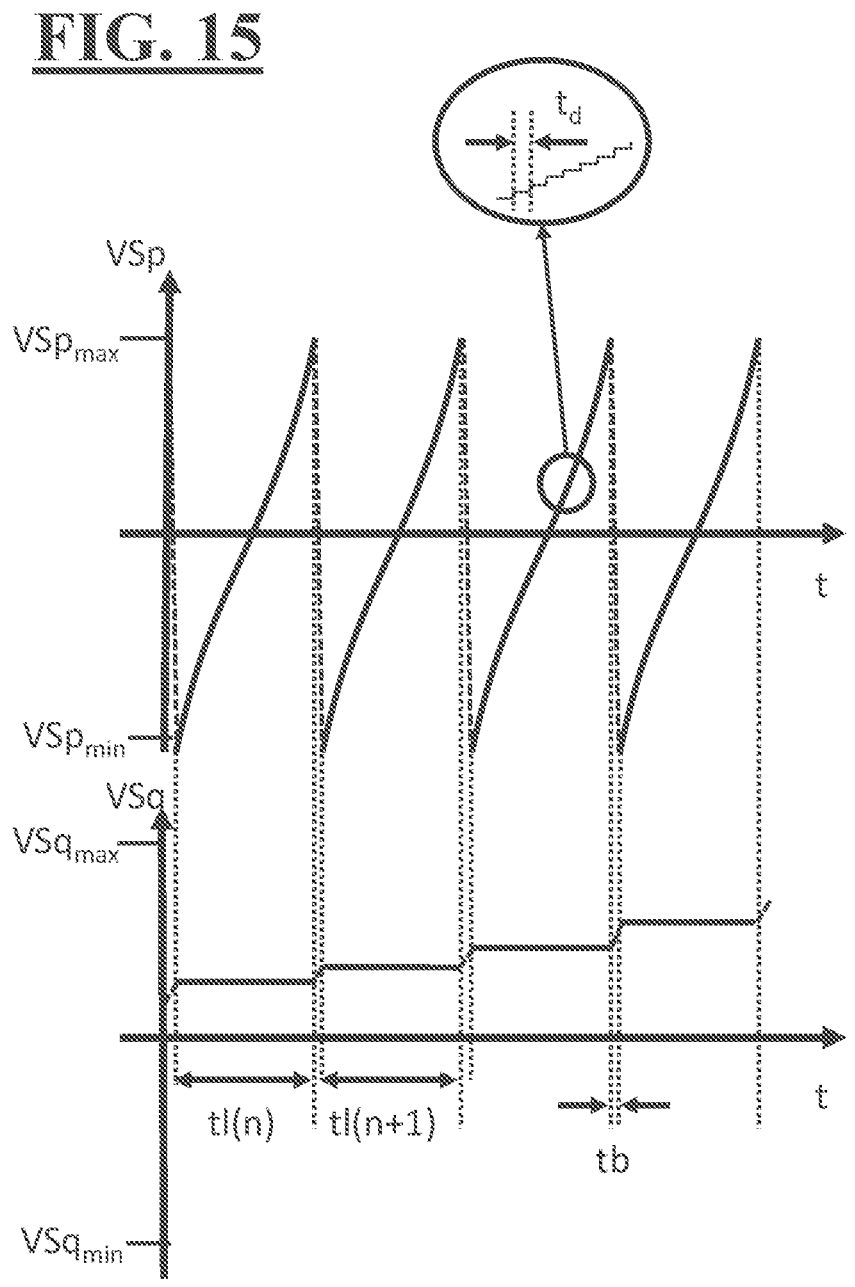
FIG. 15 illustrates an example of driving signal at the example of a scanning voltage difference.

Typical first and second scanning deflection voltages VSp(t) and VSq(t) for scanning deflection of beamlets in the first and second direction are illustrated in FIG. 15. For scanning deflection with collective multi-beam raster scanner 110 in the first direction (the p-coordinate in each subfield, parallel to the x-coordinate), a sequence of fast voltage ramps VSp(t) is generated, which deviates from linear ramps to compensate nonlinear effects of the deflection scanner, as described above. After time interval tl(n) for line number n, the scanning deflection voltage VSq(t) for deflection in the second direction (here the q-direction at wafer level, parallel to the y-coordinate) is changed to deflect a beamlet in the next line with number (n+1) and the scanning deflection voltages VSp(t) is set back to $VSp_{min}$. With the next voltage ramp during time interval tl(n+1), the beamlet is scanning deflected in line (n+1) until the end of the line is reached with $VSp_{max}$. The time interval tb is the fly-back interval described above. Both voltages are generated and provided in a step-wise manner, for example the first voltage ramp VSp(t) comprises a sequence of constant voltages, which are constant during the dwell time $t_d$ at each pixel, until the voltage VSp(t) is changed to the deflection voltage for deflection of the beam to the next pixel (see magnified detail section).

It should be mentioned that in systems with a scanning wafer stage, the plurality of charged particle beamlets is scanning deflected only in the first direction, while the position of the beamlets in the second direction is constant. In this example, VSq(t) is constant.

The voltage differences VSp(t), VSq(t) illustrated in FIG. 15 are representative for the voltage differences VSp(t) and VSq(t) provided for raster scanning deflection of the plurality of primary charged particle beamlets with the collective multi-beam raster scanner 110. The voltage differences VSp(t), VSq(t) are also representative for the driving voltages VCAp(t) and VCAq(t), as provided to the power lines 609 and 610 of the scanning distortion compensator array 601 described above. However, the maximum and minimum voltage differences $VCAp_{min}$, $VCAp_{max}$, and $VCAq_{min}$, $VCAq_{max}$ are different by at least two orders of magnitude. The maximum scanning voltage difference for long stroke collective multi-beam raster scanner 110 is typically about $VSp_{max}$=10V or more, depending on the number of primary charged particles J. A maximum driving voltage difference $VCAp_{max}$, for compensation of a scanning distortion can be determined according a maximum scanning distortion, for example for a compensation of maximum scanning distortion of about below 5 nm, for example 2 nm or 1.5 nm. Therefore, for scanning distortion compensator array 601, the maximum voltage $VCAp_{max}$ of a voltage ramp according FIG. 15 is typically in the range of 10 mV to 100 mV, for example about 50 mV.

Typically, for a symmetrical scanning system the minimum values of the scanning voltage differences are symmetrically to the maximum scanning voltage differences. Especially for the linear part of the scanning distortion, the minimum voltage differences are given by VCApmin=−

VCApmax, VCAqmin=−VCAqmax. Fabrication errors or thermal drift of the multi-beam charged particle microscope can induce an additional static distortion offset for each of the plurality of primary charged particle beamlets and can be compensated by a static distortion compensator 306 as described above.

In an example, the driving voltages VCAp(t) and VCAq(t) provided to the scanning distortion compensator array 601 can be generated synchronous with the scanning voltage differences VSp(t) and VSq(t) either by the same scanning voltage generator used for the collective multi-beam raster scanner 110 or reduced from the scanning voltage differences VSp(t) and VSq(t) to the desired maximum voltages VCAp$_{max}$, and VCAq$_{max}$ by resistors. Thereby, the scanning distortion correction provided by the scanning distortion compensator array 601 with the programmable resistor array is directly coupled with the scanning deflection generated by the collective multi-beam raster scanner 110.

FIG. 15 is a simplified representation and illustrates the scanning voltage differences VSp(t), VSq(t) for four lines only, but the number of scanning lines is larger, for example M=5000 or more.

An analogous implementation of a voltage conversion unit 611 or 612 for providing a plurality of correction voltage differences VCp(t) and VCq(t) proportional to the first and second scanning correction voltage differences VSp(t) and VSq(t) can also be used for control of the set of correction electrodes for the collective multi-beam raster scanner 110 according the first embodiment, for example for control of the set of correction electrodes 185.1 to 185.4, 187.1 to 187.4, or 195.1 to 195.4. Thereby, the plurality of correction voltage differences is provided to the correction electrodes synchronous with the drive voltage difference VSp(t), VSq(t) for deflection scanning by the deflection electrodes.

In an example, with a scanning distortion compensator array 601 also other scanning induced aberrations such as scanning induced astigmatism or change of focus plane is compensated. The dynamic scan distortion is typically linked to dynamic spot shape aberrations that occur for the perturbed and unperturbed system. In an example, a scanning stigmator array similar to the scanning distortion compensator array is provided, and the correction voltage differences for each stigmator electrode are generated by a programmable resistor array or network as described above. A plurality of for example two or three of such multi aperture plates is arranged in sequence, with corresponding electrodes for compensation of aberrations such as astigmatism and defocus. The plurality of correction voltages is provided in analogous way from the drive voltage difference VSp(t), VSq(t). For example two voltage differences VCCp (t) and VCCq(t) for stigmation correction are used. In analogous way, the scanning compensator array of telecentricity aberration 620 can be configured and operated, as will be described below in more detail.

Some aspects the scanning distortion compensator array 601 are illustrated at FIG. 1. In an example, the scanning distortion compensator array 601 is provided in propagation direction of the plurality of primary charged particle beamlets after the primary multi-beamlet-forming unit 305, for example between primary multi-beamlet-forming unit 305 and first field lens 307. In an example, the scanning distortion compensator array 601 is provided as an additional element to an active multi-aperture plate arrangement 306.1 or 306.2, by which for example static aberrations such as the static distortion offset illustrated in FIG. 3 is compensated. In another example, the scanning distortion compensator array 601 is an element of the primary multi-beamlet-forming unit 305. As described above, the scanning distortion compensator array 601 can also be configured to compensate the static distortion offset as illustrated in FIG. 3. With the scanning distortion compensator array 601, during an image or raster scan a position of each charged particle beamlet focus 311 in the intermediate image plane 321 is changed synchronized with the long stroke raster scanning and in opposite direction to the scanning induced distortion introduced by collective raster scanning of the plurality of primary charged particle beamlets with the collective multi-beam raster scanner 110.

In a third embodiment, the multi-beam charged particle microscope comprises a second multibeam scanning correction system such as a scanning compensator array for compensation of a scanning telecentricity error as described above. The scanning compensator array for compensation of a scanning telecentricity error 602 is arranged in vicinity of the intermediate image surface 321. The scanning compensator array for compensation of a scanning telecentricity error 602 is configured in analogy to the scanning distortion compensator array 601 and provided with a plurality of control signals for compensating a scanning induced telecentricity error. The scanning compensator array for compensation of a scanning telecentricity error 602 can be arranged in addition to a static compensator 390 for compensation of a static telecentricity error or can be configured to provide in addition a plurality of offset voltages for compensation of the static offset of the telecentricity error. With the scanning compensator array for compensation of a scanning telecentricity error 602, a scanning induced telecentricity error is compensated by adjusting the individual propagation angles of each beamlet in vicinity of the intermediate image plane 311 such that during an image scan, each of the plurality of primary charged particle beamlets impinge on the wafer surface 25 at an angle of 90° with a deviation below 3 mrad or even below.

According a forth embodiment, a multi-beam charged particle microscope with reduced scanning distortion and a method of operation of a multi-beam charged particle microscope with reduced scanning distortion is provided. For optimization and adjustment of the deflection scanner, and for derivation of the plurality of control signals of for example the scanning distortion compensator array 601, the scanning distortion [dp, dq] of each image subfield as illustrated in FIG. 6a is expanded in a power series of the image subfield coordinates (p,q):

$$d\gamma = \sum_{a,b} c_{ab}\gamma^a\bar{\gamma}^b$$

with complex notation according $$\gamma = p + iq,$$

$$d\gamma = dp + idq$$

The lowest order or linear part with a+b=1 of the scanning distortion is described by $$d\gamma = c_{10}\gamma + c_{01}\bar{\gamma}$$

and can be written in $$\begin{pmatrix} dp \\ dq \end{pmatrix} = \left[ M \cdot \begin{pmatrix} \cos\mu & 0 \\ 0 & \sin\mu \end{pmatrix} \cdot \begin{pmatrix} 1 & \omega \\ 0 & 1 \end{pmatrix} \cdot \begin{pmatrix} \cos\rho & -\sin\rho \\ \sin\rho & \cos\rho \end{pmatrix} - \begin{pmatrix} 1 & 0 \\ 0 & 1 \end{pmatrix} \right] \begin{pmatrix} p \\ q \end{pmatrix}$$

with the mixing angle $\mu$, the deviation from orthogonality co and the rotation angle $\rho$. One way of describing the four linear scanning distortions is thus given by the four linear distortion aberrations scale M, squareness SQ, orthogonality OR and rotation ROT with $$SQ = 1 - \cot(\mu), \quad OR = \frac{\pi}{2} - \arccos\left(\frac{\omega}{\sqrt{1 + \omega^2}}\right), \quad ROT = \rho.$$

Higher order distortions are for example third order distortions like pincushion distortion. Typically, the linear distortion aberrations per subfield contribute to more than 80% of the total scanning induced distortion. With the scanning distortion compensator array 601 according the second embodiment, the linear scanning distortions can be compensated by the plurality of voltage differences provided to the deflection electrodes proportional to the scanning voltage differences VSp(t) and VSq(t), which are proportional to a scanning position (p,q) in each image subfield. The linear part of the scanning distortion is described by four normalized linear distortion aberration vectors M, SQ, OR and ROT for each image subfield with raster coordinate (n,m). Thereby, the linear part of the scanning distortion (dp,dq) is compensated.

In an example, the linear parts M, SQ, OR and ROT are described by four normalized vectors, SDV(i), with SDV(1) representing M, SDV(2) representing SQ, SDV(3) representing OR and SDV(4) representing ROT, and the linear part of the scanning distortion is described by the plurality of amplitudes A(i;n,m) of the normalized scanning distortion vectors:

$$[dp,dq](p,q;n,m) = E \cdot \Sigma_i A(i;n,m) \cdot SDV(i;p,q)$$

In an example, the normalization is achieved by setting the maximum value of each linear distortion vector SDV(i) to 1 nm, and by setting the maximum sum of amplitudes $\max\{\Sigma_i A(i;n,m)\} = 1$ over all subfields with index (n,m). The scaling factor E is then a multiplication factor representing the maximum strength of scanning induced distortion [dp, dq](p,q;n,m).

Figure 16:
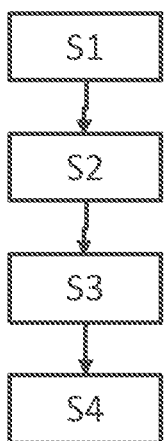
FIG. 16 is an illustration of a method of operation of a multi-beam charged particle microscope with reduced scanning induced aberrations.

FIG. 16 illustrates the method of operation of a multi-beam charged particle microscope with reduced scanning distortion. In a first step S1 of the method of operating a multi-beam charged particle microscope 1 with reduced scanning distortion, the linear part of the residual scanning distortion is determined. The determination is for example achieved by a calibration measurement of the scanning distortion at a calibration sample. The calibration sample can comprise a plurality of calibrated structures at calibrated positions and be provided on a wafer stage. In an example, the calibration comprises a plurality of repetitive patterns in a raster configuration similar to the raster configuration of the plurality of charged particle beamlets, and a scanning distortion calibration measurement is repeated with a relative displacement of the calibration pattern by a length corresponding to at least one image subfield between a first and a second measurement. The differences of the first and the second measurement can be derived and a relative difference between image subfields corresponding to a scanning distortion can be determined. A measured scanning distortion is analyzed and the linear parts M(nm), SQ(nm), OR(nm) and ROT(nm) for each image subfield (n,m) are computed by a decomposition of the scanning distortion error vectors [dp, dq] for each subfield (nm). A maximum scanning distortion vector is determined, the scaling factor E is determined and the plurality of amplitudes A(i; n,m) is determined.

In step S2, the maximum values of the correction voltage differences VCApmax, VCAqmax used for the scanning distortion compensator array 601 are determined from the scaling factor E, and a first and a second reduction factor F1 and F2 are determined. The reduction factors F1 and F2 are determined to achieve the correction voltage differences VCAp(t), VCAq(t) for scanning correction of the plurality primary charged particle beamlets from the scanning voltage difference VSp(t), VSq(t) provided to the collective multi-beam raster scanner 110.

In Step S3, according the dependency of the plurality of amplitudes A(i; n,m) of linear distortion vectors SDV(i) from the image subfield coordinate (n,m), a plurality of control signals 635 and 637 for control of the programmable resistor array 611 and 612 is derived (see FIG. 12 to 14 for reference numbers). For each of the deflection electrodes 687, 688 of each of the plurality of apertures 685 of the scanning distortion compensator array 601, respectively for each beamlet or each image subfield of coordinate (n,m), the plurality of at least 8 control signals 635 and 637 for control of the programmable resistor arrays 611 and 612 are derived from the plurality of amplitudes A(i; n,m), and stored in the memory of the operation control unit 622. The control signals are derived from the desired compensation of the scanning induced distortion of an image subfield of coordinate (n,m). With a scaling of amplitude A(i; n,m) to a maximum distortion of 1 in arbitrary units, the linear vector components correspond to the matrix elements and the corresponding control parameters for the programmable resistor array can be computed by matrix multiplication and conversion in a binary number with bit length according the number of resistors in sequence.

In step S4, during an image scan, the plurality of control signals 635 and 637 are provided to the programmable resistor arrays 611 and 612. The scanning voltage differences VSp(t) and VSq(t) are reduced by reduction factors F1 and F2 and the reduced correction voltage differences VCAp(t), VCAq(t) are provided to the power lines 609 and 610 of the programmable resistor array 611. Thereby, during image scan, the plurality of primary charged particle beamlets is scanning deflected by collective raster scanner 110 and the linear part of the residual scanning distortion is compensated by scanning distortion compensator array 601.

Thereby, the residual scanning distortion is reduced by at least 80%, for example by a factor of 10, and residual scanning induced distortion of for example below 0.3 nm, or even below 0.2 nm is achieved.

Figure 17A:
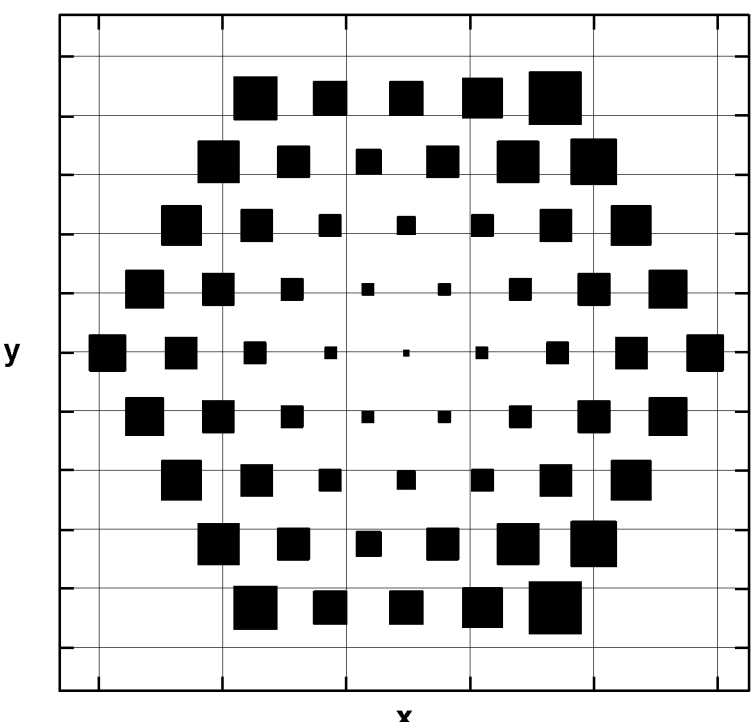
FIGS. 17A-17H illustrate typical field dependencies over image patch coordinates (x,y) of the four linear distortion vectors SDV(i) and their signature in an image subfield with subfield coordinates (p,q).
Figure 17B:
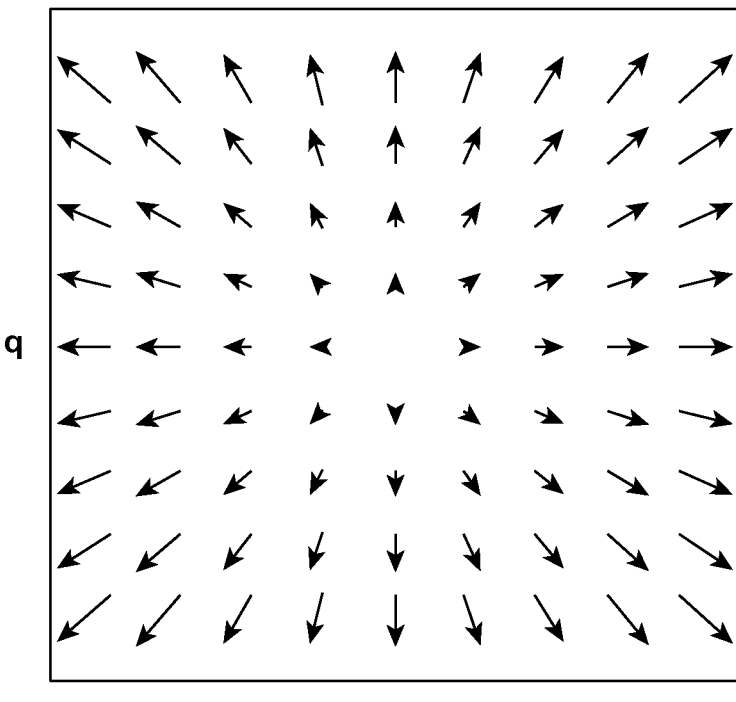
Figure 17C:
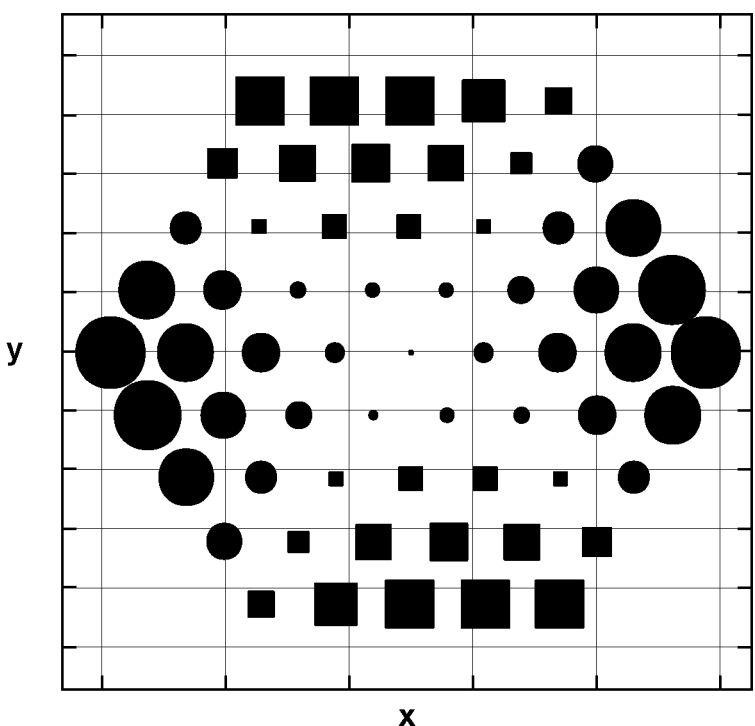
Figure 17D:
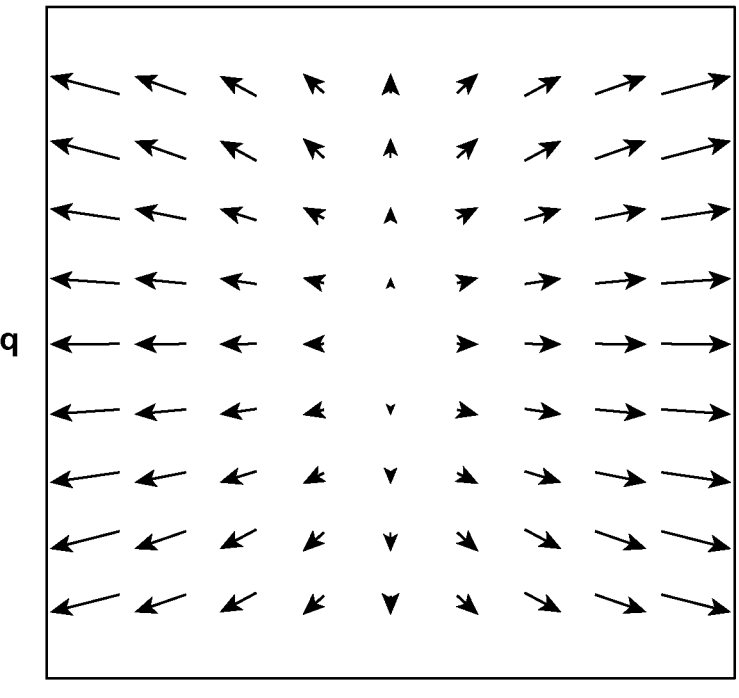
Figure 17E:
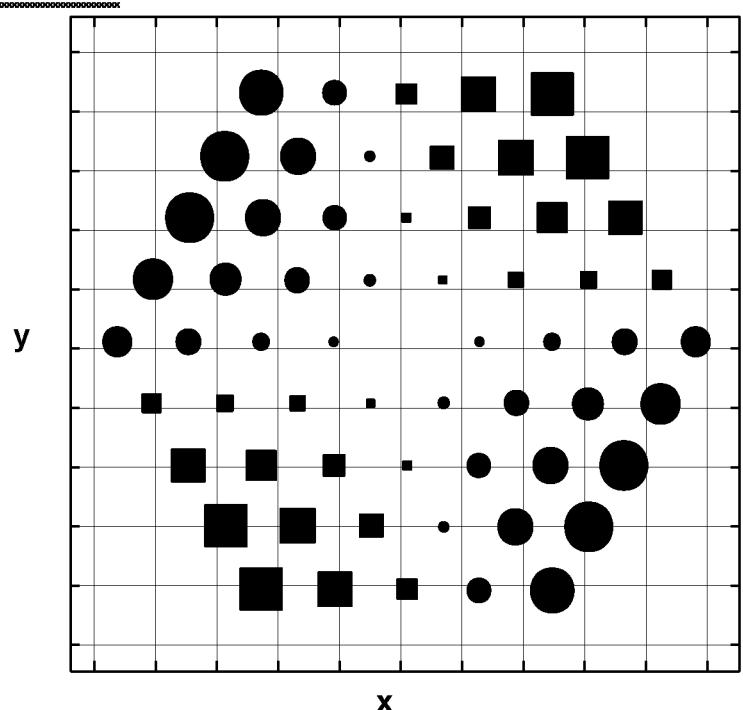
Figure 17F:
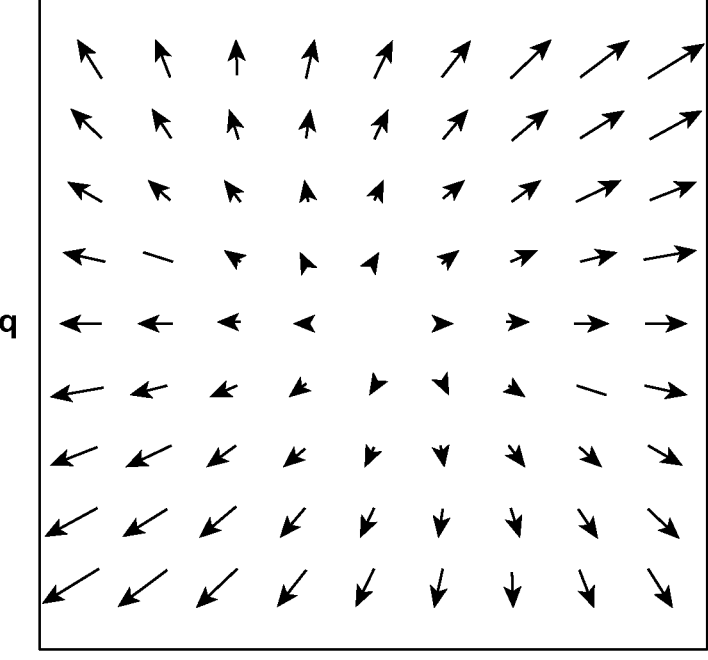
Figure 17G:
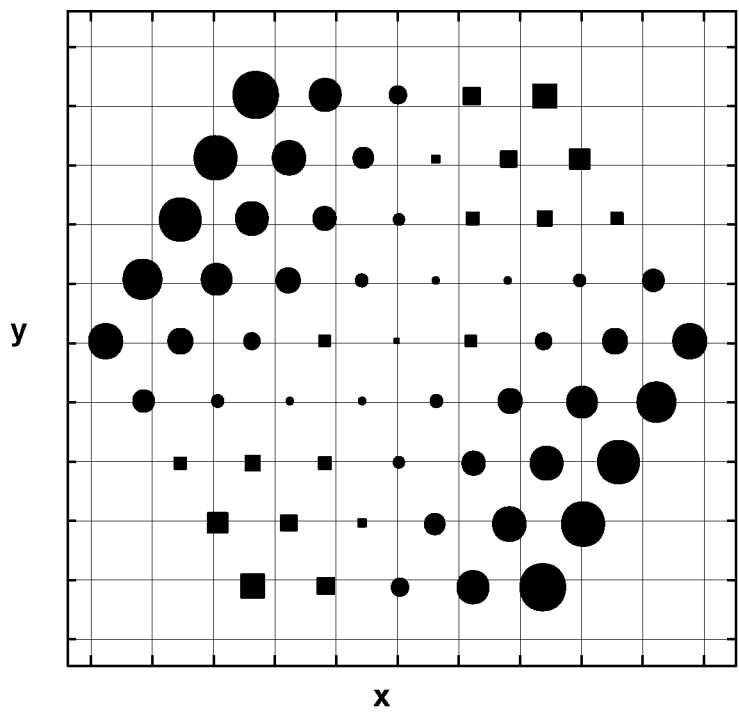
Figure 17H:
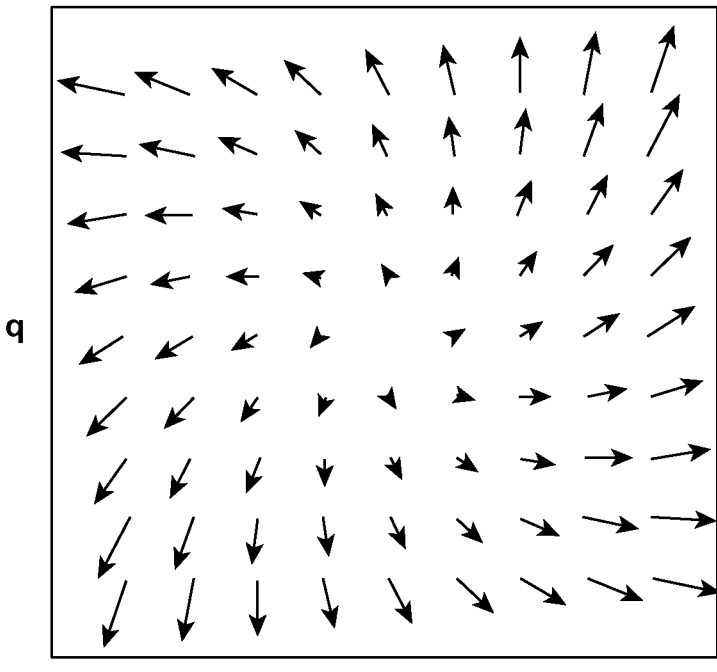

FIGS. 17A-17H illustrate a typical field dependency of the linear scanning distortion vectors over the plurality of primary charged particle beamlets at the example of the multi-beam charged particle microscope with J=61 beamlets with a hexagonal raster configuration. Throughout the images 17A, 17C, 17E, and 17G, the positive numbers are illustrated by circles, and the negative numbers by squares, with maximum or minimum value of linear distortion vectors represented by the area of the circles or squares. FIG. 17B shows a normalized linear scale SDV(1)~M, and FIG. 17A illustrates the dependency of linear scale SDV(1) for each of the J=61 beamlets forming an image patch with image subfield center coordinates $(x_{nm}, y_{nm})$. FIG. 17D shows a normalized Squareness SDV(2)~SQ with distribution over image patch coordinates $(x_{nm}, y_{nm})$ in FIG. 17C. The FIG. 17F shows a typical normalized orthogonality SDV(3)~OR of an image subfield in image subfield coordinates (p,q), with an image patch dependency illustrated in FIG. 17E. FIG. 17G shows the normalized rotation ROT=SDV(4) for each of the J=61 beamlets for image patch coordinates $(x_{nm}, y_{nm})$, with a normalized rotation illustrated in FIG. 17H.

In an example, the field dependency of the linear distortion vectors SDV(i) is described by a polynomial expansion of the amplitudes A(i;n,m) by $$A(i;n,m)=\Sigma_j \overline{A}(i;j)\cdot G(j;x,y)$$

With polyomials G(j; x, y) describing the dependency of a linear scanning distortion vector SDV from the image subfield center positions. The scanning distortion is thereby described by a product of two polynomials G and SDV with amplitude described by matrix $\overline{A}(i; j)$ $$[dp,dq](p,q;n,m)=E\cdot\Sigma_{i,j} \overline{A}(i;j)\cdot G(j;x,y)\cdot SDV(i;p,q)$$

Typically, the dominating parts of the field dependency of the distortion amplitudes are given by few polynomials G, for example by the parabolic terms of the polynomial expansion G. In this example, the residual scanning distortion is described by for example a 3×4 matrix $\overline{A}$. Instead of having a programmable resistor array with at least 8 J programmable resistor sequences with J being the number of primary charged particles, it is possible to implement each of the parabolic terms of G(j;x,y) in a first fixed resistor array and to implement each of the scanning distortion vectors SDV(i) in a second fixed resistor array. The voltage differences provided to the plurality of electrodes of the scanning distortion compensator array 601 by the first and second fixed resistor array in sequence is controlled by a programmable resistor array with the 3×4 amplitudes of matrix $\overline{A}$.

With the mixing elements 641 as described in FIG. 14, correction voltages are provided comprising a first component proportional to a scanning voltage difference VSp(t) for scanning in a first direction of the p-coordinate in an image subfield and a second component proportional to a scanning voltage difference VSq(t) for scanning in a second direction of the q-coordinate in an image subfield. Thereby, the linear parts of the scanning induced aberrations are compensated. The driving voltage difference VCAp(t) and VCAq(t) provided at power lines 609 and 610 can be reduced from the scanning voltage difference VSp(t) and VSq(t) according a maximum driving voltage difference used for driving the correction elements. Thereby the linear components of a linear image subfield dependency from image subfield coordinates (p,q) are compensated. The amplitudes of correction or compensation for each image subfield is provided for example by the static programmable resistor array 611, with a sequence of resistors for each compensator or correction electrode. Higher order parts, with a higher order dependency of scanning induced aberrations from the image subfield coordinates (p,q), can be compensated by adding further voltage difference components, for example a third components with a quadratic dependency from an image subfield coordinates (p,q), for example the product of p and q. In an example, the static voltage conversion array further comprises a nonlinear voltage reduction unit or nonlinear voltage amplifier, which generates a third driving voltage difference VCApq(t) proportional to the product of first and second driving voltage differences VCAp(t) and VCAq(t). An example nonlinear voltage reduction unit comprises a source follower transistor with a first driving voltage difference VCAp(t) at the gate and a second driving voltage difference VCAq(t) at the drain, connected to a deflection electrode of known capacity. Other examples of nonlinear voltage conversion units utilize the nonlinear response of Zener diodes.

With an analogous setup, a dependency from image patch coordinates $(x_{ij}, y_{ij})$ can be compensated, with at least a sequence of resistors for each image subfield. Thereby, the quadratic dependency or higher order dependency of the maximum image subfield distortion from the image patch coordinate $(x_{ij}, y_{ij})$ is compensated.

With an analogous method, a scanning compensator array for compensation of a scanning telecentricity error 602 is operated during use of a multi-beam charged particle microscope. The scanning induced telecentricity error is expanded in analogous manner in linear components and control signals are derived for compensation of scanning induced telecentricity errors accordingly.

With an analogous method, a scanning compensator array for compensation of scanning aberrations such as astigmatism or defocus is operated during use of a multi-beam charged particle microscope 1. The scanning induced aberrations is expanded in analogous manner in linear components and control signals for a multi-beam stigmator array or a multi-beam lens array are derived for compensation of scanning induced aberrations accordingly.

With an analogous method, the calibrated correction voltage differences VCp(t) and VCq(t) for the plurality of correction electrodes of the collective multi-beam raster scanner 110 according the first embodiment can be derived and provided to the plurality of correction electrodes of the collective multi-beam raster scanner 110. Thereby, the residual scanning distortion is reduced by at least 10%, for example by 20%, and residual scanning induced distortion of for example below 1.5 nm is achievable.

In an analogous method, the calibrated correction voltage differences VCp(t) and VCq(t) for the plurality of correction electrodes for the collective multi-beam raster scanner 110 according the first embodiment and deflection voltage differences VCAp(t) and VCAq(t) for scanning distortion compensator array 601 according the second embodiment are both derived and provided to the mechanism for correcting or compensating scanning distortion, and the residual scanning distortion is reduced by at least 90%, for example by 95%, and residual scanning induced distortion of for example below 0.2 nm, such as below 0.1 nm is achievable.

Figure 18:
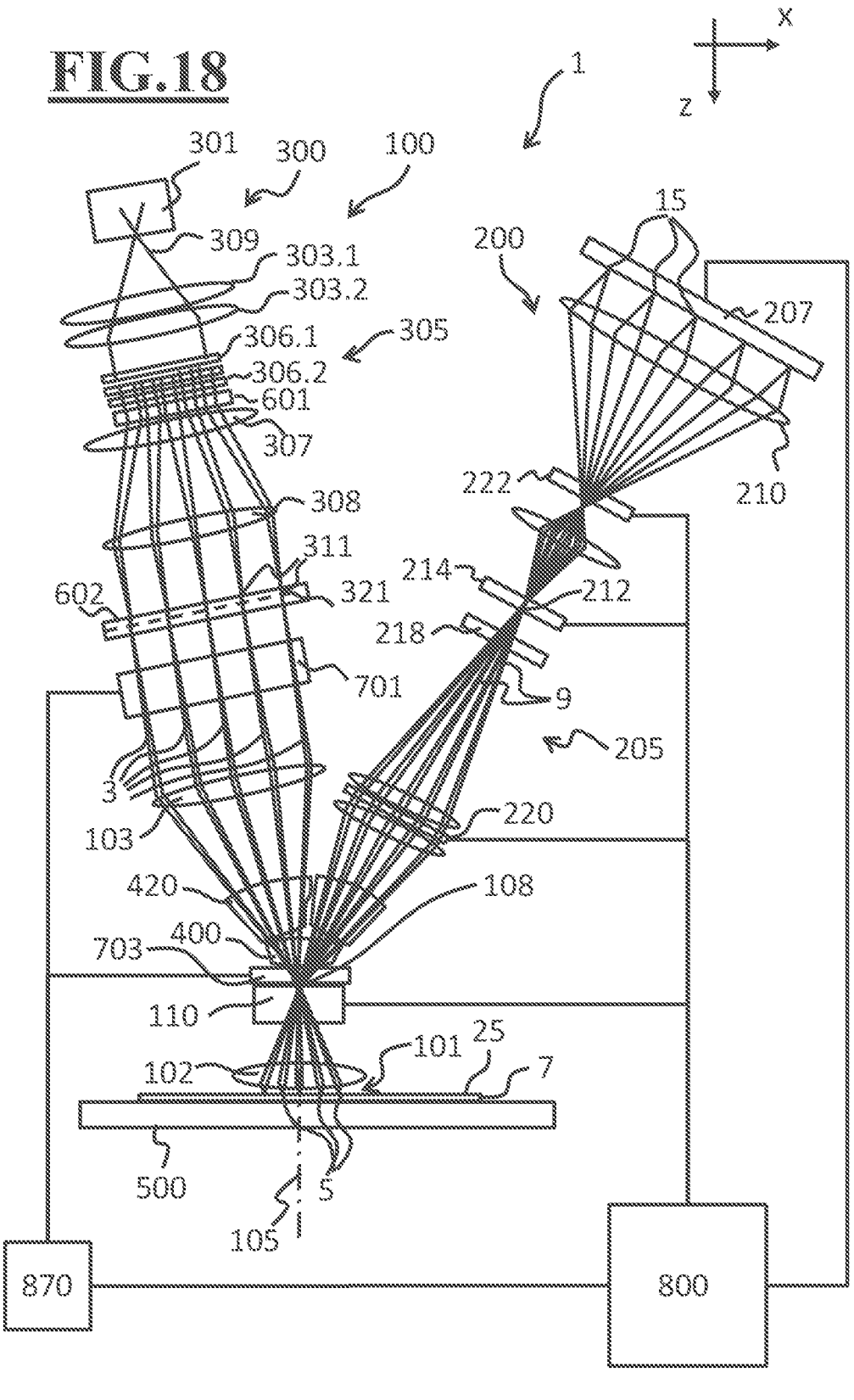
FIG. 18 is an illustration of a multi-beam charged particle microscope comprising additional first and second static multi-beam deflection systems for adjustment.

According a fifth embodiment, an improved multi-beam charged particle microscope with reduced scanning distortion and an improved method of operation of a multi-beam charged particle microscope with reduced scanning distortion is provided. The improved multi-beam charged particle microscope comprises a collective multi-beam raster scanner 110 according the first embodiment, with a predetermined inhomogeneous electrostatic scanning deflection field for reduced scanning distortion. The improved multi-beam charged particle microscope 1 further comprises at least a first static collective multi-beam deflection system 701 for adjustment of the position of the plurality of primary charged particle beamlets at the collective multi-beam raster scanner 110 according the first embodiment. Thereby, a residual scanning induced distortion by a misalignment of the collective multi-beam raster scanner 110 with respect to the raster configuration of the plurality of primary charged particle beamlets is reduced. FIG. 18 illustrates the improved multi-beam charged particle microscope 1 at an example. Same reference numbers are used as in FIG. 1. In addition to the elements described in FIG. 1, the improved multi-beam charged particle microscope according the fifth embodiment comprises a first static collective deflection system 701 for deflecting the plurality of primary charged particle beamlets 3 in lateral direction (x/y-direction) and thereby adjust a lateral position of the beam cross over 108 relative to the collective multi-beam raster scanner 110. Thereby, scanning distortion from a lateral misalignment of the collective multi-beam raster scanner 110 with respect to the plurality of primary charged particle beamlets transmitting the collective multi-beam raster scanner 110 is further reduced.

In an example, the improved multi-beam charged particle microscope 1 according the fifth embodiment further comprises a second static collective deflection system 703 for deflecting the plurality of primary charged particle beamlets in lateral direction (x/y-direction) and thereby adjusting the mean propagation angle of the plurality of primary charged beamlets with respect to the optical axis. Thereby, scanning distortion from a lateral misalignment of the collective multi-beam raster scanner 110 with respect to the plurality of primary charged particle beamlets transmitting the collective multi-beam raster scanner 110 is further reduced. The first static deflection system 701 and the second static deflection system 703 are connected to static adjustment control unit 870, which provides the plurality of static voltage differences for adjustment of the position and mean propagation direction of the plurality of primary charged particle beamlets 3 through the intersection volume 189 of the collective multi-beam raster scanner 110.

The scanning distortion is sensitive to the position and propagation angles by which the beamlets propagate through the electrostatic scanning deflection field in the intersection volume described above. Especially with an optimized collective multi-beam raster scanner 110 according the first embodiment of the disclosure, the residual scanning induced distortion is sensitive to a misalignment of the collective multi-beam raster scanner 110 with respect to the lateral position of the beam cross over 108 of the plurality of primary charged particle beamlets 3. With the first static deflection system 701 and the second static deflection system 703, lateral position and propagation angle of the plurality of primary charged particle beamlets is adjusted.

In a method of operation of the improved multi-beam charged particle microscope according the fifth embodiment, the residual scanning induced distortion is measured as described in step 1 according the forth embodiment. The residual scanning distortion is analyzed, and a scanning distortion component induced by a misalignment is determined. Static voltages are determined and provided by adjustment unit 870 to first static deflection system 701 and the second static deflection system 703, and the residual scanning distortion is measured again. The residual scanning distortion is analyzed, and a residual scanning distortion component induced by a residual misalignment is determined again. The process is repeated until a residual scanning distortion component induced by a residual misalignment is below a predetermined threshold. The method of adjustment can be repeated during operation of a multi-beam charged particle microscope, and for example scanning induced aberrations induced by drifts of the multi-beam charged particle microscope can be compensated.

Figure 19:
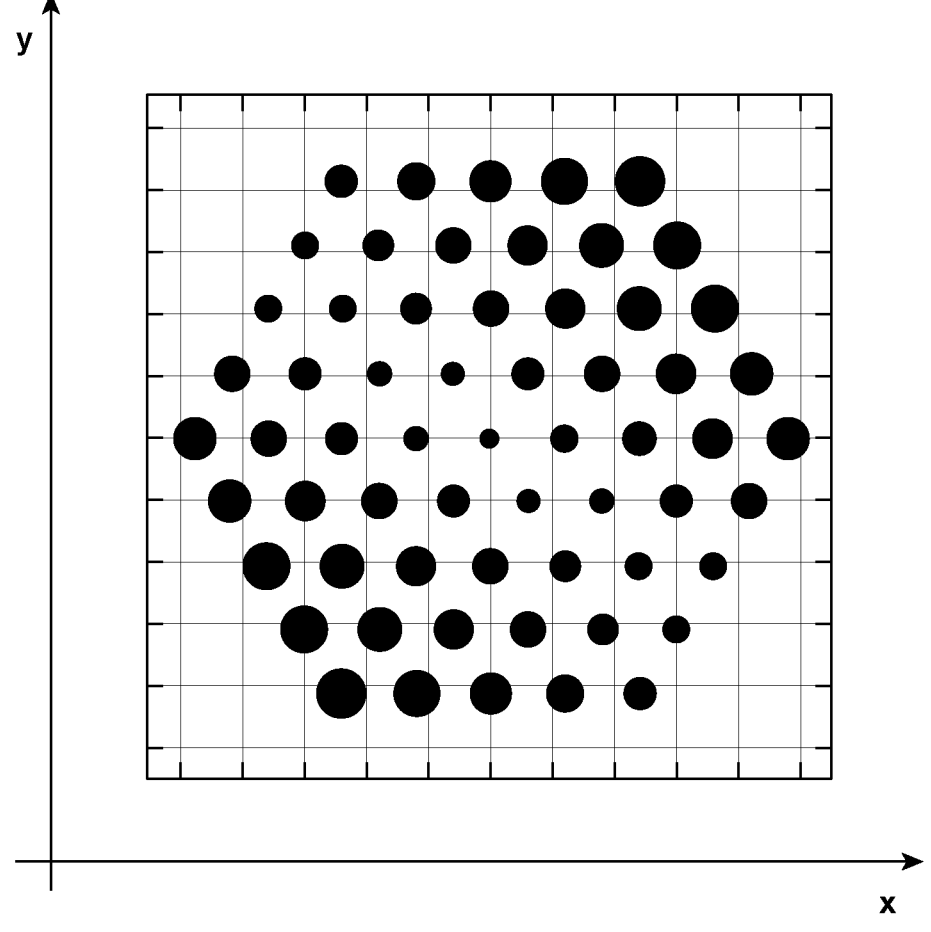
FIG. 19 illustrates a typical field dependency over image patch coordinates (x,y) of a scanning induced distortion aberration for a system with a misalignment.

A typical field dependency of a scanning distortion induced by a misalignment is illustrated in FIG. 19. Generally, a scanning distortion induced by a misalignment has a different field dependency compared to a residual scanning distortion of a perfectly aligned multi-beam charged particle microscope. In an example, the sensitivity of displacement of elements with respect to an ideal position on the different field dependencies of the scanning distortion can be determined, and the desired adjustments to achieve a perfectly adjusted multi-beam charged particle microscope can be derived from a measurement of the scanning distortion and determination of the field dependency of the scanning distortion.

In a sixth embodiment, an improved multi-beam charged particle microscope is provided with a collective multi-beam raster scanner 110 which is capable of a lateral displacement or a tilt. In an example, the lateral displacement or tilt is achieved by laterally displacing or tilting the electrostatic deflection field with respect to the intersection volume 189 by additional correction electrodes or by providing a plurality of predetermined voltage offset to the deflection electrodes and the correction electrodes of the first embodiment of the disclosure. In an alternative example, the collective multi-beam raster scanner 110 comprises a mechanical mechanism including a guidance element or stage and at least an actuator for adjustment of a lateral position or tilt angle of the deflection electrodes and optional correction electrodes to displace the electrostatic deflection field with respect to the intersection volume 189.

With the additional mechanism, a lateral displacement or tilt of the inhomogeneous deflection field with respect to the intersection volume 189 is provided and thereby an adjustment of the inhomogeneous deflection field with respect to the lateral position and mean propagation angle of the plurality of primary charged particle beamlets is achieved. A method of is for example provided by the generation of a quadrupole or multipole field in the intersection volume 189 in the collective deflection scanner 110.

The quadrupole or multipole field can be generated by application of predetermined voltage differences to the deflection electrodes, for example a first identical voltage difference provided to the first deflection electrodes for deflection scanning in the first direction and a second identical voltage difference provided to the second deflection electrodes for deflection scanning in the second difference. For example, the second voltage difference is given by the first voltage difference multiplied by −1. During the alignment or adjustment, the first and second voltage differences for generation of the quadrupole or multipole field is changed and a centric primary beamlet, which is travelling along the optical axis 105 of the charged particle microscope 1 is monitored. The lateral position or tilt angle of the quadrupole or multipole field is then changed until the focus position of the centric primary beamlet does not change during the change of the quadrupole or multipole field by changing the first and second voltage difference. If the quadrupole or multipole field is centered at the optical axis, the centric primary beamlets does not move at the wafer when the quadrupole or multipole field strength is changed. Thereby, the residual scanning distortion is minimized.

In a seventh embodiment, an improved multi-beam charged particle microscope is provided with a combination of the fifth and sixth embodiment; thereby, the inhomogeneous electrostatic deflection field inside the deflection scanner is laterally displaced with respect to the intersection volume by for example predetermined offset voltages provided to the plurality of electrodes and thereby the inhomogeneous electrostatic deflection field is for example adjusted with respect to an objective lens of the multi-beam charged particle microscope. Thereby, scanning aberrations induced by a misalignment of raster scanner 110 and for example objective lens 102 are compensated. With the first and second static deflectors, the plurality of primary charged particle beamlets is then laterally adjusted with respect to the adjusted position of the inhomogeneous electrostatic deflection field distribution.

Figure 20:
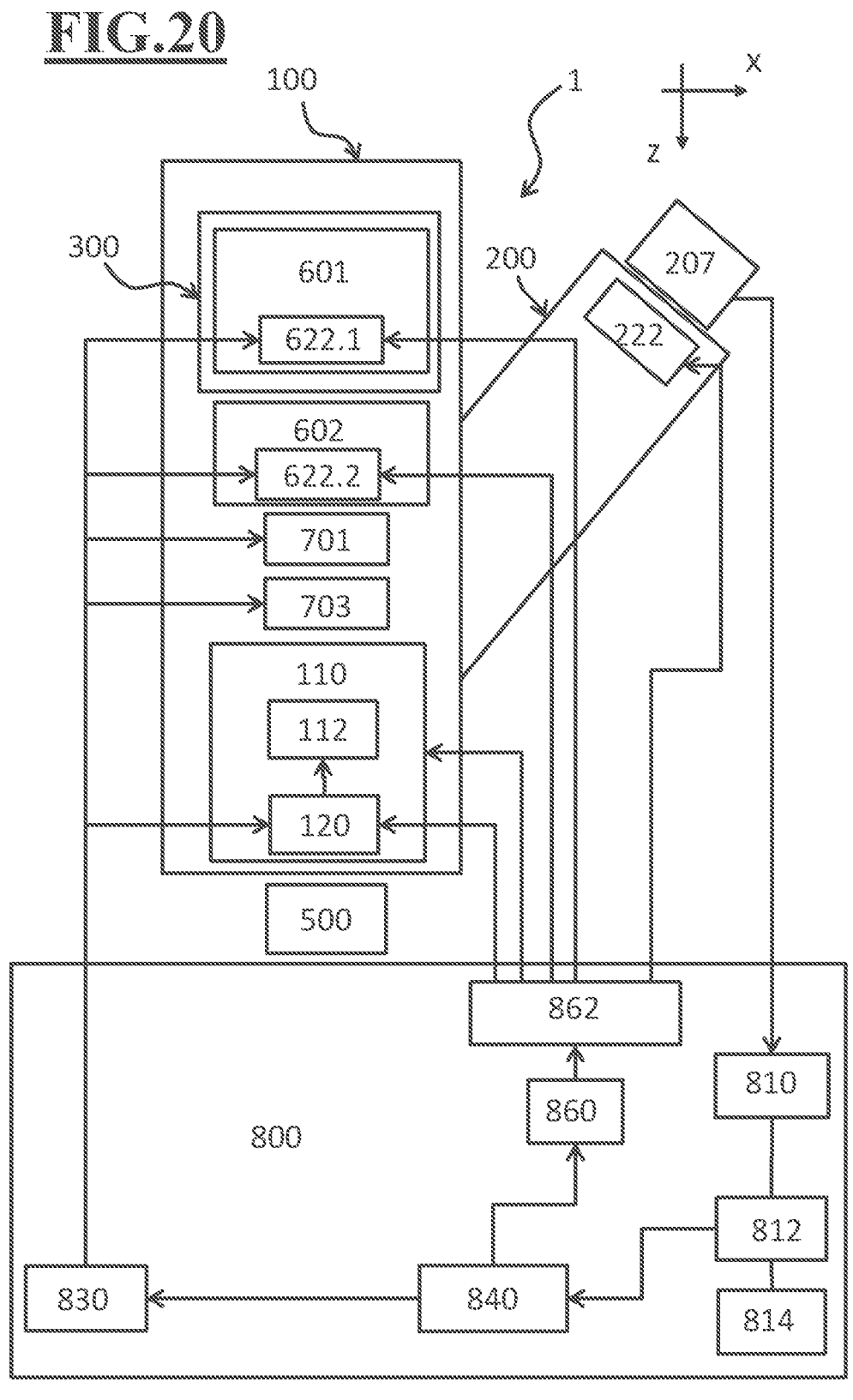
FIG. 20 illustrates a multi-beam charged particle microscope according the eighth embodiment of the disclosure.

According the embodiments of the disclosure, an improved multi-beamlet charged-particle microscopy system 1 and a method of operation of a multi-beamlet charged-particle microscopy system 1 to perform a wafer inspection task with high precision and high throughput is provided. The improved multi-beamlet charged-particle microscopy system 1 for wafer inspection has a mechanism to compensate or correct scanning induced aberrations such as scanning distortion, scanning telecentricity aberration or scanning induced astigmatism. In an eighth embodiment, the mechanism of the embodiments described above are combined and a maximum reduction of a scanning induced aberration is achieved. A multi-beamlet charged-particle microscope 1 for wafer inspection according the eighth embodiment is illustrated in FIG. 20. At the example of the eighth embodiment, the further details of an improved multi-beamlet charged-particle microscopy system 1 and the method of operation of each of the embodiments above are described. Same reference numbers are used as in the previous figures and reference is also made to the previous figures.

The multi-beam charged particle microscope 1 for wafer inspection comprises a charged-particle multi-beamlet generator 300 for generating a plurality of primary charged particle beamlets 3. The multi-beam charged particle microscope 1 is further comprising an object irradiation unit 100, comprising a first collective multi-beam raster scanner 110 for scanning each of the plurality of primary charged particle beamlets 3 in each image subfield over a wafer surface 25 arranged in an object plane 101 for the generation of a plurality of secondary electron beamlets 9 emitting from the wafer surface. The plurality of secondary electron beamlets 9 is imaged by a detection unit 200 and a second collective multi-beam raster scanner 222 for imaging the plurality of secondary electron beamlets 9 onto the image sensor 207 and for acquisition during use a digital image of a first image patch 17 of the wafer surface 25. The multi-beam charged particle microscope 1 further comprises a sample stage 500 for positioning and holding the wafer surface 25 in the object plane 101 during the acquisition of the digital image of the first image patch 17.

The multi-beam charged particle microscope 1 comprises a control unit 800. The control unit 800 further comprises an image data acquisition unit 810. During use, the electron sensitive image sensor 207 receives a large image data stream of image sensor data of the plurality of secondary electron intensity values and feeds image data to image data acquisition unit 810 of control unit 800. Image data acquisition unit 810 is configured to provide the sensor signal of the image sensor 207 to an image stitching unit 812. With reduced scanning induced aberrations, for example with reduced scanning induced distortion according the embodiments of the disclosure, fast image stitching without digital image processing is enabled, and the digital data from each image subfield is stitched together to form a digital image of the image patch with high speed and low computational effort. Thereby, the throughput of a wafer inspection task is improved. With the image stitching unit 812 configured for fast image stitching without digital image processing, the final digital images are directly provided to output unit 814, where the digital images are for example analyzed for defects or dimensions of semiconductor features.

The plurality of primary charged particle beamlets 3 propagate during use through an intersection volume 189 of the first collective multi-beam raster scanner 110 according the first embodiment of the disclosure. First scanning electrodes of the first collective multi-beam raster scanner 110 generate during use a first scanning deflection field distribution in the intersection volume 189 for long stroke scanning deflection of the plurality of primary charged particle beamlets 3. Second scanning electrodes of the first collective multi-beam raster scanner 110 generate during use a second deflection field distribution in the intersection volume for long stroke scanning deflecting the plurality of primary charged particle beamlets 3 in a second direction or q-direction, which is perpendicular to the first direction. The control unit 800 comprises a scanning deflection control module 860 configured for generation of the scanning deflection voltage differences VSp(t) and VSq(t) for scanning deflection of the plurality of primary charge particle beamlets 3 in the first or p-direction and the second or q-direction. An example of the scanning deflection voltage differences VSp(t) and VSq(t) is illustrated in FIG. 15.

The control unit 800 comprises an array of delay lines 862. The scanning deflection control module 860 of is configured to provide the scanning deflection voltage differences VSp(t) and VSq(t) to the array of delay lines 862, which is configured to generate a plurality of copies of the scanning deflection voltage differences VSp(t) and VSq(t) with time delays. For example, a first copy of the scanning deflection voltage difference VSp(t) with a first time delay t1 is provided to the first collective multi-beam raster scanner 110 for scanning deflection of the plurality of primary charged particle beamlets 3 in the first direction.

The first collective multi-beam raster scanner 110 further comprises a correction element 112 comprising a plurality of correction electrodes according the first embodiment, as for example correction electrodes 185, 187, 193 or 195 as illustrated in FIG. 8 and FIG. 10. The correction element 112 is configured to generate a variable inhomogeneity of the electrostatic deflection field distribution in the intersection volume for reduction of a scanning induced distortion during a scanning deflection of the plurality of primary charged particle beamlets 3. The first collective multi-beam raster scanner 110 further comprises a scanning correction control module 120 with a static voltage conversion array, which is connected to the scanning deflection control module 860 via one delay line of the array of delay lines 862. Scanning correction control module 120 is configured in analogy to scanning array control unit 622 of the second embodiment. As described above, elements and features of the scanning array control unit 622 of FIG. 13 and FIG. 14 can be applied in analogy to other scanning correction elements such as the correction element 112.

The array of delay lines 862 is configured to provide a second copy of the scanning deflection voltage differences VSp(t) and VSq(t) with a second time delay t2 to the scanning correction control module 120. The scanning correction control module 120 further comprises a static voltage reduction unit, which reduces the second copy of the scanning deflection voltage differences VSp(t) and VSq(t) to first correction voltage differences VC1p(t) and VC1q(t), used for generation of a predetermined inhomogeneity of the electrostatic field distribution. The first correction voltage difference VC1p(t) is for example at least one order of magnitude smaller than the scanning deflection voltage difference VSp(t) for scanning deflection in the first or p-direction. From the first correction voltage differences VC1p(t) and VC1q(t), a plurality of correction voltage differences is generated by the static voltage conversion array of scanning correction control module 120. In an example, the static voltage conversion array is as programmable resistor array as illustrated in FIGS. 13 and 14. The plurality of correction voltage differences is provided to the plurality of correction electrodes of correction element 112. The programmable resistor array of scanning correction control module 120 is controlled by a plurality of first static control signals, stored in a memory of scanning correction control module 120. During a calibration step, the plurality of first static control signals can be changed by primary beam-path control module 830.

The array of delay lines 862 is further configured to provide a third copy of the scanning deflection voltage differences VSp(t) and VSq(t) with a third time delay t3 to the second collective multi-beam raster scanner 222 for scanning the plurality of secondary electron beamlets 9. Thereby, the beam spots of the secondary electron beamlets 9 are kept constant at the image detector 207.

The multi-beam charged particle microscope 1 includes a scanning distortion compensator array 601 with a first scanning array control unit 622.1 according the second embodiment of the disclosure. The first scanning array control unit 622.1 is connected to the scanning deflection control module 860 via the array of delay lines 862. The array of delay lines 862 is configured to provide a fourth copy of the scanning deflection voltage differences VSp(t) and VSq(t) with a fourth time delay t4 to the first scanning array control unit 622.1. The first scanning array control unit 622.1 comprises a static voltage reduction unit, which reduces the fourth copy of the scanning deflection voltage differences VSp(t) and VSq(t) to second correction voltage differences VC2$p$(t) and VC2$q$(t), used for generation of a predetermined maximum deflection of a beamlet by the scanning distortion compensator array 601. The second correction voltage difference VC2$p$(t) is for example at least two orders of magnitude smaller than the scanning deflection voltage difference VSp(t) for scanning deflection in the first or p-direction. In the description above, VCAp(t) was used as symbol for VC2$p$(t).

The multi-beam charged particle microscope 1 includes a scanning compensator array 602 for compensation of a scanning induced telecentricity error according the third embodiment of the disclosure. The scanning compensator array 602 comprises a second scanning array control unit 622.2. The second scanning array control unit 622.2 is connected to the scanning deflection control module 860 via the array of delay lines 862. The array of delay lines 862 is configured to provide a fifth copy of the scanning deflection voltage differences VSp(t) and VSq(t) with a fifth time delay t5 to the second scanning array control unit 622.2. The second scanning array control unit 622.2 comprises a static voltage reduction unit, which reduces the fifth copy of the scanning deflection voltage differences VSp(t) and VSq(t) to third correction voltage differences VC3$p$(t) and VC3$q$(t), used for generation of a predetermined maximum correction of a propagation angle of a beamlet by scanning compensator array 602 for compensation of a scanning induced telecentricity error. The third correction voltage difference VC3$p$(t) is for example at least two orders of magnitude smaller than the scanning deflection voltage difference VSp(t) for scanning deflection in the first or p-direction.

By providing the plurality of copies of the scanning deflection voltage differences VSp(t) and VSq(t) with a plurality of predetermined time delays, the compensation of scanning induced aberrations by for example scanning distortion compensator array 601 and scanning compensator array of telecentricity aberration 602 is synchronized with the scanning deflection of the plurality of charged particle beamlets 3. The first to fifth time delays t1 . . . t5 are for example determined during the design and adjusted in a setup or calibration step of the multi-beam charged particle microscope 1 and stored in the array of delay lines 862.

The multi-beam charged particle microscope 1 of the eighth embodiment further includes a first static deflector 701 according the fifth embodiment of the disclosure, which is connected to primary beam-path control module 830. The static adjustment control unit 870 illustrated in FIG. 18 can be a part of the primary beam-path control module 830. During a calibration step, a lateral position of the plurality of primary charged particle beamlets at the first collective multi-beam raster scanner 110 is determined. During use, the multi-beam charged particle microscope 1 is configured to adjust the lateral position of the plurality of primary charged particle beamlets at the intersection volume 189 of the first collective multi-beam raster scanner 110 with the first static deflector 701. The multi-beam charged particle microscope 1 includes a second static deflector 703, which is connected to primary beam-path control module 830. During a calibration step, the mean angle of incidence of the plurality of primary charged particle beamlets at the intersection volume of first collective multi-beam raster scanner 110 is determined. During use, the multi-beam charged particle microscope 1 is configured to adjust the mean angle of incidence of the plurality of primary charged particle beamlets 3 at the intersection volume 189 of the first collective multi-beam raster scanner 110 with the second static deflector 703.

The scanning correction control module 120 and first and second scanning array control units 622.1 and 622.2 are further connected to the primary beam-path control module 830, where depending on a calibration result or by other approaches, adjusted static control signals for the static voltage conversion units are provided as described in the fourth embodiment of the disclosure. Primary beam-path control module 830 is connected to control operation processor 840, which derives for example from a calibration measurement according the fourth embodiment an actual set of static control signals from a calibration step including a measurement step of the scanning induced distortion.

In an example, the image stitching unit 812 is connected to control operation processor 840 and image stitching unit 812 is configured to derive and provide a stitching quality parameter to the control operation processor 840. If the stitching quality parameter is below a predetermined threshold, the control operation processor 840 is configured to start a calibration of the multi-beam charged particle microscope 1 for generation of an actualized set of control signals for compensation of the scanning induced distortion. An example of a stitching quality parameter is an image contrast in an overlapping area 39 of two adjacent image subfields, as illustrated in FIG. 2. With the reduced scanning induced aberrations of below for example 0.3 nm, such as below 0.1 nm, an image stitching without digital image processing is possible and an image stitching by superposition of the digital image data from two image subfields in the overlapping area 39 generates a high image contrast. Residual scanning induced distortions by for example drifts or misalignments of the multi-beam charged particle microscope 1 degenerate the image contrast in the overlapping areas 39. Image contrast in the overlapping area 39 is an example of a stitching quality parameter and can be used as an indicator of the quality of the compensation or correction of scanning induced aberrations and therefore as an indicator of for example drifts or misalignments of the multi-beam charged particle microscope 1. In a calibration step, the scanning induced aberration is determined for each of the image subfields. For example, control operation processor 840 is configured to analyze the scanning induced distortion [dp, dq](p,q;$x_{ij}$,$y_{ij}$) for example by expansion of the scanning induced distortion as described in the fourth embodiment, and control operation processor 840 is configured to derive a plurality of actualized static controls signals for the correction elements 112 of collective multi-beam raster scanner 110, the scanning distortion compensator array 601, the scanning compensator array of telecentricity aberration 602, the first static multi-beam deflection system 701 and the second static multi-beam deflection system 703. Control operation processor 840 is configured to provide the plurality of actualized static controls signals to the primary beampath control module 830, which is configured to provide the plurality of actualized static controls signals to the individual compensators or correction elements 112, 601, 602, 701 or 702 of the multi-beam charged particle microscope 1.

The embodiments described above an optionally applied to the primary beam path 13 for compensation of scanning induced aberrations during a scanning or the plurality of primary charged particles 3. However, it is also possible to apply an embodiment to the secondary beam-path 11 and thereby correct for example a scanning induced contrast variation. Reference is hereby made to FIG. 1. The plurality of secondary electron beamlets is deflection scanned by a combination of the first collective multi-beam raster scanner 110 and the second collective multi-beam raster scanner 222 and an image contrast is controlled for example by the aperture filter 214. Scanning induced aberrations in the secondary beam-path 11 such as a scanning induced telecentricity aberration of the secondary electron beamlets 11 lead to a scanning induced contrast variation, which can be compensated by a multibeam scanning correction system in analogy to the second or third embodiment, arranged in the secondary beam-path 11 for example at position of element 220.

With the multi-beam charged particle microscope and the method of operating the multi-beam charged particle microscope, for example a scanning induced distortion is compensated. The collective multi-beam raster scanner (110) is forming an intersection volume (189) and is configured for performing a collective raster scanning of the plurality of primary beamlets (3) to form an image scan of the image patch (17). The plurality of primary beamlets are comprising at least the first primary beamlet (3.55) being scanned over a first image subfield (31.55) and the second primary beamlet (3.15) being synchronously scanned over a second image subfield (31.15) of the image patch (17). The first primary beamlet is traversing the intersection volume (189) at a first angle β1 and the second primary beamlet is traversing the intersection volume (189) at a second angle β2 different from the first angle β1. Therefore, with a conventional raster scanner and method of operation of a conventional raster scanner, a significant difference in the scanning induced distortions between the first beamlet and the second beamlet is generated. With the first scanning corrector (601), connected to a control unit (800), the scanning induced distortion difference between the first primary beamlet (3.55) in the first image subfield (31.55) and the second primary beamlet (3.15) in the second image subfield (31.15) is reduced. In addition and similar to the scanning induced distortion difference, a scanning induced telecentricity difference between the first primary beamlet (3.55) in the first image subfield (31.55) and the second primary beamlet (3.15) in the second image subfield (31.15) is compensated by the second scanning compensator array of telecentricity aberration 602.

The first, collective raster scanner 110 is configured for a long stroke raster scanning of each beamlet over a corresponding image subfield with a dimension of about 8 μm to 12 μm, for example D=10 μm with a scanning range of +/−5 μm. The first scanning corrector (601) forms a second, short stroke raster scanner, by which the scanning induced distortions of each beamlet are corrected individually with a small scanning range of for example up to 5 nm. Thereby, scanning induced distortions are reduced and raster scan coordinates are achieved with a precision better than 3 orders of magnitude, for example for a scanning coordinate of 5.0 μm with an accuracy better of 0.5 nm, such as 0.3 nm or even below.

The disclosure is of importance for multi-beam charged particle systems, when a plurality of primary charged particle beamlets traverse the intersection volume at different angles. A multi-beam charged particle microscope comprises a multi-beamlet generator for generating a plurality of primary beamlets. In such a multi-beam charged particle microscope (1) the beamlet generator generates at least a first and a second primary charged particle beamlet (3.0, 3.1, 3.2) and the first scanning corrector is further comprising a plurality of deflection elements configured to individually compensate during use a scanning induced distortion of for example the second primary charged particle beamlet (3.1 or 3.2). A multi-beam charged particle microscope further comprises an object irradiation unit for illuminating plurality of image subfields, together forming an image patch on a surface of a sample arranged in an object plane by the plurality of primary beamlets, thereby generating during use a plurality of secondary electron beamlets emitting from the surface, and a detection unit with a projection system and an image sensor for imaging the plurality of secondary electron beamlets onto the image sensor, for acquisition during use a digital image of the image patch of the surface of the sample. The multi-beam microscope for wafer inspection according an embodiment further comprises a collective multi-beam raster scanner. The collective multi-beam raster scanner comprises at least a first set of deflection electrodes and an intersection volume between the first set of deflection electrodes, the plurality of primary beamlets traversing the intersection volume. The intersection volume is configured for transmission of the plurality of primary beamlets, which are incident on the intersection volume at different angles of incidence. The multi-beam charged particle microscope further comprises at least a first scanning corrector or compensation element for correction of a scanning induced aberration. The first scanning corrector is configured to generate during use a first scanning electrostatic field for influencing at least the first individual beamlet.

A multi-beam charged particle microscope according an embodiment of the disclosure comprises a beamlet generator for generating a plurality of primary charged particle beamlets, an object irradiation unit 100 for illuminating an image subfield on a surface 25 of a sample 7 arranged in an object plane 101, thereby generating during use a plurality of secondary electron beamlet 9 emitting from a focus points 5 of the primary beamlets 3 within each image subfield. The subfield has typically a lateral extension of at least 5 μm, such as 8 μm, 12 μm or more. The object irradiation unit 100 further comprises first to third electrostatic or magnetic lenses and an objective lens 102. The multi-beam charged particle microscope 1 further comprises a detection unit 200 for acquisition during use a digital image of each image subfield of the surface of the sample. The detection unit 200 comprises an electron sensor 207 and optional electrostatic or electromagnetic deflection elements 222. The multi-beam charged particle microscope 1 further comprises an electro-magnetic beam splitting system 400 for guiding the primary beamlets 3 along the primary beam-path 13 and guiding the secondary beamlets 9 along the secondary beam-path 11. The secondary beamlets 9, collected by objective lens 102, are propagating opposite to the primary beamlets 3 and are therefore separated from the primary beamlets 3 by the magnetic beam splitting system 400.

The multi-beam charged particle microscope 1 for wafer inspection according an embodiment further comprises a long stroke collective raster scanner 110. The collective raster scanner 110 comprises at least a first set of deflection electrodes (181) and an intersection volume 189 between the first set of deflection electrodes (181), the plurality of primary charged particle beamlets 3 traversing the intersection volume 189. The charged particle microscope 1 for wafer inspection according the ninth embodiment further comprises a control unit 800, configured to provide during use at least a first scanning voltage difference VSp(t) to the first set of deflection electrodes (181) for generation of an electrostatic deflection field in the intersection volume 189 for long stroke scanning deflection of the plurality of first primary charged particle beamlets 3 in a first or p-direction, thereby scanning during use the primary beamlet over the entire image subfield with an extension above 1 μm, for example of about 8-10 μm.

The multi-beam charged particle microscope 1 further comprises at least a first scanning corrector 112 for correction of a scanning induced aberration of the plurality of primary charged particle beamlets 3. The first scanning corrector 112 is configured to generate during use a first scanning electrostatic field for influencing the plurality of primary beamlets 3, and the control unit 800 is further configured to provide the first scanning voltage difference VSp(t) to the first scanning corrector 112, the first scanning corrector being configured to reduce a scanning induced aberration of at least a first primary charged particle beamlet 3.1. In an example, the first scanning corrector 112 comprises a first static voltage conversion unit for conversion of the first scanning voltage difference VSp(t) into at least a first scanning correction voltage difference VCp(t), adapted to generate the first scanning correction field by the scanning correction electrodes 185 synchronized with the first scanning voltage difference VSp(t). As illustrated above, the static voltage conversion unit can comprise at least a programmable resistor sequence, configured to be programmed by a plurality of static control signals for generation of the scanning correction voltage difference VCp(t). The first scanning corrector 112 is therefore connected to the primary beam-path control module 830. In an example, the first static voltage conversion unit is configured to generate the first scanning correction voltage difference VCp(t) proportional to or in linear dependence from the first scanning voltage difference VSp(t). In order to synchronize the correction of a scanning induced aberration, the control unit 800 is further comprising an array of delay lines 862, comprising at least a first delay line configured to synchronize the first scanning corrector field with the long stroke scanning deflection of the plurality of primary charged particle beamlets 3 by the raster scanner (110). With the elements described above, the first scanning corrector 112, comprising at least a first short stroke deflection element 185, is configured to compensate during use a scanning induced aberration, for example a scanning induced astigmatism of an amount of about 0.5 nm to 3 nm to below a residual scanning induced astigmatism of below 0.3 nm, such as below 0.2 nm or 0.1 nm. In an example, the first correction element 185 is configured to individually compensate during use a scanning induced astigmatism of the first primary charged particle beamlet 3.1 synchronized with the scanning deflection of first primary charged particle beamlet 1003 by the raster scanner 1110 in the first direction.

In another example, a residual distortion is compensated. While the primary beamlet 3.1 is scanned over the image subfield with an extension of above 1 μm by the long stroke scanning deflector 110, the first scanning corrector 112 acts during use like a synchronized short stroke deflector to compensate a scanning induced distortion of about up to 5 nm by synchronized short stroke scanning deflection of the primary beamlet 3.1 in an opposite direction of the scanning induced distortion. In an example, the first scanning corrector 112 is comprising a second correction element 187 configured to individually compensate during use a scanning induced distortion of the first primary charged particle beamlet 3.1 in a second direction synchronized with the scanning deflection of first primary charged particle beamlet 3.1 by the collective raster scanner 110 in the first direction perpendicular to the second direction.

A multi-beam charged particle microscope 1 with reduced scanning induced aberrations according the ninth embodiment comprises a long stroke deflection system 110 for a long stroke deflection of the plurality of primary charged particle beamlets 3, generated by a deflection voltage difference VSp(t) applied to the deflection system 110, and a scanning correction system for correction of a scanning induced aberration of each individual beamlet of the plurality of primary beamlets, to which during use a correction voltage difference VC(t) is provided. The correction voltage difference VC(t) is generated from the deflection voltage difference Vp(t) with a static voltage conversion unit, for example a programmable resistor sequence or array, controlled by a set of static control signals. Thereby, small scanning induced aberrations of for example 0.5 nm to 5 nm are effectively reduced to residual aberrations of below 0.3 nm, such as below 0.2 nm or even below 0.1 nm.

The disclosure and some embodiments might be further described by using clauses. The disclosure shall however not be limited to the clauses.

Clause 1: A multi-beam charged particle microscope (1) for wafer inspection, comprising:

a charged-particle multi-beamlet generator (300) for generating a plurality of primary charged particle beamlets (3)

an object irradiation unit (100) for illuminating an image patch (17.1) on a wafer surface (25) arranged in an object plane (101) by the plurality of primary charged particle beamlets (3), thereby generating during use a plurality of secondary electron beamlets (9) emitting from the wafer surface (25), a detection unit (200) with a projection system (205) and an image sensor (207) for imaging the plurality of secondary electron beamlets (9) onto the image sensor (207), and for acquisition during use a digital image of the image patch (17.1) of the wafer surface (25), a collective multi-beam raster scanner (110) comprising at least a first set of deflection electrodes and an intersection volume (189), the plurality of primary charged particle beamlets (3) traversing during use the intersection volume (189), a control unit (800), configured to provide during use at least a first scanning voltage difference VSp(t) to the first set of deflection electrodes for scanning deflection of the plurality of primary charged particle beamlets (3) in a first or p-direction, wherein the collective multi-beam raster scanner (110) is configured to generate a predetermined inhomogeneous scanning deflection field distribution in the intersection volume (189) for reduction of a scanning induced aberration of a first primary charged particle beamlet incident on the intersection volume (189) at an inclination angle β1 deviating from an optical axis of the multi-beam charged particle microscope (1).

Clause 2: The multi-beam charged particle microscope (1) according clause 1, wherein a deflection electrode of the first set of deflection electrodes is configured with two spatially separated electrodes and the control unit (800) configured to provide during use first and second scanning voltage differences VSp1(*t*) and VSp2(*t*) to the two spatially separated electrodes, wherein the first and second scanning voltage differences VSp1(*t*) and VSp2(*t*) are different.

Clause 3: The multi-beam charged particle microscope (1) according clause 1 or 2, wherein the collective multi-beam raster scanner (110) comprises a second set of deflection electrodes for generation during use a second predetermined inhomogeneous scanning deflection field distribution, the plurality of primary charged particle beamlets (3) traversing the second predetermined inhomogeneous scanning deflection field distribution in the intersection volume (189) for scanning deflection of the plurality of primary charged particle beamlets (3) in a second or q-direction, and the control unit (800) configured to provide during use at least a second scanning voltage difference VSq(t) to the second set of deflection electrodes.

Clause 4: The multi-beam charged particle microscope (1) according clause 4, wherein the shape and geometry of the at least first set or second set of deflection electrodes of the collective multi-beam raster scanner (110) is adapted to a cross section of the intersection volume (189) of the plurality of primary charged particle beamlets (3).

Clause 5: The multi-beam charged particle microscope (1) according clause 3 or 4, wherein in mean direction of propagation of the plurality of primary charged particles (3), the first set of deflection electrodes and the second set of deflection electrodes have a different length.

Clause 6: The multi-beam charged particle microscope (1) according any of the clauses 1 to 5, wherein the collective multi-beam raster scanner (110) further comprises a first set of correction electrodes (185, 193) configured for generation during use a predetermined scanning correction field contributing to the predetermined inhomogeneous electrostatic field distribution.

Clause 7: The multi-beam charged particle microscope (1) according clauses 6, wherein an electrode (185.1, 185.2, 185.3, 185.4) of the first set of correction electrodes is arranged outside of the intersection volume (189) in a space between an electrode of the first set of deflection electrodes and an electrode of the second set of deflection electrodes.

Clause 8: The multi-beam charged particle microscope (1) according any of the clauses 6 or 7, wherein the collective multi-beam raster scanner (110) further comprises a second set of correction electrodes (187, 195) configured for generation during use a predetermined second scanning correction field contributing to the predetermined inhomogeneous electrostatic field distribution.

Clause 9: The multi-beam charged particle microscope (1) according any of the clauses 1 to 8, wherein the collective multi-beam raster scanner (110) is configured to adjust the lateral position of the predetermined inhomogeneous scanning deflection field distribution with respect to the intersection volume, and the control unit (800) is configured to provide during use a voltage offset to at least one of the first set of deflection electrodes or the second set of deflection electrodes.

Clause 10: The multi-beam charged particle microscope (1) according any of the clauses 1 to 9, further comprising a first static deflection system (701) arranged between the charged-particle multi-beamlet generator (300) and the collective multi-beam raster scanner (110) arranged and configured for adjusting a lateral position of the plurality of primary charged particle beamlets (3) with respect to the intersection volume (189).

Clause 11: The multi-beam charged particle microscope (1) according any of the clauses 1 to 10, further comprising a second static deflection system (701) between the a charged-particle multi-beamlet generator (300) and the collective multi-beam raster scanner (110) arranged and configured for adjusting a mean angle of incidence of the plurality of primary charged particle beamlets (3) at the entrance side of the intersection volume (189).

Clause 12: The multi-beam charged particle microscope (1) according any of the clauses 1 to 11, further comprising a scanning distortion compensator array (601) with a plurality of deflection elements arranged at a plurality of apertures and a first scanning array control unit (622.1) with a first static voltage conversion array, configured to provide a plurality of first correction voltage differences to each of the plurality of deflection elements to compensate a scanning induced aberration during an image scan for each of the primary charged particle beamlets (3).

Clause 13: The multi-beam charged particle microscope (1) according clause 12, wherein by the first scanning array control unit (622.1), each of the plurality of first correction voltage differences is connected to at least one of the scanning voltage difference VSp(t) or VSq(t) for scanning of the plurality primary charged particle beamlets (3) by the collective multi-beam raster scanner (110).

Clause 14: The multi-beam charged particle microscope (1) according any of the clauses 1 to 13, further comprising a scanning compensator array (602) for compensation of a scanning induced telecentricity aberration, arranged in the proximity of an intermediate image plane (321) of the multi-beam charged particle microscope (1), with a plurality of deflection elements arranged at a plurality of apertures and a second scanning array control unit (622.2) with a second static voltage conversion array, configured to provide a plurality of second correction voltage differences to each of the plurality of deflection elements to compensate a scanning induced telecentricity aberration during an image scan for each of the primary charged particle beamlets (3).

Clause 15: The multi-beam charged particle microscope (1) according clause 14, wherein each of the plurality of second correction voltage differences comprises a voltage difference which is connected to at least one of the scanning voltage difference VSp(t) or VSq(t) for scanning of the plurality primary charged particle beamlets (3) by the collective multi-beam raster scanner (110).

Clause 16: A multi-beam charged particle microscope (1) for wafer inspection, comprising:
  a charged-particle multi-beamlet generator (300) for generating a plurality of primary charged particle beamlets (3),
  an object irradiation unit (100) for illuminating an image patch (17.1) on a wafer surface (25) arranged in an object plane (101) by the plurality of primary charged particle beamlets (3), thereby generating during use a plurality of secondary electron beamlets (9) emitting from the wafer surface (25),
  a detection unit (200) with a projection system (205) and an image sensor (207) for imaging the plurality of secondary electron beamlets (9) onto the image sensor (207), and for acquisition during use a digital image of the image patch (17.1) of the wafer surface (25),
  a collective multi-beam raster scanner (110),
  a scanning distortion compensator array (601) arranged in propagation direction of the plurality of primary charged particles upstream of the collective multi-beam raster scanner (110), with a plurality of apertures, each of the plurality of apertures configured for transmitting during use a corresponding primary charged particle beamlet of the plurality of primary charged particle beamlets, the plurality of apertures comprising a plurality of first deflection elements for individually deflecting each corresponding primary charged particle beamlet in a first or p-direction and a plurality of second deflection elements for individually deflecting each corresponding primary charged particle beamlet in a second or q-direction perpendicular to the first direction, each of the plurality of deflection elements arranged in the circumference of each of the plurality of apertures,
  a control unit (800), configured to provide during use at least a first scanning voltage difference VSp(t) to the collective multi-beam raster scanner (110) for scanning deflection of the plurality of primary charged particle beamlets (3) in the first or p-direction,
  wherein the scanning distortion compensator array (601) further comprises a scanning array control unit (622) with a first static voltage conversion array (611), configured to provide a plurality of first correction voltage differences to the plurality of first deflection elements and a second static voltage conversion array (612) configured to provide a plurality of second correction voltage differences to the plurality of second deflection elements to compensate a scanning induced aberration during the scanning deflection of the plurality of primary charged particle beamlets (3) in the first direction.

Clause 17: The multi-beam charged particle microscope (1) for wafer inspection according clause 16, wherein the first static voltage conversion array (611) is coupled to the control unit (800) and configured to provide to each of the plurality of first and second deflection elements at least a plurality of first voltage difference components synchronized with the first scanning voltage difference VSp(t).

Clause 18: The multi-beam charged particle microscope (1) according clause 16 or 17, wherein the control unit (800) is configured to provide during use a second scanning voltage difference VSq(t) to the collective multi-beam raster scanner (110) for scanning deflection of the plurality of primary charged particle beamlets (3) in a second or q-direction.

Clause 19: The multi-beam charged particle microscope (1) for wafer inspection according clause 18, wherein the first static voltage conversion array (611) and the second static voltage conversion array (612) are coupled to the control unit (800) and configured to provide to each of the plurality of first and second deflection elements at least a plurality of second voltage difference components synchronized with the second scanning voltage difference VSq(t).

Clause 20: The multi-beam charged particle microscope (1) for wafer inspection according clauses 18 or 19, wherein the first static voltage conversion array (611) is coupled to the control unit (800) and configured to provide to each of the plurality of first deflection elements at least a first voltage difference component synchronized with the first scanning voltage difference VSp(t) and a second voltage difference component synchronized with the second scanning voltage difference VSq(t).

Clause 21: The multi-beam charged particle microscope (1) according any of the clauses 16 to 20, wherein the first or second static voltage conversion array (611, 612) is configured as a programmable resistor array.

Clause 22: The multi-beam charged particle microscope (1) according any of the clauses 16 to 21, wherein the collective multi-beam raster scanner (110) comprises at least a first set of deflection electrodes and an intersection volume (189), the plurality of primary charged particle beamlets (3) traversing the intersection volume (189), wherein the collective multi-beam raster scanner (110) is configured to generate a predetermined inhomogeneous scanning deflection field distribution in the intersection volume (189) for reduction of a scanning induced aberration of a primary charged particle beamlet incident on the intersection volume (189) at an inclination angle β deviating from an optical axis of the multi-beam charged particle microscope (1).

Clause 23: The multi-beam charged particle microscope (1) according clause 22, wherein a deflection electrode of the first set of deflection electrodes is configured with two spatially separated electrodes and the control unit (800) configured to provide during use first and second scanning voltage differences VSp1(t) and VSp2(t) to the two spatially separated electrodes, wherein the first and second scanning voltage differences VSp1(t) and VSp2(t) are different.

Clause 24: The multi-beam charged particle microscope (1) according clause 22 or 23, wherein the collective multi-beam raster scanner (110) comprises a second set of deflection electrodes for generation during use a second predetermined inhomogeneous scanning deflection field distribution, the plurality of primary charged particle beamlets (3) traversing the second predetermined inhomogeneous scanning deflection field distribution in the intersection volume (189) for scanning deflection of the plurality of primary charged particle beamlets (3) in a second or q-direction.

Clause 25: The multi-beam charged particle microscope (1) according clause 24, wherein the shape and geometry of the at least first set or second set of deflection electrodes of the collective multi-beam raster scanner (110) is adapted to a cross section of the intersection volume (189) of the plurality of primary charged particle beamlets (3).

Clause 26: The multi-beam charged particle microscope (1) according clause 24 or 25, wherein in mean direction of propagation of the plurality of primary charged particles (3), the first set of deflection electrodes and the second set of deflection electrodes have a different length.

Clause 27: The multi-beam charged particle microscope (1) according any of the clauses 16 to 26, wherein the collective multi-beam raster scanner (110) further comprises a first set of correction electrodes (185, 193) configured for generation during use a predetermined scanning correction field contributing to the predetermined inhomogeneous electrostatic field distribution.

Clause 28: The multi-beam charged particle microscope (1) according clause 27, wherein an electrode (185.1, 185.2, 185.3, 185.4) of the first set of correction electrodes is arranged in a space between an electrode of the first set of deflection electrodes and an electrode of the second set of deflection electrodes.

Clause 29: The multi-beam charged particle microscope (1) according any of the clauses 27 or 28, wherein the collective multi-beam raster scanner (110) further comprises a second set of correction electrodes (187, 195) configured for generation during use a predetermined second scanning correction field contributing to the predetermined inhomogeneous electrostatic field distribution.

Clause 30: The multi-beam charged particle microscope (1) according any of the clauses 16 to 29, wherein the collective multi-beam raster scanner (110) is configured to adjust the lateral position of the predetermined inhomogeneous scanning deflection field distribution with respect to the intersection volume, and the control unit (800) is configured to provide during use a voltage offset to at least one of the first set of deflection electrodes or the second set of deflection electrodes.

Clause 31: The multi-beam charged particle microscope (1) according any of the clauses 16 to 30, further comprising a first static deflection system (701) arranged between the charged-particle multi-beamlet generator (300) and the collective multi-beam raster scanner (110) arranged and configured for adjusting a lateral position of the plurality of primary charged particle beamlets (3) with respect to the intersection volume (189).

Clause 32: The multi-beam charged particle microscope (1) according any of the clauses 16 to 31, further comprising a second static deflection system (701) between the charged-particle multi-beamlet generator (300) and the collective multi-beam raster scanner (110) arranged and configured for adjusting a mean angle of incidence of the plurality of primary charged particle beamlets (3) at the entrance side of the intersection volume (189).

Clause 33: The multi-beam charged particle microscope (1) according any of the clauses 16 to 32, further comprising a scanning compensator array (602) for compensation of a scanning induced telecentricity aberration, arranged in the proximity of an intermediate image plane (321) of the multi-beam charged particle microscope (1), with a plurality of deflection elements arranged at a plurality of apertures and a second scanning array control unit (622.2) with a second static voltage conversion array, configured to provide a plurality of second correction voltage differences to each of the plurality of deflection elements to compensate a scanning induced telecentricity aberration during an image scan for each of the primary charged particle beamlets (3).

Clause 34: The multi-beam charged particle microscope (1) according any of the clauses 16 to 33, further comprising a further scanning compensator array for compensation of a scanning induced aberration, such as scanning induced astigmatism of focus plane deviation of each beamlet of the plurality primary charged particle beamlets (3).

Clause 35: A multi-beam charged particle microscope (1), for wafer inspection, comprising:

a charged-particle multi-beamlet generator (300) for generating a plurality of primary charged particle beamlets (3)

an object irradiation unit (100) for illuminating an image patch (17.1) on a wafer surface (25) arranged in an object plane (101) by the plurality of primary charged particle beamlets (3), thereby generating during use a plurality of secondary electron beamlets (9) emitting from the wafer surface (25), a detection unit (200) with a projection system (205) and an image sensor (207) for imaging the plurality of secondary electron beamlets (9) onto the image sensor (207), and for acquisition during use a digital image of the image patch (17.1) of the wafer surface (25), a collective multi-beam raster scanner (110 with at least a first set of deflection electrodes and an intersection volume (189), the plurality of primary charged particle beamlets (3) traversing during use the intersection volume (189), a control unit (800), configured to provide during use at least a first scanning voltage difference VSp(t) to the collective multi-beam raster scanner (110) for scanning deflection of the plurality of primary charged particle beamlets (3) in the first or p-direction, a first static deflection system (701) arranged between the charged-particle multi-beamlet generator (300) and the collective multi-beam raster scanner (110), configured for adjusting a lateral position of the plurality of primary charged particle beamlets (3) with respect to the intersection volume (189).

Clause 36: The multi-beam charged particle microscope (1) according clause 35, further comprising a second static deflection system (701) between the a charged-particle multi-beamlet generator (300) and the collective multi-beam raster scanner (110) arranged and configured for adjusting a mean angle of incidence of the plurality of primary charged particle beamlets (3) at the entrance side of the intersection volume (189).

Clause 37: A method of operating a multi-beam charged particle microscope (1) with a charged-particle multi-beamlet generator (300), an object irradiation unit (100), a detection unit (200), a collective multi-beam raster scanner (110) for collective raster scanning of a plurality of primary charged particle beamlets (3), and a scanning distortion compensator array (601) arranged in propagation direction of the plurality of primary charged particles upstream of the collective multi-beam raster scanner (110), and a control unit (800), comprising the steps of providing at least a first scanning voltage difference VSp(t) to a scanning array control unit (622),

generating a plurality of voltage difference components from at least the first voltage difference VSp(t) and a plurality of control signals, providing the plurality of voltage difference components to a plurality of deflection elements of scanning distortion compensator array (601) to individually scanning deflecting each beamlet of the plurality of primary charged particle beamlets to compensate a plurality of scanning induced distortions during scanning deflection of the plurality of primary charged particle beamlets (3).

Clause 38: The method of operating a multi-beam charged particle microscope (1) according clause 37, further comprising the steps of determining a plurality of scanning induced distortions by scanning a plurality of primary charged particles over an image patch of a reference object, extraction of a plurality of amplitudes of at least a linear part of each ofthe plurality of scanning induced distortions for each primary charged particle beamlet, deriving the plurality of control signals from each of the plurality of amplitudes, providing the plurality of control signal to a scanning array control unit of the scanning distortion compensator array (601).

Clause 39: A multi-beam microscope (1) for wafer inspection, comprising:

a multi-beamlet generator (300) for generating a plurality of primary beamlets (3), comprising at least a first individual beamlet, an object irradiation unit (100) for illuminating an image patch (17.1) on a surface (25) of a sample arranged in an object plane (101) by the plurality of primary beamlets (3), thereby generating during use a plurality of secondary electron beamlets (9) emitting from the surface (25), a detection unit (200) with a projection system (205) and an image sensor (207) for imaging the plurality of secondary electron beamlets (9) onto the image sensor (207), and for acquisition during use a digital image of the image patch (17.1) of the surface (25) of the sample, a collective multi-beam raster scanner (110) comprising at least a first set of deflection electrodes and an intersection volume (189), the plurality of primary beamlets (3) traversing the intersection volume (189), at least a first scanning corrector, configured to generate during use a first scanning electrostatic field for influencing at least the first individual beamlet, a control unit (800), configured to provide during use at least a first scanning voltage difference VSp(t) to the first set of deflection electrodes for a collective raster scanning of the plurality of primary beamlets (3) in a first or p-direction, wherein the control unit (800) is further configured to provide the first scanning voltage difference VSp(t) to the first scanning corrector, the first scanning corrector being configured to reduce a scanning induced aberration of at least the first individual beamlet.

Clause 40: The multi-beam charged particle microscope (1) according clause 39, wherein the first scanning corrector comprises a first static voltage conversion unit for conversion of the first scanning voltage difference VSp(t) into at least a first scanning correction voltage difference VCp(t), adapted to generate the first scanning electrostatic field synchronized with the first scanning voltage difference VSp(t).

Clause 41: The multi-beam charged particle microscope (1) according clause 40, wherein the static voltage conversion unit comprises at least a programmable resistor sequence, configured to be programmed by a plurality of static control signals.

Clause 42: The multi-beam charged particle microscope (1) according clauses 40 or 41, wherein the first static voltage conversion unit is configured to generate the first scanning correction voltage difference VCp(t) proportional to the first scanning voltage difference VSp(t).

Clause 43: The multi-beam charged particle microscope (1) according any of the clauses 39 to 42, wherein the control unit (800) is further comprising a first delay line configured to synchronize the first scanning corrector field with the collective raster scanning of the plurality of primary beamlets (3) by the collective multi-beam raster scanner (110).

Clause 44: The multi-beam charged particle microscope (1) according any of the clauses 39 to 43, wherein the first scanning corrector is comprising a plurality of deflection elements configured to compensate during use a scanning induced distortion for each primary beamlet of the plurality of primary beamlets (3).

Clause 45: The multi-beam charged particle microscope (1) according clauses 44, wherein the plurality of deflection elements is comprising a first deflection element configured to individually compensate during use a scanning induced distortion of the first individual beamlet in the first direction synchronized with the scanning deflection of the plurality of primary beamlets (3) by the collective multi-beam raster scanner (110) in the first direction.

Clause 46: The multi-beam charged particle microscope (1) according clause 45, wherein the plurality deflection elements is further comprising a second deflection element configured to individually compensate during use a scanning induced distortion of the first individual beamlet in a second direction synchronized with the scanning deflection of the plurality of primary beamlets (3) by the collective multi-beam raster scanner (110) in the first direction perpendicular to the second direction.

Clause 47: The multi-beam charged particle microscope (1) according clause 45 or 46, wherein the plurality deflection elements is further comprising a third deflection element configured to individually compensate during use a scanning induced distortion of a second individual beamlet in a first direction synchronized with the scanning deflection of the plurality of primary beamlets (3) by the collective multi-beam raster scanner (110) in the first direction perpendicular.

Clause 48: The multi-beam charged particle microscope (1) according any of the clauses 44 to 47, wherein the static voltage conversion unit comprises a plurality of programmable resistor sequences, each programmable resistor sequences connected to a deflection element of the plurality of deflection elements, the plurality of programmable resistor sequence forming a programmable resistor array controlled by a plurality of static control signals, configured to generate during use a plurality of scanning correction voltage differences VCAp(i,t), each synchronized with the first scanning voltage difference VSp(t).

Clause 49: The multi-beam charged particle microscope (1) according any of the clauses 39 to 43, wherein the first scanning corrector is comprising at least a correction electrode configured to contribute during use to an inhomogeneous electrostatic field distribution generated in the intersection volume (189) of the collective multi-beam deflection system (110), configured for reduction of a scanning induced aberration of an individual primary beamlet incident on the intersection volume (189) at an inclination angle β deviating from an optical axis of the multi-beam charged particle microscope (1).

Clause 50: A method of operating a multi-beam charged particle microscope (1), comprising the steps of:
    generating a scanning voltage difference VSp(t);
    providing the scanning voltage difference VSp(t) to a collective multi-beam raster scanner (110) for collectively deflection scanning of a plurality of primary beamlets (3) with the collective multi-beam raster scanner (110) in a first direction;
    generating from the scanning voltage difference VSp(t) at least a first scanning correction voltage difference VCp(t), synchronized with the scanning voltage difference VSp(t);
    providing the first scanning correction voltage difference VCp(t) to a deflection element of a scanning corrector for reduction of a scanning induced aberration of at least one individual beamlet of the plurality of primary beamlets (3).

Clause 51: The method of operating a multi-beam charged particle microscope (1) according clause 50, further comprising the step of providing a plurality of static control signals to the scanning corrector for generating the first scanning correction voltage difference VCp(t).

Clause 52: The method of operating a multi-beam charged particle microscope (1) according any of the clauses 50 or 51, further comprising the step of generating a predetermined time delay between the first scanning correction voltage difference VCp(t) and the scanning voltage difference VSp(t) to synchronize of a collective raster scanning of the plurality of primary beamlets (3) and the reduction of the scanning induced aberration of the at least one individual beamlet.

Clause 53: A multi-beam charged particle microscope (1, 1001) for wafer inspection, comprising:
    a beamlet generator for generating at least a first primary charged particle beamlet (3.0, 3.1, 3.2),
    an object irradiation unit (100) for illuminating an image field of a surface (25) of a sample arranged in an object plane (101) by the first primary charged particle beamlet (3.0, 3.1, 3.2),
    a raster scanner (110) comprising at least a first set of deflection electrodes (153) and an intersection volume (189), the first primary charged particle beamlet (3.0, 3.1, 3.2) traversing the intersection volume (189),
    a control unit (800), configured to provide during use at least a first scanning voltage difference VSp(t) to the first set of deflection electrodes (153) for a scanning deflection of the first primary charged particle beamlet (3.0, 3.1, 3.2) in a first or p-direction over the image field, the image field having a lateral extension of at least 5 μm such as 8 μm or more,
    at least a first scanning corrector (601, 185, 193), configured to generate during use a first scanning correction field for influencing the first primary charged particle beamlet (3.0, 3.1, 3.2),
    wherein the control unit (800) is further configured to provide the first scanning voltage difference VSp(t) to the first scanning corrector (601, 185, 193), the first scanning corrector (601, 185, 193) being configured to reduce a scanning induced aberration of the first primary charged particle beamlet (3.0, 3.1, 3.2) synchronized with the scanning deflection of the first primary charged particle beamlet (3.0, 3.1, 3.2).

Clause 54: The multi-beam charged particle microscope (1) according clause 53, wherein the first scanning corrector (601, 185, 193) comprises a static voltage conversion unit for conversion of the first scanning voltage difference VSp(t) into at least a first scanning correction voltage difference VCp(t), adapted to generate the first scanning correction field synchronized with the first scanning voltage difference VSp(t).

Clause 55: The multi-beam charged particle microscope (1) according clause 54, wherein the static voltage conversion unit comprises at least a programmable resistor sequence, configured to be programmed by a plurality of static control signals.

Clause 56: The multi-beam charged particle microscope (1) according clauses 54 or 55, wherein the static voltage conversion unit is configured to generate the first scanning correction voltage difference VCp(t) proportional to the first scanning voltage difference VSp(t).

Clause 57: The multi-beam charged particle microscope (1) according any of the clauses 53 to 56, wherein the control unit (800) is further comprising a first delay line configured to synchronize the first scanning correction field with the raster scanning of the first primary charged particle beamlet (3.0, 3.1, 3.2) by the raster scanner (110).

Clause 58: The multi-beam charged particle microscope (1) according any of the clauses 53 to 57, wherein the first scanning corrector (601, 185, 193) comprises at least a first deflection element configured to compensate during use a scanning induced aberration of the first primary charged particle beamlet (3.0, 3.1, 3.2) of about 0.5 nm to 5 nm to a reduced amount of below 0.3 nm, such as below 0.2 nm or below 0.1 nm.

Clause 59: The multi-beam charged particle microscope (1) according clauses 58, wherein the scanning induced aberration is a scanning induced distortion.

Clause 60: The multi-beam charged particle microscope (1) according clauses 58 or 59, wherein the first deflection element is configured to individually compensate during use a scanning induced distortion of the first primary charged particle beamlet (3.0, 3.1, 3.2) in the first direction synchronized with the scanning deflection of first primary charged particle beamlet (3.0, 3.1, 3.2) by the raster scanner (110) in the first direction.

Clause 61: The multi-beam charged particle microscope (1) according clause 60, further comprising a second deflection element configured to individually compensate during use a scanning induced distortion of the first primary charged particle beamlet (3.0, 3.1, 3.2) in a second direction synchronized with the scanning deflection of first primary charged particle beamlet (3.0, 3.1, 3.2) by the raster scanner (110) in the first direction perpendicular to the second direction.

Clause 62: The multi-beam charged particle microscope (1) according clauses 58, wherein the scanning induced aberration is at least one of the group of a scanning induced astigmatism, a scanning induced telecentricity aberration, a scanning induced spherical aberration or a scanning induced coma.

Clause 63: The multi-beam charged particle microscope (1) according any of the clauses 53 to 62, further comprising a beamlet generator for generating at least a second primary charged particle beamlet (3.1 or 3.2).

Clause 64: The multi-beam charged particle microscope (1) according clause 63, wherein the first scanning corrector is further comprising a third deflection element configured to individually compensate during use a scanning induced aberration of the second primary charged particle beamlet (3.1 or 3.2).

Clause 65: The multi-beam charged particle microscope (1) according clause 64, wherein the static voltage conversion unit comprises at least a first programmable resistor sequences, the first programmable resistor sequences connected to the first deflection element and controlled by a plurality of static control signals, configured to generate during use a scanning correction voltage differences VCAp(t) synchronized with the first scanning voltage difference VSp(t).

Clause 66: The multi-beam charged particle microscope (1) according any of the clauses 53 to 65, further comprising a second scanning corrector (602, 187, 195), configured for reduction of a second scanning induced aberration during a raster scan of the at least first primary charged particle beamlet (3.0, 3.1, 3.2) by the raster scanner (110).

Clause 67: A multi-beam charged particle microscope (1) for wafer inspection, comprising:

a multi-beamlet generator (300) for generating a plurality of primary beamlets (3), comprising at least a first primary beamlet and a second primary beamlet, an object irradiation unit (100) for illuminating an image patch (17) of a surface (25) of a wafer arranged in an object plane (101), thereby generating during use a plurality of secondary electron beamlets (9) emitting from the surface (25), a collective multi-beam raster scanner (110) forming an intersection volume (189), configured for performing a collective raster scanning of the plurality of primary beamlets (3) to form an image scan of the image patch (17), comprising at least the first primary beamlet (3.55) being scanned over a first image subfield (31.55) and the second primary beamlet (3.15) being synchronously scanned over a second image subfield (31.15) of the image patch (17), a detection unit (200) with a projection system (205) and an image sensor (207) for imaging the plurality of secondary electron beamlets (9) onto the image sensor (207), and for acquisition of a digital image during the image scan, a first scanning corrector (601), connected to a control unit (800) and configured to reduce during the image scan a scanning induced distortion difference between the first primary beamlet (3.55) in the first image subfield (31.55) and the second primary beamlet (3.15) in the second image subfield (31.15).

Clause 68: The multi-beam charged particle microscope (1) according clause 67, wherein the first scanning corrector (601) is configured to generate during use a plurality of scanning electrostatic fields for influencing the plurality of primary beamlets, including a first scanning electrostatic field for influencing the first primary beamlet (3.55) and a second scanning electrostatic field for independently influencing the second primary beamlet (3.55).

Clause 69: The multi-beam charged particle microscope (1) according clause 68, wherein the first scanning corrector (601) is comprising a plurality of deflection elements, including a first deflection element and a second deflection element, configured to compensate during use a plurality of scanning induced distortions for each of the plurality of primary beamlets (3), including a first scanning induced distortion of the first primary beamlet (3.55) and a second scanning induced distortion of the second primary beamlet (3.15).

Clause 70: The multi-beam charged particle microscope (1) according any of the clauses 68 to 69, wherein the control unit (800) is configured to provide during use a first scanning voltage difference VSp(t) to the collective multi-beam raster scanner (110), and wherein the first scanning corrector (601) comprises a scanning array control unit (622) for conversion of the first scanning voltage difference VSp(t) into a plurality of scanning correction voltage differences VCAp(i,t), adapted to generate during use the plurality of electrostatic fields synchronized with the first scanning voltage difference VSp(t).

Clause 71: The multi-beam charged particle microscope (1) according clause 70, wherein the scanning array control unit (622) comprises a plurality of static voltage conversion units (611, 612), configured to generate during use the plurality of scanning correction voltage differences VCAp(i,t) from the first scanning voltage difference VSp(t).

Clause 72: The multi-beam charged particle microscope (1) according clause 71, wherein each of the plurality of static voltage conversion units (611,612) is configured as a programmable resistor sequence, configured to be controlled by a plurality of static control signals.

Clause 73: The multi-beam charged particle microscope (1) according any of the clauses 68 to 72 wherein the control unit (800) is further comprising a first delay line configured to synchronize the plurality of scanning electrostatic fields of the first scanning corrector (601) with the collective raster scanning of the plurality of primary beamlets (3) by the collective multi-beam raster scanner (110).

Clause 74: The multi-beam charged particle microscope (1) according clauses 69 to 73, wherein the first deflection element is configured to individually compensate during use a scanning induced distortion of the first primary beamlet (3.55) in a first direction synchronized with the scanning deflection of the plurality of primary beamlets (3) by the collective multi-beam raster scanner (110) in the first direction.

Clause 75: The multi-beam charged particle microscope (1) according clause 74, wherein the first deflection element is further configured to individually compensate during use a scanning induced distortion of the first primary beamlet (3.55) in a second direction synchronized with the scanning deflection of the plurality of primary beamlets (3) by the collective multi-beam raster scanner (110) in the first direction perpendicular to the second direction.

Clause 76: The multi-beam charged particle microscope (1) according clauses 74 or 75, wherein the second deflection element is configured to individually compensate during use a scanning induced distortion of the second primary beamlet in a first direction synchronized with the scanning deflection of the plurality of primary beamlets (3) by the collective multi-beam raster scanner (110) in the first direction.

Clause 77: The multi-beam charged particle microscope (1) according clauses 67 to 76, wherein during use the first primary beamlet is traversing the intersection volume (189) at a first angle (31 and the second primary beamlet is traversing the intersection volume (189) at a second angle β2 different from the first angle (31.

Clause 78: The multi-beam charged particle microscope (1) according clauses 67 to 77, further comprising a second scanning corrector (602), connected to a control unit (800) and configured to reduce during the image scan a scanning induced telecentricity difference between the first primary beamlet (3.55) in the first image subfield (31.55) and the second primary beamlet (3.15) in the second image subfield (31.15).

Clause 79: A method of operating a multi-beam charged particle microscope (1), comprising the steps of:
generating a scanning voltage difference VSp(t);
providing the scanning voltage difference VSp(t) to a collective multi-beam raster scanner (110) for collectively deflection scanning of a plurality of primary beamlets (3) with the collective multi-beam raster scanner (110) in a first direction;
generating, by a plurality of static voltage conversion units, from the scanning voltage difference VSp(t) a plurality of scanning correction voltage differences VCAp(i,t), synchronized with the scanning voltage difference VSp(t);
providing plurality of scanning correction voltage differences VCAp(i,t) to a plurality of deflection elements of a scanning corrector for reduction of the scanning induced distortions of the plurality of primary beamlets (3).

Clause 80: The method of operating a multi-beam charged particle microscope (1) according clause 79, further comprising the step of providing a plurality of static control signals to the plurality of static voltage conversion units for generating the plurality of scanning correction voltage differences VCAp(i,t).

Clause 81: The method of operating a multi-beam charged particle microscope (1) according any of the clauses 79 or 80, further comprising the step of generating a predetermined time delay between the plurality of scanning correction voltage differences VCAp(i,t) and the scanning voltage difference VSp(t) to synchronize of a collective raster scanning of the plurality of primary beamlets (3) and the reduction of the scanning induced distortions.

Clause 82: The method of operating a multi-beam charged particle microscope (1) according clause 79, further comprising the steps of
determining the scanning induced distortions by scanning a plurality of primary charged particles over an image patch of a reference object,
extraction of a plurality of amplitudes of at least a linear part of a scanning induced distortions for each primary charged particle beamlet,
deriving the plurality of static control signals from each of the plurality of amplitudes.

Clause 83: A multi-beam charged particle beam microscope (1) for wafer inspection, comprising:
a first, long stroke raster scanner (110) for performing a raster scanning of a plurality of primary charged particle beamlets (3), comprising at least a first primary beamlet (3.0, 3.1, 3.2), and configured to scanning deflect each of the plurality of primary charged particle beamlets (3) collectively over a scanning range corresponding to an extension D=5 µm to 12 µm of an image subfield (31) on a wafer surface (25),
a second, short stroke raster scanner (601) configured to individually correct a scanning induced aberration of each primary charged particle beamlet including the first primary beamlet (3.0,3.1,3.2), the scanning induced aberration being introduced during the collective scanning deflection by first, long stroke raster scanner (110),
a control unit (800) configured to synchronize the second, short stroke raster scanner (601) for correction of the individual scanning induced aberrations with the scanning deflection of the first, long stroke raster scanner (110).

Clause 84: The multi-beam charged particle microscope (1) according clause 83, wherein the scanning induced aberration is a scanning distortion, and wherein the second, short stroke raster scanner (601) is configured to scanning deflect each primary beamlet over a scanning range corresponding to a maximum scanning distortion rm with |rm|<D/1000.

Clause 85: The charged particle microscope (1) according clause 83 or 84, wherein the charged particle beam microscope (1) comprises a third short stroke raster scanner (602) for performing a scanning correction of a scanning induced telecentricity aberration, configured to correct a scanning induced telecentricity aberration introduced during the scanning deflection of the plurality of primary beamlets (3) with the first, long stroke raster scanner (110), and wherein the control unit (800) configured to synchronize the third, short stroke raster scanner (602) with scanning deflection of the plurality of primary beamlets with the first, long stroke raster scanner (110) and the scanning correction of the scanning induced aberration with the second, short stroke raster scanner (601).

Clause 86: The multi-beam charged particle microscope (1) according any of the clauses 83 to 85, further comprising at least a scanning array control unit (622) for conversion of a scanning voltage difference VSp(t) into a plurality of scanning correction voltage differences VCAp(i,t) for performing the scanning correction of a scanning induced aberration.

Clause 87: The multi-beam charged particle microscope (1) according clause 86, wherein the scanning array control unit (622) comprises a plurality of static voltage conversion units (611, 612), configured to generate during use the plurality of scanning correction voltage differences VCAp(i,t) from the first scanning voltage difference VSp(t).

Clause 88: The multi-beam charged particle microscope (1) according clause 87, wherein each of the plurality of static voltage conversion units (611,612) is configured as a programmable resistor sequence, configured to be controlled by a plurality of static control signals.

Clause 89: The multi-beam charged particle beam microscope (1) according any of the clauses 83-88, further comprising a beamlet generator (300) for generating the plurality of primary beamlets (3) and an object irradiation unit (100) for illuminating a plurality of image patches (17) of a surface (25) of an object (7) arranged in an object plane (101), thereby generating during use a plurality of secondary electron beamlets (9) emitting from the surface (25).

Clause 90: The charged particle beam microscope (1) according clause 89, wherein the beamlet generator (300) is configured for generating at least a second primary beamlet and the first, long stroke raster scanner (110) is configured to collectively scanning deflect each of the at least first and second primary beamlets over a scanning range corresponding to an extension D of an image subfield on a wafer surface, and wherein the second, short stroke raster scanner (601) is configured to individually correct the scanning induced aberrations of the first and the second primary beamlets.

Clause 91: The charged particle beam microscope (1) according any of the clause 83 to 90, further comprising a detection unit (200) with a projection system (205) and an image sensor (207) for imaging the plurality of secondary electron beamlets (9) onto the image sensor (207), and for acquisition of a digital image during the image scan.

As will be clear from the description, combinations and various modifications to the examples and embodiments are possible and can be applied in analogy to the embodiments or examples. Charged particles of the primary beam can for example be electrons, but also other charged particles such as He-Ions. Secondary electrons comprise secondary electrons in its narrow sense, but also any other secondary charged particle created by interaction of the primary charged particle beamlets with the sample, such as backscattered electrons or secondary electrons of second order, which are generated by backscattered electrons. In another example, secondary ions can be collected instead of secondary electrons.

A list of reference numbers is provided:

1 multi-beamlet charged-particle microscopy system
3 primary charged particle beamlets, forming the plurality of primary charged particle beamlets
5 primary charged particle beam spot
7 object
9 secondary electron beamlet, forming the plurality of secondary electron beamlets
11 secondary electron beam path
13 primary beam path
15 secondary charged particle image spot
17 image patch
19 overlap area of image patches
21 image patch center position
25 Wafer surface
27 scanpath of primary beamlet
29 center of image subfield
31 image subfield
33 first inspection site
35 second inspection site
39 overlap areas of subfields 31
100 object irradiation unit
101 object or image plane
102 objective lens
103 field lens group
105 optical axis of multi-beamlet charged-particle microscopy system
108 first beam cross over
110 first multi-beam raster scanner
112 correction elements of multi-beam raster scanner
120 scanning correction control module
141 example of a primary beam spot position
143 static displacement vector of the primary beam spot
150 center beamlet
151 real beamlet trajectory
153 Deflector electrodes
155 equipotential lines of the electrostatic potential
157 off axis or field beamlet
159 virtual common pivot point
161 virtual pivot points
163 first order beampaths
171 system upfront scanner 110
173 linear curve

175 voltage difference as a function of deflection angle
177 voltage difference as a function of deflection angle applied to deflection electrodes consisting of pairs of electrodes
179 offset voltage as a function of deflection angle applied to deflection electrodes consisting of pairs of electrodes
181 deflection electrodes for deflection in first direction
183 deflection electrodes for deflection in second direction
185 first set of correction electrodes
187 second set of correction electrodes
189 intersection volume of traversing beams
190 inner area of intersection volume
191 directions of asymmetry
193 first set of correction electrodes
195 second set of correction electrodes
197 lines illustrating linear dependency
200 detection unit
205 projection system
206 electrostatic lens
207 image sensor
208 imaging lens
209 imaging lens
210 imaging lens
212 second cross over
214 aperture filter
216 active element
218 third deflection system
220 multi-aperture corrector
222 second deflection system
300 charged-particle multi-beamlet generator
301 charged particle source
303 collimating lenses
305 primary multi-beamlet-forming unit
306 active multi-aperture plates
307 first field lens
308 second field lens
309 electron beam
311 primary electron beamlet spots
321 intermediate image surface
390 beam steering multi aperture plate
400 beam splitter unit
420 magnetic element
500 sample stage
503 Sample voltage supply
601 first scanning corrector or scanning distortion compensator array
602 second scanning corrector or scanning compensator array of telecentricity aberration
607 electrically conductive lines
609 first power line
610 second power line
611 first voltage conversion unit
612 second voltage conversion unit
613 first plurality of electrically conductive lines
614 second plurality of electrically conductive lines
615 first plurality of control signals
616 second plurality of control signals
618 connection signal line
620 multi aperture plate
622 scanning array control unit
624 clock line
626 operation control memory
631 data or voltage connection line
633 sequence of resistors
635 first set of control signals
637 second set of control signals 639 sequence of transistors
641 voltage combiners
681 electrodes
685 aperture or plurality of apertures
687 electrodes for deflection in a first direction
688 electrodes for deflection in a second direction
701 first static multi-beam deflection system
703 second static multi-beam deflection system
800 control unit
810 image data acquisition unit
812 image stitching unit
814 image data output
820 projection system control module
830 primary beampath control module
840 control operation processor
860 scanning deflection control module
862 array of delay lines
870 static adjustment control unit

What is claimed is:

1. A multi-beam charged particle microscope, comprising:
a charged-particle multi-beamlet generator configured to generate a plurality of primary charged particle beamlets;
an object irradiation unit configured to illuminate an image patch on a surface of an object in an object plane by the plurality of primary charged particle beamlets to generate a plurality of secondary electron beamlets (9) emitting from the surface;
a detection unit comprising a projection system and an image sensor, the projection system configured to image the plurality of secondary electron beamlets onto the image sensor to acquire a digital image of the image patch;
a collective multi-beam raster scanner;
a scanning distortion compensator array disposed in a propagation direction of the plurality of primary charged particles upstream of the collective multi-beam raster scanner, the scanning distortion compensator array comprising a plurality of apertures, each aperture configured to transmit a corresponding primary charged particle beamlet of the plurality of primary charged particle beamlets, the plurality of apertures comprising a plurality of first deflection elements configured to individually deflect each corresponding primary charged particle beamlet in a first direction and a plurality of second deflection elements configured to individually deflect each corresponding primary charged particle beamlet in a second direction perpendicular to the first direction, each deflection element disposed in a circumference of each aperture;
control unit configured to provide a first scanning voltage difference to the collective multi-beam raster scanner to scanningly deflect the plurality of primary charged particle beamlets in the first direction,
wherein the scanning distortion compensator array further comprises a scanning array control unit comprising a first static voltage conversion array configured to provide a plurality of first correction voltage differences to the plurality of first deflection elements and a second static voltage conversion array configured to provide a plurality of second correction voltage differences to the plurality of second deflection elements to compensate a scanning induced aberration during the scanning deflection of the plurality of primary charged particle beamlets in the first direction.

2. The multi-beam charged particle microscope of claim 1, wherein the first static voltage conversion array is coupled to the control unit and configured to provide to each first and second deflection element a plurality of first voltage difference components synchronized with the first scanning voltage difference.

3. The multi-beam charged particle microscope of claim 1, wherein the control unit is configured to provide a second scanning voltage difference to the collective multi-beam raster scanner to scanningly deflect the plurality of primary charged particle beamlets in the second direction.

4. The multi-beam charged particle microscope of claim 3, wherein the first and second static voltage conversion arrays are coupled to the control unit and configured to provide to each first and second deflection element a plurality of second voltage difference components synchronized with the second scanning voltage difference.

5. The multi-beam charged particle microscope of claim 3, wherein the first static voltage conversion array is coupled to the control unit and configured to provide to each first deflection element a first voltage difference component synchronized with the first scanning voltage difference and a second voltage difference component synchronized with the second scanning voltage difference.

6. The multi-beam charged particle microscope of claim 1, wherein the first or second static voltage conversion array comprises a programmable resistor array.

7. The multi-beam charged particle microscope of claim 1, wherein the collective multi-beam raster scanner comprises a first set of deflection electrodes and an intersection volume, the plurality of primary charged particle beamlets traverse the intersection volume during use of the multi-beam charged particle microscope, and the collective multi-beam raster scanner is configured to generate a first inhomogeneous scanning deflection field distribution in the intersection volume to reduce a scanning induced aberration of a primary charged particle beamlet incident on the intersection volume at an inclination angle deviating from an optical axis of the multi-beam charged particle microscope.

8. The multi-beam charged particle microscope of claim 7, wherein a deflection electrode of the first set of deflection electrodes comprises two spatially separated electrodes, the control unit is configured to provide the first scanning voltage difference and a second scanning voltage difference to the two spatially separated electrodes, and the first and second scanning voltage differences are different.

9. The multi-beam charged particle microscope of claim 7, wherein the collective multi-beam raster scanner comprises a second set of deflection electrodes configured to generate a second inhomogeneous scanning deflection field distribution, and the plurality of primary charged particle beamlets travers the second predetermined inhomogeneous scanning deflection field distribution in the intersection volume during use of the multi-beam charged particle microscope to scanningly deflect the plurality of primary charged particle beamlets in the second direction.

10. The multi-beam charged particle microscope of claim 9, wherein a shape and a geometry of first set or second set of deflection electrodes of the collective multi-beam raster scanner are adapted to a cross section of the intersection volume of the plurality of primary charged particle beamlets.

11. The multi-beam charged particle microscope of claim 9, wherein, in a mean direction of propagation of the plurality of primary charged particles, the first set of deflection electrodes and the second set of deflection electrodes have a different length.

12. The multi-beam charged particle microscope of claim 11, wherein the collective multi-beam raster scanner further comprises a first set of correction electrodes configured to generate a scanning correction field contributing to the first inhomogeneous electrostatic field distribution.

13. The multi-beam charged particle microscope of claim 12, wherein an electrode of the first set of correction electrodes is in a space between an electrode of the first set of deflection electrodes and an electrode of the second set of deflection electrodes.

14. The multi-beam charged particle microscope of claim 11, wherein the collective multi-beam raster scanner further comprises a second set of correction electrodes configured to generate a second scanning correction field contributing to the first inhomogeneous electrostatic field distribution.

15. The multi-beam charged particle microscope of claim 7, wherein the collective multi-beam raster scanner is configured to adjust a lateral position of the first inhomogeneous scanning deflection field distribution with respect to the intersection volume, and the control unit is configured to provide a voltage offset to the first set of deflection electrodes and/or the second set of deflection electrodes.

16. The multi-beam charged particle microscope of claim 7, further comprising a first static deflection system between the charged-particle multi-beamlet generator and the collective multi-beam raster scanner, wherein the first static deflection system is configured to adjust a lateral position of the plurality of primary charged particle beamlets with respect to the intersection volume.

17. The multi-beam charged particle microscope of claim 16, further comprising a second static deflection system between the charged-particle multi-beamlet generator and the collective multi-beam raster scanner, wherein the second static deflection system is configured to adjust a mean angle of incidence of the plurality of primary charged particle beamlets at the entrance side of the intersection volume.

18. The multi-beam charged particle microscope of claim 1, further comprising a scanning compensator array configured to compensate a scanning induced telecentricity aberration, wherein the scanning compensator array is in proximity to an intermediate image plane of the multi-beam charged particle microscope, the scanning compensator array comprises a plurality of deflection elements disposed at a plurality of apertures and a second scanning array control unit comprising a second static voltage conversion array configured to provide a plurality of second correction voltage differences to each deflection element to compensate a scanning induced telecentricity aberration during an image scan for each of the primary charged particle beamlets.

19. The multi-beam charged particle microscope of claim 1, further comprising a further scanning compensator array configured to compensate a scanning induced aberration.

20. The multi-beam charged particle microscope of claim 19, wherein the scanning induced aberration comprises a scanning induced astigmatism or a focus plane deviation of each beamlet of the plurality primary charged particle beamlets.

* * * * *